(12) United States Patent
Shen et al.

(10) Patent No.: US 10,637,495 B2
(45) Date of Patent: *Apr. 28, 2020

(54) SAR ADCS WITH DEDICATED REFERENCE CAPACITOR FOR EACH BIT CAPACITOR

(71) Applicant: Analog Devices, Inc., Norwood, MA (US)

(72) Inventors: Junhua Shen, Wilmington, MA (US); Mark D. Maddox, Derry, NH (US); Ronald Alan Kapusta, Carlisle, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/228,392

(22) Filed: Dec. 20, 2018

(65) Prior Publication Data

US 2019/0123760 A1    Apr. 25, 2019

Related U.S. Application Data

(63) Continuation of application No. 14/949,423, filed on Nov. 23, 2015, now Pat. No. 10,205,462, which is a
(Continued)

(51) Int. Cl.
*H03M 1/12* (2006.01)
*H03M 1/46* (2006.01)
(Continued)

(52) U.S. Cl.
CPC ............ *H03M 1/468* (2013.01); *H03M 1/08* (2013.01); *H03M 1/002* (2013.01); *H03M 1/462* (2013.01)

(58) Field of Classification Search
CPC ...... H03M 1/804; H03M 1/0863; H03M 1/38; H03M 1/46; H03M 1/806; H03M 1/0845; H03M 1/1245
(Continued)

(56) References Cited

U.S. PATENT DOCUMENTS 8,547,270 B1 *  10/2013  Strode ................. H03M 1/1061
                                                                341/155
8,928,518 B1 *   1/2015  Stepanovic ........... H03M 1/466
                                                                341/163
(Continued)

*Primary Examiner* — Linh V Nguyen
(74) *Attorney, Agent, or Firm* — Patent Capital Group

(57) ABSTRACT

A successive-approximation-register analog-to-digital converter (SAR ADC) typically includes circuitry for implementing bit trials that converts an analog input to a digital output bit by bit. The circuitry for bit trials are usually weighted (e.g., binary weighted), and these bit weights are not always ideal. Calibration algorithms can calibrate or correct for non-ideal bit weights and usually prefer these bit weights to be signal-independent so that the bit weights can be measured and calibrated/corrected easily. Embodiments disclosed herein relate to a unique circuit design of an SAR ADC, where each bit capacitor or pair of bit capacitors (in a differential design) has a corresponding dedicated on-chip reference capacitor. The speed of the resulting ADC is fast due to the on-chip reference capacitors (offering fast reference settling times), while errors associated with non-ideal bit weights of the SAR ADC are signal-independent (can be easily measured and corrected/calibrated).

20 Claims, 32 Drawing Sheets

Related U.S. Application Data continuation of application No. 14/747,071, filed on Jun. 23, 2015, now Pat. No. 9,641,189.

(60) Provisional application No. 62/093,407, filed on Dec. 17, 2014.

(51) Int. Cl.
*H03M 1/08* (2006.01)
*H03M 1/00* (2006.01)

(58) Field of Classification Search
USPC ........ 341/118, 120, 122, 155, 172, 144, 150
See application file for complete search history.

(56) References Cited

U.S. PATENT DOCUMENTS

| | | | |
|---|---|---|---|
| 8,963,763 B2* | 2/2015 | Kull | H03M 1/0682 341/118 |
| 8,981,973 B2* | 3/2015 | Kumar | H03M 1/0617 341/118 |
| 2010/0283643 A1* | 11/2010 | Byrne | H03M 1/1225 341/122 |
| 2012/0133534 A1* | 5/2012 | Oshima | H03M 1/1052 341/110 |
| 2012/0154194 A1* | 6/2012 | Chang | H03M 1/002 341/158 |
| 2014/0203958 A1* | 7/2014 | Okuda | H03M 1/124 341/172 |
| 2016/0065232 A1* | 3/2016 | Dagher | H03M 3/30 341/158 |

\* cited by examiner

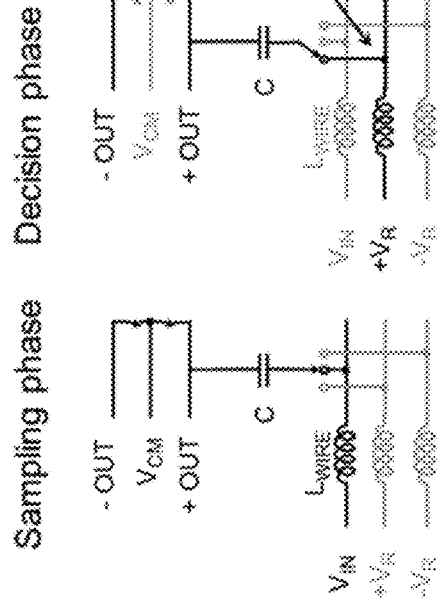
FIGURE 2A
FIGURE 2B
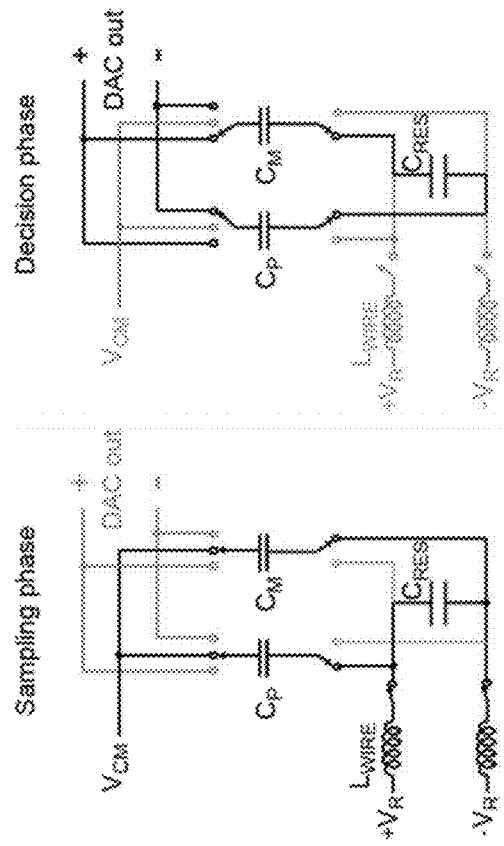
FIGURE 3A
FIGURE 3B
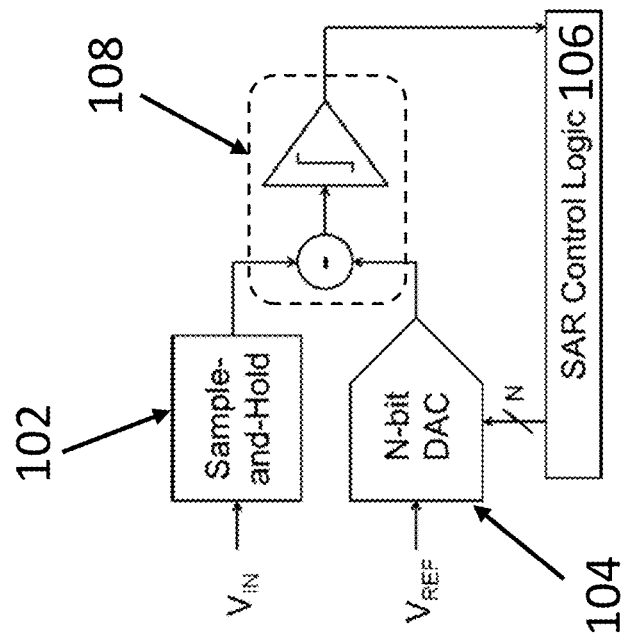
FIGURE 1

FIGURE 13

2. Bit 15 during conversion phase

1. Bit 15 during sampling phase

SAR ADCS WITH DEDICATED REFERENCE CAPACITOR FOR EACH BIT CAPACITOR

PRIORITY DATA

This application is a Continuation Application of U.S. Non-Provisional application Ser. No. 14/949,423 filed on Nov. 23, 2015, which claims priority to and receives benefit of U.S. Non-provisional patent application Ser. No. 14/747,071 filed Jun. 23, 2015, and U.S. Provisional Patent Application Ser. No. 62/093,407 filed Dec. 17, 2014. All of the aforementioned patent applications are hereby incorporated by reference in their entirety.

TECHNICAL FIELD OF THE DISCLOSURE

The present invention relates to the field of integrated circuits, in particular to a new circuit design for successive-approximation-register analog-to-digital converters (SAR ADCs). Specifically, each bit capacitor or pair of bit capacitors (if differential) of the SAR ADC corresponding to a bit trial or bit weight have a corresponding dedicated reference capacitor.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

Generally speaking ADCs are electronic devices that convert a continuous physical quantity carried by an analog signal to a digital number that represents the quantity's amplitude (or to a digital signal carrying that digital number). An ADC is typically composed of many devices making up an integrated circuit or a chip. An ADC can be defined by any one or more of the following application requirements: its bandwidth (the range of frequencies of analog signals it can properly convert to a digital signal), its resolution (the number of discrete levels the maximum analog signal can be divided into and represented in the digital signal), its linearity (e.g., how well the output data is proportionate to the input signal), and its signal to noise ratio (how accurately the ADC can measure signal relative to the noise the ADC introduces). Analog-to-digital converters (ADCs) have many different designs, which can be chosen based on the application requirements.

Overview

A successive-approximation-register analog-to-digital converter (SAR ADC) typically includes circuitry for implementing bit trials that converts an analog input to a digital output bit by bit. The circuitry for bit trials are usually weighted (e.g., binary weighted), and these bit weights are not always ideal. Calibration algorithms can calibrate or correct for non-ideal bit weights and usually prefer these bit weights to be signal-independent so that the bit weights can be measured and calibrated/corrected easily.

Usually, the SAR ADC measures an input against a reference during each bit trial, which can be embodied in the form of a reference charge being pulled from the reference. For SAR ADC performing a series of bit trials or decisions, the reference charge can be pulled from the reference during each bit decision, often at a particular rate of the ADC. To accommodate faster rates of ADCs, the charge is usually provided by adding an external low equivalent series resistance (ESR) capacitor between the reference and the ADC. The low ESR capacitor acts as an external charge "reservoir" which can support the instantaneous requirements of the ADC. The reference then serves the function of recharging this external reservoir capacitor. The charge being used during bit decisions are typically provided from the external reservoir capacitor to the ADC over bond wires, which can impede the speed of each bit decision, and thus the overall speed of the SAR ADC.

Embodiments disclosed herein relate to a unique circuit design of an SAR ADC, where each bit capacitor or pair of bit capacitors (in a differential design) corresponding to a particular bit trial or a particular bit weight has a corresponding dedicated on-chip reference capacitor. The speed of the resulting ADC is fast due to the on-chip reference capacitors (offering fast reference settling times), while errors associated with non-ideal bit weights of the SAR ADC are signal-independent (can be easily measured and corrected/calibrated). The present disclosure describes such important differences from other implementations and corresponding technical effects in detail.

Besides the circuit architecture, the present disclosure also describes a calibration scheme for calibrating such a SAR ADC. When reservoir capacitors are moved on-chip for individual bit decisions, a successive-approximation-register analog-to-digital converter (SAR ADC) has an addition source of error which can significantly affect the performance of the SAR ADC. Calibration techniques can be applied to measure and correct for such error in an SAR ADC using decide-and-set switching. Specifically, a calibration technique can expose the effective bit weight of each bit under test using a plurality of special input voltages and storing a calibration word for each bit under test to correct for the error. Such a calibration technique can lessen the need to store a calibration word for each possible output word to correct the additional source of error. Furthermore, another calibration technique can expose the effective bit weight of each bit under test without having to generate the plurality of special input voltages.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 1 is a system architecture for a SAR ADC, according to some embodiments of the disclosure;

FIGS. 2A-B illustrates switching behavior for an SAR ADC having an external, off-chip reservoir capacitor;

FIGS. 3A-3B illustrates switching behavior for an SAR ADC having on-chip reservoir capacitors, according to some embodiments of the disclosure;

FIGS. 10-23 illustrate a series of switching steps for measuring bit weight errors of a successive-approximation register analog-to-digital converter (SAR ADC), according to some embodiments of the disclosure;

DESCRIPTION OF EXAMPLE EMBODIMENTS OF THE DISCLOSURE

Understanding SAR ADCs

Figure 4B:
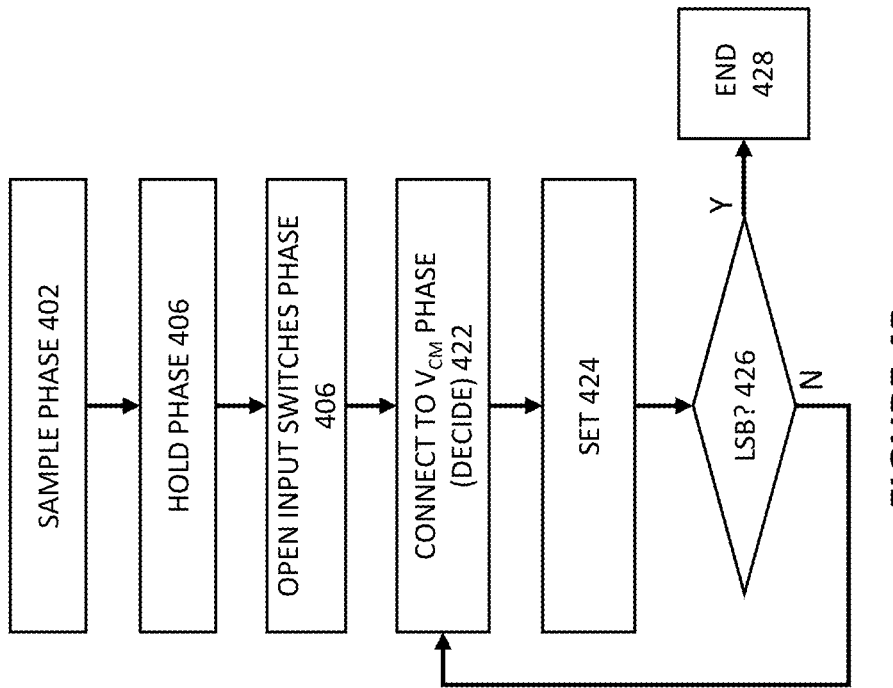
FIG. 4B shows a flow diagram illustrating an exemplary "decide-and-set" switching procedure for use in an SAR ADC, according to some embodiments of the disclosure.

Analog-to-digital converters (ADCs) can come in many different designs. One design is the successive-approximation-register analog-to-digital converter (SAR ADC). An SAR ADC (or sometimes referred simply as "SAR") tend to provide high resolution (e.g., generate a high number of bits) while having reasonable speed. For that reason, SAR ADCs are used in many applications.

Fundamentally, the SAR ADC implements a charge balancing process. The SAR ADC measures the input by acquiring a charge (representative of the input voltage) onto a set of bit capacitors (or "bit caps" for short). The SAR ADC then implements an algorithm to cancel out the charge using known elements having respective bit trial weights (i.e., known elements of charge) bit by bit to derive the digital output representative of the analog input. The bit trial weights are typically generated by drawing a reference charge from a reference.

From the pattern of bit trial weights that was applied, it is possible to infer what the original analog input or charge was, e.g., the sum of the trial weights can represent the original charge. SAR ADCs usually implement a binary search algorithm for inferring the original charge representative of the sampled input. At a circuit level, an SAR ADC has an array of bit capacitors (e.g., a binary weighted array), which conventionally acquires charge representative of the analog input (or samples the analog input). The SAR ADC also includes a comparator, which can determine residual difference between an estimated value generated by a capacitive DAC and the initially acquired value. Finally, a plurality switches can manipulate charge and switch charge around between different capacitors. A digital engine (or digital logic, or SAR logic, or SAR control logic) can implement the binary search algorithm by controlling the switches according to the output of the comparator at the end of each bit trial.

FIG. 1 is a system architecture for a SAR ADC, according to some embodiments of the disclosure. As shown, the functional N-bit SAR ADC block diagram includes a sample-and-hold part 102, an N-bit digital-to-analog converter (DAC) part 104, a comparator part 108, and an SAR control logic part 106. The sample-and-hold part 102 samples the input $V_{IN}$, and the output of the sample-and-hold part 102 is compared with the output of the N-bit DAC part 104. Based on the output of the comparator ("the comparator decision"), the SAR control logic part 106 updates the DAC code being fed back to the N-bit DAC part 104. The output of the N-bit DAC part 104 fully settles before the comparator can make its next decision. Effectively, a discrete-time negative feedback loop is formed which forces the output of the N-bit DAC part 104 to equal the sampled input $V_{IN}$. At a high level, N-bit decisions are performed for an N-bit SAR ADC to generate N bits, and each decision is ideally accurate to the full resolution of the converter. The inherent sequential nature of the SAR ADC algorithm makes it difficult to provide extremely fast conversion while providing high accuracy because the overall speed of conversion is critically limited by the speed of each bit trial.

One possible way to increase the speed of each bit decision is by reducing the settling time of each bit decision, so that the overall conversion process can perform all the bit decisions faster. In some designs, the reference voltage $V_{REF}$ of the N-bit DAC 104 is provided off-chip (external to the integrated circuit package that provides the SAR ADC functions). FIGS. 2A-B illustrates switching behavior for an SAR ADC having an external, off-chip reservoir capacitor. When a capacitor in the N-bit DAC 104 is switched to the reference voltage (in this example illustrated as $+V_R$ and $-V_R$) to generate a decision threshold (illustrated by decision phase of FIG. 2B), charge is drawn from the off-chip reference (e.g., an off-chip reservoir capacitor) over a bond wire having inductance $L_{WIRE}$ as seen in the figures. The charge transfer through the wire inductance can cause ringing, which can affect the minimum amount of time needed to guarantee the settling of the N-bit DAC 104 output.

To alleviate the above-mentioned issue, the off-chip reference can be effectively moved on-chip for internal charge redistribution. Within the context of the disclosure, "on-chip" means a device is provided on the same semiconductor substrate as the SAR ADC. FIGS. 3A-3B illustrates switching behavior for an SAR ADC having on-chip reservoir capacitors, according to some embodiments of the disclosure.

An on-chip reservoir capacitor is provided for each bit of the SAR ADC, in the manner illustrated by the circuit shown in the figures. The figures show that, for each bit of the SAR ADC (i.e., bit capacitor or pair of bit capacitors for a differential circuit implementation), an on-chip reservoir capacitor $C_{RES}$ can be provided to acquire all of the charge to be used for a complete conversion before the conversion begins. A differential implementation is shown, where during the sampling phase (illustrated by FIG. 3A), capacitors $C_P$ and $C_M$ are connected to the reference voltage, while a relatively large on-chip reservoir capacitor $C_{RES}$ is differentially charged to the references through series reference switches. Although charging of the capacitors occurs through wire inductance and ringing is expected, the sampling phase is sufficiently long enough to not be impeded by the ringing significantly. During the decision phase (illustrated by FIG. 3B), the series reference switches are opened, thus disconnecting the DAC from the off-chip reference. DAC capacitors $C_P$ and $C_M$ are cross connected to opposite polarities of $C_{RES}$, delivering reference charge to the DAC output. Since the reference charge is drawn directly from the on-chip reservoir capacitor $C_{RES}$, and not from an off-chip reference, the charge redistribution path is now on-chip, and ringing (if any) is significantly limited. By having on-chip reservoir capacitors, the settling time is improved. Exemplary SAR ADCs having an on-chip reservoir capacitor or on-chip reservoir capacitors are described in U.S. Pat. No. 8,390,502 (Inventor: Ronald Kapusta), which is hereby incorporated by reference in its entirety.

SAR ADC with Dedicated Reference Capacitors for Each Bit Capacitor with Signal-Independent Bit Weights Reference settling has been one of the key speed bottlenecks for successive-approximation-register (SAR) analog-to-digital converters (ADCs). On-chip reservoir capacitors enable the reference voltage to be sampled during the ADC's sampling or acquisition phase, instead of during the much shorter bit trial time in the conversion phase. While speed is improved, the design of an SAR ADC should also consider how easy it is to calibrate the SAR ADC to make it as accurate as possible. One important factor in how easy it is to calibrate the SAR ADC is whether bit weights for the circuitry are signal-independent. Signal independency is particularly advantageous because any measurement, calibration, and/or correction schemes can be made much simpler when the bit weights are signal-independent. Measurement schemes no longer have to run the SAR ADC over a wide range of input signals to measure the bit weights. Calibration and/or correction schemes can use coefficients which are not dependent on the input signal (or output code). The number of coefficients can be greatly reduced.

In some cases, SAR ADCs include a dedicated sample-and-hold part (e.g., sample-and-hold part 102 of FIG. 1) or an additional large input capacitor in addition to bit capacitors in the N-bit DAC part 104) to sample the input signal. This additional circuitry is provided in the SAR ADC so that the reservoir capacitor charge loss or reference voltage error due to charge sharing is signal-independent, i.e. to achieve bit weight signal independency. This comes at a cost of noise penalty, area and power. In some cases, SAR ADCs fail to address the bit weight signal dependency issue by having separate reservoir capacitors and one lumped sampling capacitor on each input side. Such SAR ADCs would have signal dependent bit weight error which limits its applications to low-medium resolution SAR ADCs.

To address some of these issues, a unique SAR ADC circuit design eliminates the need for the additional circuitry while still achieve bit weight signal independency. Instead of having an N-bit DAC part which does not sample the input signal, the unique SAR ADC circuit design can allow the bit capacitors of the capacitive DAC units to sample the input signal and still achieve bit weight signal independency. Furthermore, instead of providing relatively large reservoir capacitors for each bit capacitor (or pairs of bit capacitors for a differential design), smaller "reference" capacitors can be used as reservoir capacitors. As a result, area can be reduced significantly. Furthermore, any errors introduced by these smaller "reference" capacitors can be calibrated easily. For simplicity, "on-chip reservoir capacitor" is used to refer to both the smaller "on-chip reference capacitors" and the larger "on-chip reservoir capacitors". The present disclosure describes this unique SAR ADC circuit design in greater detail.

Figure 31:
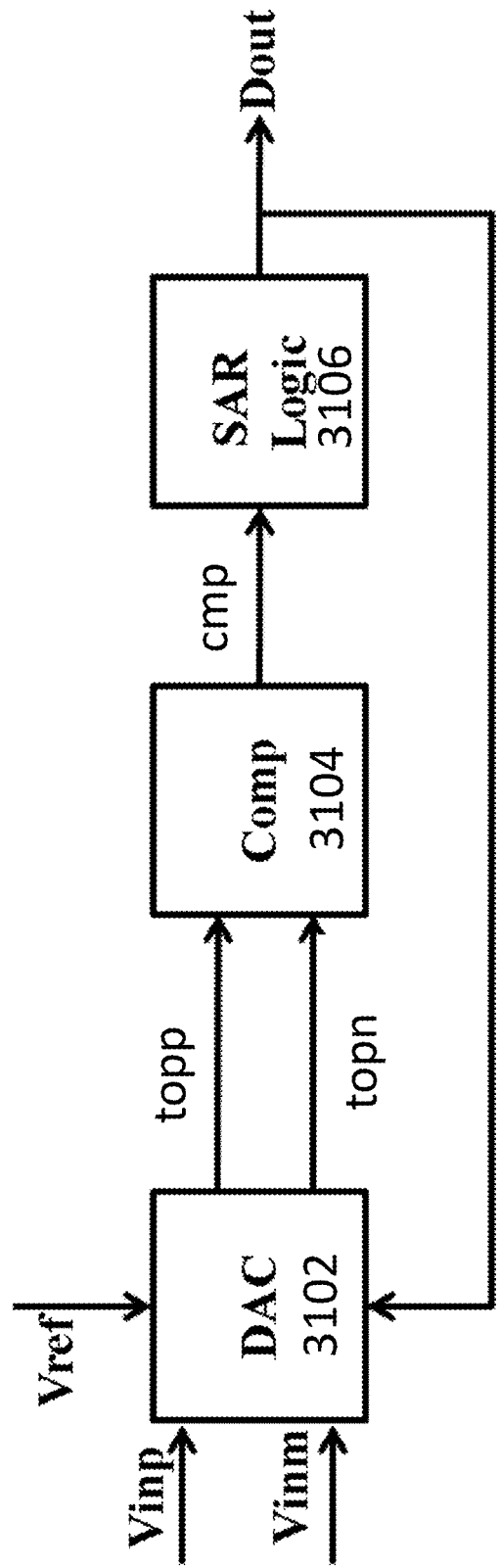
FIG. 31 shows a block diagram of a successive-approximation register analog-to-digital converter (SAR ADC), according to some embodiments of the disclosure.

FIG. 31 shows a block diagram of a successive-approximation register analog-to-digital converter (SAR ADC), according to some embodiments of the disclosure. This figure differs from FIG. 1 in that the system no longer has a sample-and-hold part 102. The SAR ADC includes a plurality of capacitive DAC units (collectively shown as DAC 3102), a comparator 3104, and SAR logic 3106. DAC 3102 receives a (differential) analog input, shown as Vinp and Vinm, and also receives a reference voltage, shown as Vref. Notably, at least one of the capacitive DAC units in DAC 3102 samples the analog input Vinp and Vinm (in addition to generating outputs for the bit trials). DAC 3102 generates two outputs topp and topn, which are provided as inputs to comparator 3104. The SAR logic 3106 generates outputs which controls switches in DAC 3102 as well as determines the final digital output Dout. The unique SAR ADC design can utilize a "decide-and-set" switching scheme (instead of the conventional SAR algorithm), which is outlined below.

In some embodiments, the successive-approximation-register analog-to-digital converter (SAR ADC) for converting an analog input to a digital output with signal-independent bit weights comprises a plurality of capacitive digital-to-analog converter (DAC) units corresponding to a plurality of bit trials (each capacitive DAC unit corresponds to a particular bit trial, or particular bit weight), a comparator coupled to the outputs of the capacitive DAC units for generating a decision output for each bit trial, and a successive-approximation-register (SAR) logic unit coupled to the output of the comparator for controlling switches in the capacitive DAC units based on the decision output and generating the digital output representative of the analog input. Referring back to FIG. 31, the plurality of capacitive DAC units is shown as DAC 3102. The comparator is shown as comparator 3104. The SAR logic unit is shown as SAR logic 3106. Even though the DAC 3102 (i.e., the plurality of capacitive DAC units) samples the analog input directly, it can been shown that the SAR ADC has signal-independent bit weights. This is true even if the on-chip reference capacitors have signal dependent charge losses during a conversion phase, as long as a dedicated reference capacitor is provided for each bit capacitor of a capacitive DAC unit or pair of bit capacitors of a differential capacitive DAC unit.

SAR ADC Using Conventional Switching Versus Decide-and-Set Switching

In a conventional SAR algorithm, the following illustrative steps can be taken, as described in relation to a differential ADC having two capacitor DACs (DACP and DACN). FIG. 4A shows a flow diagram illustrating such conventional switching procedure for use in an SAR ADC. In its most simplified form, the capacitor DACs have an array of bit caps. The steps for the bit trials are followed starting with the most significant bit (MSB) all the way down to the least significant bit (LSB).

1) SAMPLE PHASE (box 402): The SAR ADC tracks the analog input signal by connecting the bottom plates of some number of bit caps to that input while the top plate of those same bit caps are tied to some low impedance direct current (DC) voltage source. The DC signal provided by the low impedance DC voltage source is typically half of the reference voltage ($V_{REF}$) being used by the ADC. This DC voltage is sometimes referred to as $V_{CM}$ (common mode voltage), and $V_{CM}$ gets connected to the top plate of these bit caps through the sample switch. The analog input is connected to the bottom plates through the input switches.

2) HOLD PHASE (box 404): When ready to perform an analog-to-digital conversion, the sample switches are opened to trap charge on the bit caps that is representative of the analog input at that point in time.

3) OPEN INPUT SWITCHES PHASE (box 406): The input switches are then opened to disconnect the bottom plates of the bit caps from the input.

4) CONNECT TO $V_{REF}$ PHASE (box 408): The bottom plate of the MSB bit cap in DACP is connected to $V_{REF}$, and bottom plate of the MSB cap in DACN is connected to ground. At the same time, the bottom plates of the bit caps in DACP of the lower bits are connected to ground, and bottom plates of the bit caps in DACN of the lower bits are connected to $V_{REF}$.

5) DECISION PHASE (diamond 410): CONNECT TO $V_{REF}$ AND GROUND PHASE forces the top plate nodes (which are the inputs to a comparator) to have a difference voltage (between them) which is proportional to the analog input. The comparator can then determine if the MSB is to be "kept" (bottom plate tied to $V_{REF}$) or "thrown" away (bottom plate switched to ground), shown as box 414 and 412 respectively.

6) Once the bottom plate of the MSB gets tied to the appropriate voltage, the bottom plate of the next bit (MSB-1) can be tied to $V_{REF}$. The top plate nodes again move and the comparator then decides what to do with the bottom plate of this bit (i.e., leave it tied as it presently is or to switch it to the other voltage), shown as returning to box 408. This process of testing a bit (box 408 and 410) and keeping it (box 414) or throwing it away (412) continues until the algorithm gets to the LSB (illustrated by diamond 416 and box 418).

As described above, sampling and decision phases for all bit decisions can involve a lot of switching of the array of capacitors. Switching the array of capacitors can consume a lot of power, especially when the above SAR algorithm is used. To reduce the amount of power needed for the conversion, a different switching technique can be used.

Figure 4A:
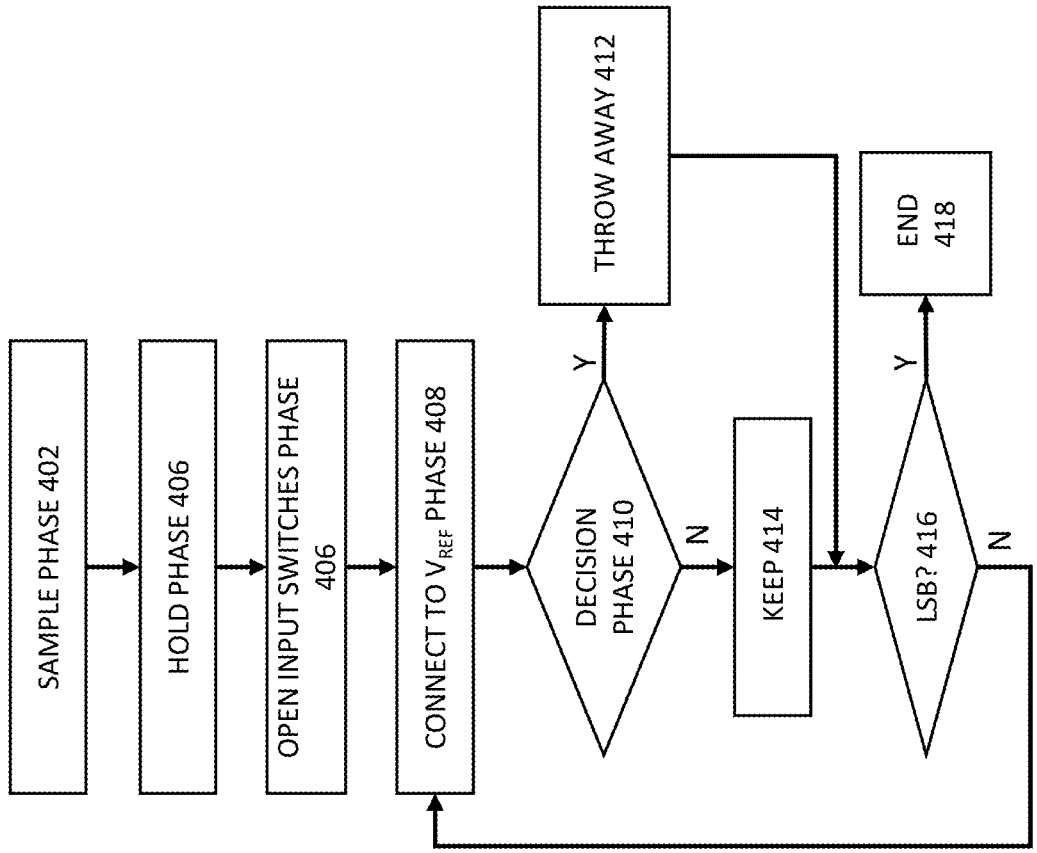
FIG. 4A shows a flow diagram illustrating a conventional switching procedure for use in an SAR ADC.

FIG. 4B shows a flow diagram illustrating an exemplary "decide-and-set" switching procedure for use in an SAR ADC, according to some embodiments of the disclosure. When compared with the conventional SAR algorithm, "decide-and-set" reduces the amount of switching and thus effectively decreases the power consumed. The decide-and-set switching procedure determines the sign of the differential input (MSB) by connecting the differential arrays to $V_{CM}$ (box 422). At the instant the back plate of two capacitors are connected together, the input to the comparator "changes" and the comparator can decide how to configure the bottom plate of the MSB (i.e., to either REFP or to REFN). Once the MSB bottom plate has been connected, this will again change the comparator input and provide information as to how to configure the bottom plate of the MSB-1. Effectively, the decision is made (box 422) and the next bit is set (box 424), hence the "decide-and-set" switching. The power dissipation is derived from just what is needed to drive the bottom plate parasitic of the capacitive arrays. The procedure continues until the algorithm gets to the LSB (illustrate by diamond 426 and box 428). The important features of decide-and-set switching is that the procedure foresees the "up" or "down" transitions (e.g., keeping it or throwing it away) after the comparator determines the bit and not before. For this reason, the procedure does not require pre-charging of capacitors and, possibly, discharging after the bit decision. Therefore, the performed charge redistribution is just what is required without wasting power. The additional cost of the procedure can include additional switches usable for resetting the capacitors to a common mode voltage.

Combining the Use of On-Chip Reservoir Capacitors with Decide-and-Set Switching

An SAR ADC having on-chip reservoir capacitors can utilize different SAR algorithms, depending on the application. For instance, an SAR ADC having on-chip reservoir capacitors can use decide-and-set switching to reduce power consumption. The following describes some illustrative steps performed during the conversion process.

1) The input $V_{in}$ (differentially $V_{in}+$ and $V_{in}-$, sometimes denoted as IN+ and IN− terminals) is sampled typically against a common mode voltage CompCM for the comparator onto the bottom plates of bit caps in DACP. Phrased differently, a value of $V_{REF}-V_{in}$ is sampled onto the bottom plates of bit caps of DACN in a differential configuration. During the time that the input is being sampled, a set of on-chip reservoir capacitors are being charged to the external reference voltage $V_{REF}$. These reservoir capacitors, one per bit, are to be used by DACP and DACN during the SAR process as the required reference REF+ and REF−. The reservoir caps can be placed differentially during the SAR process in between the two DACs and are therefore shared by the two DACs. The bottom plate arrangement for a DAC using decide-and-set switching differs from a conventional SAR algorithm in that there are four bottom plate switches (i.e., switches that are directly connected to the bottom plate) as opposed to three switches. The four switches connect the bottom plates to either $V_{in}$, REF+, REF−, or they short the bottom plate of the bit caps between DACP and DACN.

2) After the signal acquisition phase is made to complete by assertion of a 'Convert Start' signal, the top plate node of both DACs can disconnect from the common mode voltage CompCM, the bottom plate switches can be configured to disconnect from the input signal and short across the two DACs.

3) The reservoir capacitors disconnect their top and bottom plates from the external reference and float.

4) When the bottom plates get shorted across DACP and DACN, a displacement of the top plate nodes from CompCM by an amount and in a direction relative to Vin+ and Vin− results. The comparator can then make a decision based on its two inputs as to how to place or insert the MSB reservoir capacitor in between the MSB bottom plate of DACP and DACN. The shorting switches for the MSB's can be removed and the reservoir capacitor can be placed either right-side-up or upside-down based on the comparator decision and the SAR will update its MSB accordingly.

5) The action of placing the MSB reservoir capacitor into the DAC can affect the voltage difference between the top plate nodes (topp and topn) and this new value for this difference can now be used by the comparator to decide how the MSB-1 reservoir capacitor should be set into the array, hence the term "decide-and-set" for describing this switching algorithm.

6) With that information, the SAR engine can remove the shorting switch between the bottom plates of the two MSB-1 capacitors and now insert the reservoir capacitor in the proper orientation (right-side-up or upside-down). This process of determining how to sequentially connect in the reservoir capacitors continues until all the bits (that have reservoir caps) are determined.

The Trade-Off of Having On-Chip Reservoir Capacitors

On-chip reservoir capacitors act as on-chip sources of energy or charge that is used during the individual bit decisions that occur during the analog-to-digital conversion. The use of on-chip reservoir capacitors no longer requires that the charge come from an off-chip reference through bond wires which tend to impede or slow down the transfer of that charge. The use of reservoir capacitors has a trade-off in that reservoir capacitors are an additional source of error for the ADC due to their limited charge storage capability. Because the different reservoir capacitor bits are applied from MSB downward, the conversion process changes the topology incrementally during the conversion process, and the charge being drawn from the reservoir capacitors are no longer so well controlled. Aside from manufacturing tolerances, there are systematic and significant perturbations in the effective weights of the bits that has to be taken into account. The reservoir capacitors are typically binarily weighted and made larger than the bit capacitors that they are associated with. This will result in a binary weighted array of reservoir capacitors. It is not trivial to measure the magnitude of the error associated with each bit that is to be corrected through a calibration word. It will be shown herein that the on-chip reservoir capacitors can be implemented by smaller "reference" capacitors.

The linearity of an ADC is typically determined by comparing the obtained ADC code against the desired ADC code over the entire transfer function of the ADC. One of the factors that can produce a difference between the obtained code and the actual code is a mismatch between the binary ratios of the bit caps associated with determining the obtained code (i.e., bit weight error). In a system that uses reservoir capacitors as the references for the ADC, an added source of error is produced due to their finite amount of charge storage that can affect the linearity in the same manner as a bit weight error but potentially to a much larger degree. The use of reservoir capacitors in an SAR ADC can, in some cases, complicate the required calibration process. When a reservoir capacitor is used for each bit, the output would depend on what charge that was taken out for the previous bit trial. Calibration by code could result, i.e., each pattern of bit trial result would each have its own unique calibration coefficient. If not done efficiently, calibration word per ADC code might be required, which can result in a prohibitively large number of calibration words and therefore a large amount of memory to store those calibration words. For example, if 7 bits of a 16-bit ADC are using reservoir capacitors and are to be calibrated it can be shown that 127 calibration words may be needed.

Calibration of SAR ADC with On-Chip Reservoir Capacitors and Using Decide-and-Set Switching Perhaps not so obvious is that using decide-and-set switching can simplify the calibration method by only requiring a calibration word per bit, when a calibration technique can be designed to expose the error that would be present during the conversion. If the same SAR ADC is using the decide-and-set method, it would require only 7 calibration words. Predetermining the required calibration coefficients can simply involve the measurement of the error term associated with each reservoir capacitor and bit capacitor pair.

Figure 5:
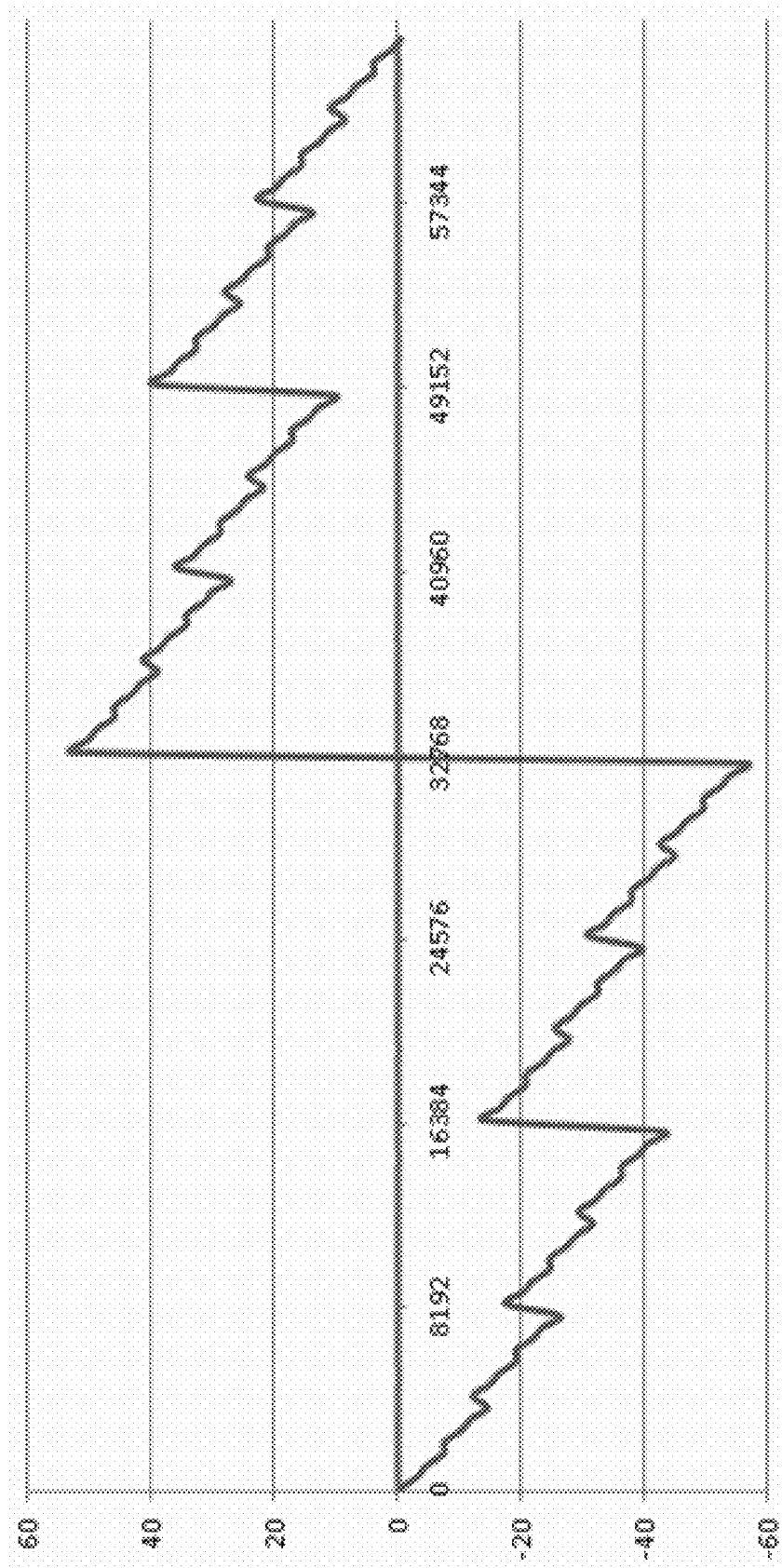
FIG. 5 shows a plot of untrimmed integral non-linearity for a SAR ADC having on-chip reservoir capacitors using decide-and-set switching, according to some embodiments of the disclosure.

FIG. 5 shows a plot of integral non-linearity for a SAR ADC having on-chip reservoir capacitors using decide-and-set switching, according to some embodiments of the disclosure. The plot of the linearity error of an ADC that shows a discontinuity or step in the plot at the code where the error is introduced. A detailed analysis of these steps reveals that in a system using reservoir capacitors of finite size more than one of the bits of the ADC could be contributing to the magnitude and direction of that step. These steps can occur at input voltages that are integer fractions of $V_{REF}$ such as $V_{REF}/2$, $V_{REF}/4$, $V_{REF}/8$, $V_{REF}/16$, $3V_{REF}/4$, $5V_{REF}/8$, etc. The largest step in an architecture of this type can occur in the middle of the transfer function when the two inputs are at $V_{REF}/2$ and it can be shown that all of the bits using reservoir capacitors are contributing to the size of this step. The steps at $V_{REF}/4$ and at $3V_{REF}/4$ are due to the MSB-1 and all bits below that which are using reservoir caps. The steps at $V_{REF}/8$ and $5V_{REF}/8$ are due to the MSB-2 and all bits below that, etc. When the error at step $V_{REF}/4$ is removed, the error at $3V_{REF}/4$ can ideally also get removed. This can occur automatically if the size of the two errors are identical because all the contributing error sources at the two points were the same. Effectively, symmetry of the steps on either side of the MSB error at $V_{REF}/2$ will minimize the effort required to calibrate out all errors.

Overview of Two Techniques for Calibrating the Error

To calibrate the bit weight errors, the present disclosure describes techniques for measuring bit weight errors of the SAR ADC using decide-and-set switching and having on-chip reservoir capacitors being used in individual bit decisions. Specifically, techniques are designed to be unique to SAR ADCs that use decide-and-set switching because the procedure is designed to follow the decide-and-set switching conversion process to expose the effective weight of the bits of the SAR ADC. The technique generally forces the SAR ADC to perform a series of bit trials, perform some digital post processing in the results of the bit trials, and infer from the results of the bit trials what the error term must have been. The decide-and-set switching technique can in some cases lend itself better to calibration of these bit weight errors than the conventional SAR algorithm but can pose some challenges on how to easily measure the errors that need to be calibrated out. The measured errors can allow error coefficients to be determined. The error coefficients can be used, e.g., in digital post processing to correct for the errors, or in analog processing to compensate for the errors.

The present disclosure describes two techniques of measuring those bit weight errors in an SAR ADC using reservoir capacitors and decide-and-set switching. The first technique lends itself to what is referred to as a factory and/or foreground calibration where the application of externally applied inputs can be easily accommodated. The first technique can be accomplished in an environment where externally applied DC voltages can be provided so that each bit to be calibrated can be placed in optimum conditions for measuring the bit weight errors. The second technique also lends itself to a foreground calibration method but also lends itself to what is referred to as a self-calibration method which does not require the application of specific externally applied voltages to support the calibration and can be implemented completely "on-chip".

Both techniques involve controlling switches in an SAR ADC and recording the bit trial results to measure the error of each bit. Before diving into the techniques, the following passages describe the SAR ADC architecture as well as the switches that can be provided in an SAR ADC of the embodiments disclosed herein.

SAR ADC Circuit Design: An Overview

Figure 6:
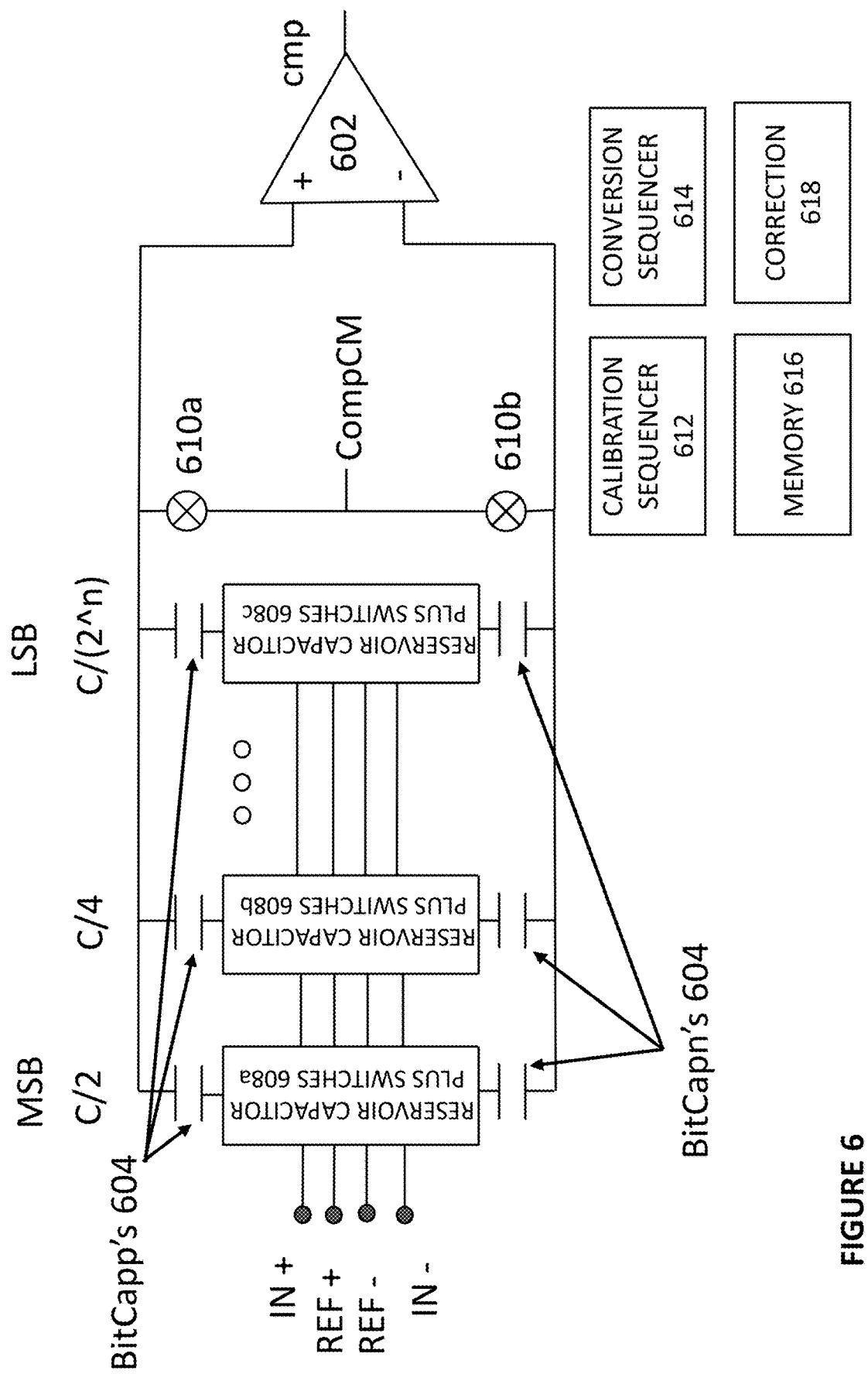
FIG. 6 shows a simplified system diagram of a SAR ADC having on-chip reservoir capacitors, according to some embodiments of the disclosure.

FIG. 6 shows a simplified system diagram of a SAR ADC having on-chip reservoir capacitors, according to some embodiments of the disclosure. In this high level view, an exemplary SAR ADC has (one) comparator 602 having output cmp for generating a decision output, and circuitries for generating a number of bits in the capacitor DAC. It can be seen that each bit from MSB to LSB has corresponding bit caps, BitCapp's 604 and BitCapn's 606, as part of the circuitry for generating a bit. In this example, the bit caps are binarily weighted, e.g., having capacitance, $C/2$, $C/4$, ... $C/(2^n)$. Each circuitry for generating a bit further includes its own on-chip reservoir capacitor (or dedicated on-chip reference capacitors) and a set of switches (shown as reservoir capacitor plus switches 608a-c). Each circuitry for generating a bit can be connected to several inputs, e.g., $V_{in}$ voltage input being sampled provided on terminals IN+ and IN−, and $V_{REF}$ reference voltage shown as terminals REF+ and REF− (e.g., a reference voltage and a complementary reference voltage). All the circuitry for generating a bit (e.g., the bit caps) can be connected a predetermined voltage (e.g., a common mode voltage, comparator common mode voltage, a voltage preferred by comparator 602 at its inputs, such as $V_{REF}/2$) via sample switches 610a-b. Before conversion, top plate nodes of the bit caps are connected to CompCM. Before conversion starts, sample switches 610a-b would open up to "take a sample", and charge is trapped at the top plates of the bit caps and has nowhere to go (since the charge cannot go through open sample switches 610a-b or high impedance input of the comparator 602). Once the charge is trapped, the circuitries shown can proceed with conversion. As used herein, a bit capacitor or a "bit cap" is a capacitor or an aggregated set of smaller capacitors in parallel, which can be weighted for one bit.

The SAR ADC can include a calibration sequencer 612 and a conversion sequencer 614 (in some cases combined into one module). A memory element 616 can be provided to store one or more of the following: results of bit trials during calibration, measured error, calibration words, error coefficients derived from the measured error and/or calibration words, results of bit trials during conversion, output words generated by conversion, etc. A correction module 618 can be included to perform digital post processing to correct the measured error and/or compensation for the measured error in the analog domain. Generally speaking, all of the SAR circuitry (shown in the FIGURE), calibration sequencer 612, conversion sequencer 614, memory element 616, and correction module 618 are all provided on the same semiconductor substrate, or on the same chip. The calibration sequencer 612 and the conversion sequencer 614 can take the output cmp of comparator 602 as input and generate a plurality of output signals for controlling switches of the SAR ADC.

The calibration sequencer 612 may include digital logic or circuitry for controlling the switches in the SAR ADC to implement the calibration techniques, storing results of bit trials, and performing digital post processing of the results from the bit trials of the calibration technique to determine the error for each bit. To control the switches, calibration sequencer 612 may generate control signals with suitable timing to open and close certain switches in the SAR ADC. In some embodiments, the calibration sequencer 612 can be configurable to perform different techniques for calibration, and/or cooperate with correction module 618 to perform techniques for calibration of the SAR ADC.

The conversion sequencer 614 can include digital logic or circuitry for controlling the switches in the SAR ADC to implement a normal conversion process, and for performing any digital post processing for producing a conversion result from the bit trials of the conversion process. For instance, the conversion sequencer can take the output of the comparator cmp as input to generate the proper control signals to open or close the proper switches to implement the conversion process. To control the switches, conversion sequencer 614 may generate control signals with suitable timing to open and close certain switches in the SAR ADC.

Any one or more of the calibration sequencer 612, conversion sequence 614, memory 616, and correction 618 can be considered part of SAR control logic or SAR logic (corresponding to SAR control logic 106 of FIG. 1, and SAR logic 3106 of FIG. 31).

Figure 7:
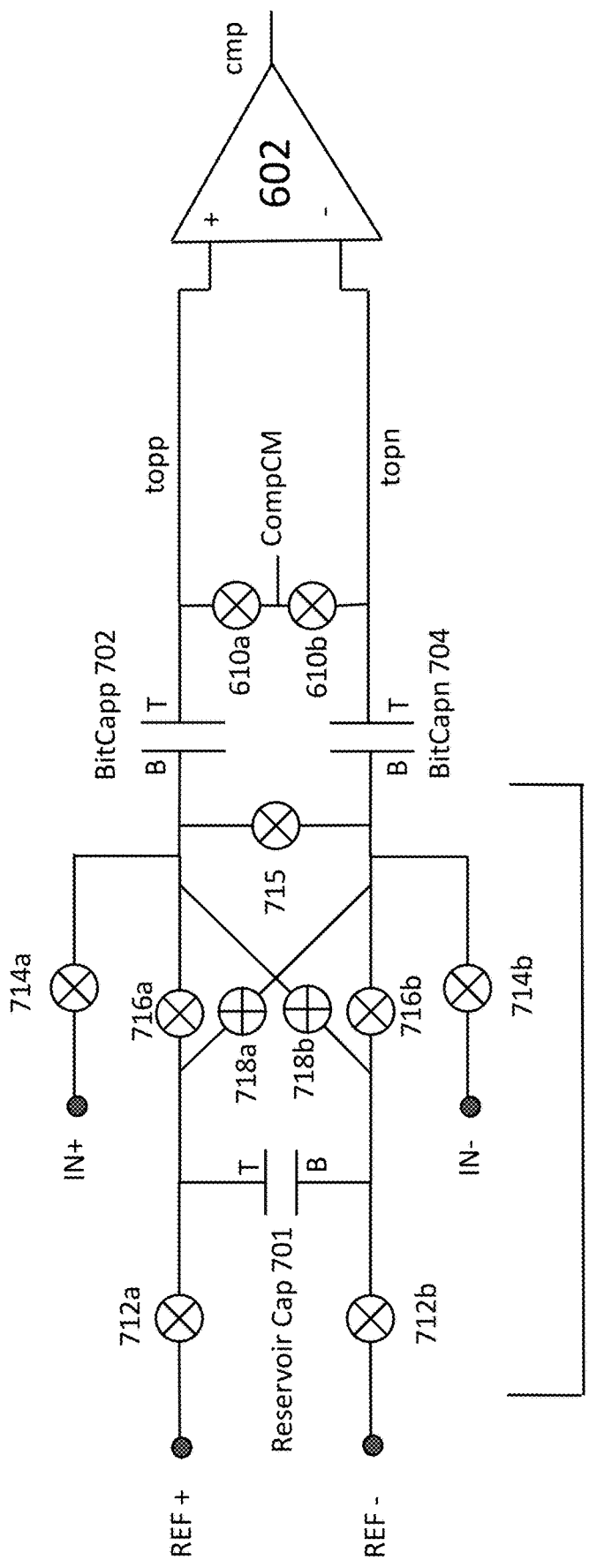
FIG. 7 shows a circuitry for generating a bit of the SAR ADC, according to some embodiments of the disclosure.

FIG. 7 shows a circuitry for generating a bit of the SAR ADC, according to some embodiments of the disclosure. The circuitry includes bit caps for the bit, BitCapp 702 and 704, and a reservoir capacitor 701. The circuitry shown is of a differential design, thus two bit capacitors are used. Their top and bottom plates are marked by the letters "T" and "B" respectively. BitCapp 702 and 704 each have a top plate node, shown as topp and topn respectively. Sample switches 610a-b can connect the top plates to CompCM if the sample switches 610a-b are closed. In the reservoir capacitor plus switches section, there are two precharge switches 712a and 712b, and a set of bottom plate switches for the BitCapp 702 and 704. The precharge switches 712a-b can connect the reservoir cap 701 top and bottom plates to REF+ and REF− respectively. There are four bottom plate switches for each of the bottom plates of BitCapp 702 and 704. The bottom plate switches includes input switches 714a-b, which can be used to connect IN+ and IN− (respectively) to the bottom plates of BitCapp 702 and 704 (respectively). The bottom plate switches further includes a shorting switch 715, which can be used to short the bottom plates of BitCapp 702 and 704. The bottom plate switches further has bit switches that can connect the reservoir capacitor 701 "right-side-up" or "upside-down" to the bottom plates of BitCapp 702 and 704. The bit switches include right-side-up switches 716a-b for connecting the top plate of reservoir cap 701 to the bottom plate of BitCapp 702 and the bottom plate of reservoir cap 701 to the bottom plate of BitCapn 704, and upside-down switches 718a-b for connecting the top plate of reservoir cap 710 to the bottom plate of BitCapn 704 and the bottom plate of reservoir cap 701 to the bottom plate of BitCapp 702. Depending on whether the right-side-up switches 716a-b or the upside-down switches 718a-b are used, the polarity of the reservoir cap 710, and thus effectively REF+ and REF− changes. If the shorting switch 715 and either the right-sideup switches 716a-b and/or the upside-down switches 718a-b are closed, the reservoir capacitor 701 can be discharged.

Figure 32:
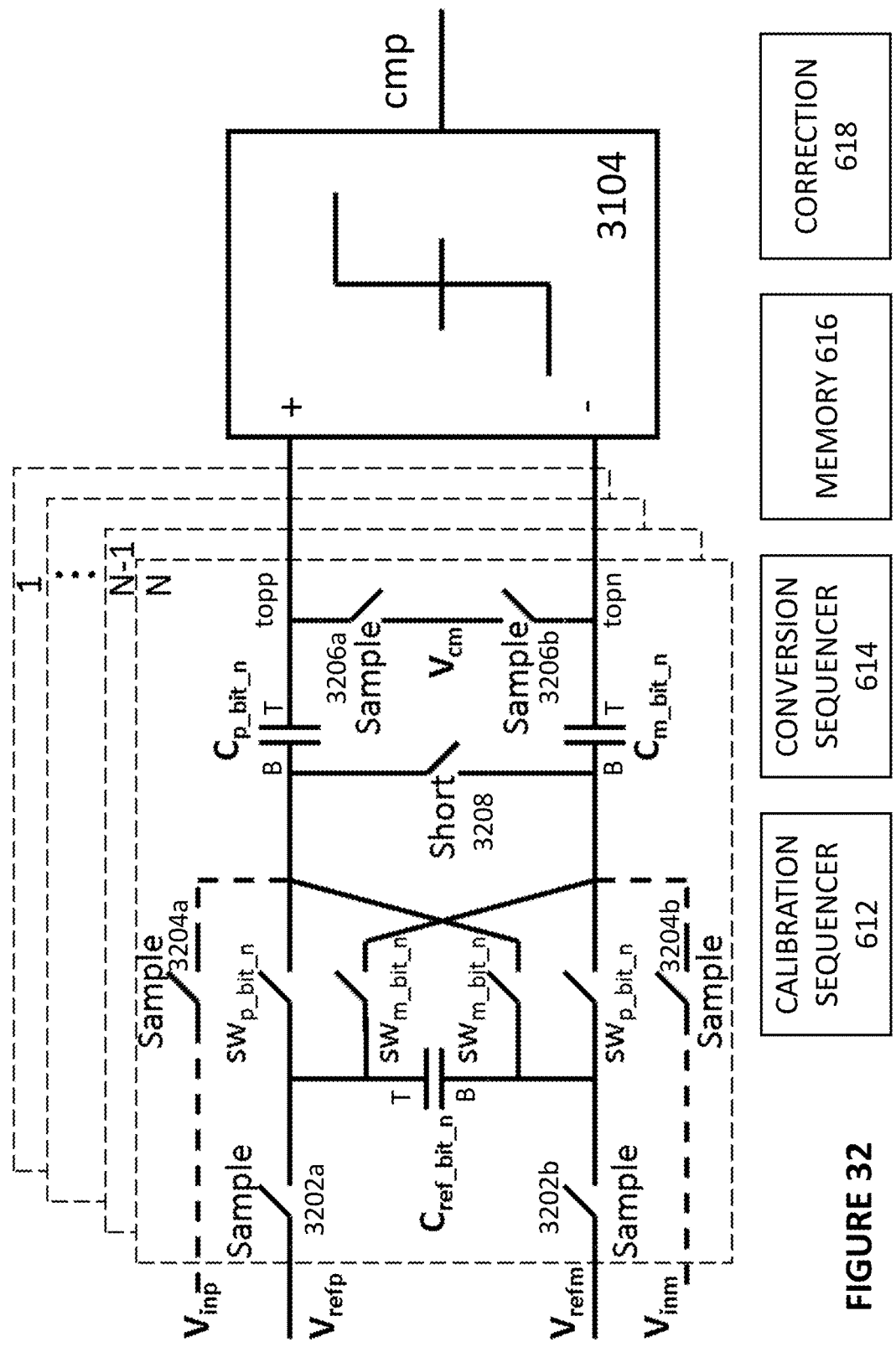
FIG. 32 shows a circuit diagram of a SAR ADC illustrating the circuit design for a capacitive DAC unit with dedicated reference capacitors for each pair of bit capacitors, according to some embodiments of the disclosure.

FIG. 32 shows a circuit diagram of a SAR ADC illustrating the circuit design for a capacitive DAC unit with dedicated reference capacitors for each pair of bit capacitors, according to some embodiments of the disclosure. FIG. 32 shows the DAC 3102 and comparator 3104 of FIG. 31 in greater detail. Furthermore, FIG. 32 depicts the SAR ADC illustrated by FIGS. 6 and 7 in a slightly different manner. Notably, seen in FIG. 31 are N capacitive DAC units for implementing N-bit trials. Each capacitive DAC unit corresponds to a particular bit weight, or a particular bit trial. Specifically, the N capacitive DAC units are usable in a SAR ADC, and the N capacitive DAC units' bit weights are signal-independent. The Nth capacitive DAC unit circuit (which is among a plurality of capacitive DAC units in the SAR ADC) is shown in detail, and the other capacitive DAC units can be implemented in a similar manner (though they would be weighted differently). The circuit shown is of a differential design. It is understood by one skilled in the art that a single-ended design is also envisioned by the disclosure. The following passages describes the circuit and a speedy method for converting an analog input to a digital output using an area efficient successive-approximation-register analog-to-digital converter (SAR ADC) with signal-independent bit weights.

A capacitive DAC unit (such as the Nth capacitive DAC unit) can include one or more bit capacitors (shown as $C_{p\_bit\_n}$ and $C_{m\_bit\_n}$) for directly sampling the analog input (shown as $V_{inp}$ and $V_{inm}$) and generating outputs of the capacitive DAC unit (shown as nodes topp and topn). The one or more bit capacitors within a capacitive DAC unit corresponds to a particular bit weight, or a particular bit trial. The exemplary capacitive DAC unit as shown is implemented in a differential manner, thus the capacitive DAC unit has a pair of bit capacitors (shown as $C_{p\_bit\_n}$ and $C_{m\_bit\_n}$), wherein the pair of bit capacitors are connectable to track an analog input signal to the SAR ADC (shown as $V_{inp}$ and $V_{inm}$) during a sampling phase, and the pair of bit capacitors (shown as $C_{p\_bit\_n}$ and $C_{m\_bit\_n}$) generates inputs to a comparator (shown as + and − terminals) during the conversion phase. The pair of bit capacitors (shown as $C_{p\_bit\_n}$ and $C_{m\_bit\_n}$) tracks and samples the analog input (shown as $V_{inp}$ and $V_{inm}$) directly.

Herein, sampling phase refers to a time period when one or more bit capacitor are sampling the input (e.g., including tracking the input and sampling the input). Furthermore, conversion phase refers to a subsequent time period when one or more bit trials are being carried out to determine a digital output code which represents the value of the analog input.

The capacitive DAC unit further includes an on-chip reference capacitor (shown as $C_{ref\_bit\_n}$) dedicated to the one or more bit capacitors (shown as $C_{p\_bit\_n}$ and $C_{m\_bit\_n}$) for pulling charge from a reference voltage (shown as $V_{refp}$ and $V_{refm}$) and sharing charge with the at least one bit capacitor (shown as $C_{p\_bit\_n}$ and $C_{m\_bit\_n}$). Accordingly, a dedicated on-chip reference capacitor can be provided for one or more capacitive DAC units. Preferably, a dedicated on-chip reference capacitor (shown as $C_{ref\_bit\_n}$) is provided for each capacitive DAC unit, thus the on-chip reference capacitor (shown as $C_{ref\_bit\_n}$) is among a plurality of on-chip reference capacitors, each being dedicated to (a pair of) bit capacitors of a corresponding capacitive DAC unit. Since each capacitive DAC unit corresponds to a particular bit weight and a particular bit trial, the on-chip reference capacitor is dedicated to one or more bit capacitors corresponding to a particular bit weight and a particular bit trial. The on-chip dedicated reference capacitor (shown as $C_{ref\_bit\_n}$) is connectable to a reference voltage (shown as $V_{refp}$ and $V_{refm}$) during the sampling phase and the on-chip dedicated reference capacitor (shown as $C_{ref\_bit\_n}$) is connectable to the pair of bit capacitors (shown as $C_{p\_bit\_n}$ and $C_{m\_bit\_n}$) for sharing charge with the pair of bit capacitors during the conversion phase. During the sampling phase, the on-chip reference capacitor (shown as $C_{ref\_bit\_n}$) is charged to the reference voltage (shown as $V_{refp}$ and $V_{refm}$). During conversion phase of a bit trial, the on-chip reference capacitor (shown as $C_{ref\_bit\_n}$) shares charge with the bit capacitors (shown as $C_{p\_bit\_n}$ and $C_{m\_bit\_n}$) to which the on-chip reference capacitor (shown as $C_{ref\_bit\_n}$) is dedicated.

Referring to both FIG. 7 and FIG. 32:

REF+ and REF− of FIG. 7 correspond to reference voltage $V_{refp}$ and $V_{refm}$ of FIG. 32 respectively;

IN+ and IN− of FIG. 7 correspond to analog input $V_{inp}$ and $V_{inm}$ of FIG. 32 respectively;

Reservoir Cap 701 of FIG. 7 corresponds to on-chip reference capacitor $C_{ref\_bit\_n}$ of FIG. 32;

BitCapp 702 and BitCapn 704 of FIG. 7 correspond to bit capacitors $C_{p\_bit\_n}$ and $C_{m\_bit\_n}$ of FIG. 32 respectively;

CompCM of FIG. 7 corresponds to $V_{cm}$ of FIG. 32;

precharge switches 712a and 712b of FIG. 7 correspond to switches 3202a and 3202b of FIG. 32 respectively;

sample switches 610a and 610b of FIG. 7 correspond to switches 3206a and 3206b of FIG. 32 respectively;

shorting switch 715 of FIG. 7 corresponds to switch 3208 of FIG. 32;

right-side-up switches 716a and 716b correspond to switches labeled $SW_{p\_bit\_n}$ of FIG. 32 respectively; and upside-down switches 718a and 718b correspond to switches labeled $SW_{m\_bit\_n}$ of FIG. 32 respectively.

During the ADC sampling phase, the bit capacitors $C_{p\_bit\_n}$ and $C_{m\_bit\_n}$ tracks and samples the input voltage $V_{inp}$ and $V_{inm}$. Tracking and sampling the analog input comprises closing switches 3204a and 3202b to connect the analog input $V_{inp}$ and $V_{inm}$ to first plates of bit capacitors (i.e., bottom plates, labeled "B", of bit capacitors $C_{p\_bit\_n}$ and $C_{m\_bit\_n}$) to directly track the analog input $V_{inp}$ and $V_{inm}$. Then, switches 3204a and 3202b are opened to sample the analog input onto the bit capacitors $C_{p\_bit\_n}$ and $C_{m\_bit\_n}$. Notably, the bit capacitors directly samples the analog input $V_{inp}$ and $V_{inm}$ during the sampling phase.

During the sampling phase, the on-chip dedicated reference capacitor $C_{ref\_bit\_n}$ is charged back to ADC reference voltage $V_{refp}$ and $V_{refm}$ during the sampling phase. Charging the on-chip reference capacitor $C_{ref\_bit\_n}$ includes closing switches 3202a and 3202b to connect a first plate of the on-chip reference capacitor to a reference voltage (e.g., top plate of $C_{ref\_bit\_n}$, labeled as "T", to $V_{refp}$) and to connect a second plate of the on-chip reference capacitor to a complementary reference voltage (bottom plate, labeled as "B", to $V_{ref}$). Then, the switches 3202a and 3202b are opened to disconnect the on-chip reference capacitor from the reference voltage and the complementary reference voltage ($V_{refp}$ and $V_{refm}$).

At the beginning of or prior to the conversion phase, the bottom plates (left side, labeled as "B") of the bit capacitors are differentially shorted to settle at the input common mode voltage and be ready for first SAR comparator decision. The input common mode voltage is $(V_{inp}+V_{inm})/2$. Switch 3208 is closed to transfer the sampled analog input to second plates of the bit capacitors (i.e., top plates, labeled "T", of bit capacitors $C_{p\_bit\_n}$ and $C_{m\_bit\_n}$). As a result, the first plates of the bit capacitors (i.e., bottom plates, labeled "B", of bit capacitors $C_{p\_bit\_n}$ and $C_{m\_bit\_n}$) are differentially shorted to settle to a common mode voltage (of the sampled input signal in the bit capacitors) prior to sharing charge by the on-chip reference capacitor $C_{ref\_bit\_n}$ with the bit capacitors. Phrased differently, the pair of bit capacitors $C_{p\_bit\_n}$ and $C_{m\_bit\_n}$ are differentially shorted to a common mode voltage of the analog input signal sampled onto the bit capacitors prior to the reference capacitor sharing charge with the pair of bit capacitors. In some embodiments, each one of the one or more bit capacitors has a first plate and a second plate (e.g., bottom plate and top plate, labeled as "B" and "T" respectively). First plates of the one or more bit capacitors (bottom plates) are differentially shorted to settle at a common mode voltage to transfer a sampled input signal in the one or more bit capacitors to the second plates of the one or more bit capacitors (top plates), after a sampling phase of and prior to a conversion phase of the particular bit trial.

During the ADC conversion phase, from the MSB all the way to the LSB trials, the corresponding reference capacitor $C_{ref\_bit\_n}$ would be either direct connected ($SW_{p\_bit\_n}$ ON) to its bit capacitor in the DAC unit, or cross connected ($SW_{m\_bit\_n}$ ON), depending on the comparator decision in the SAR feedback loop. In some embodiments, the one or more bit capacitors comprises a first bit capacitor and a second bit capacitor ($C_{p\_bit\_n}$ and $C_{m\_bit\_n}$). Each bit capacitor has a first plate and a second plate (e.g., bottom plate and top plate, labeled as "B" and "T" respectively). Using switches $SW_{p\_bit\_n}$ and $SW_{m\_bit\_n}$, plates of the dedicated reference capacitor (e.g., top plate and bottom plate, labeled as "T" and "B" respectively) are either directly connected or cross connected to a first plate of the first bit capacitor (bottom plate of $C_{p\_bit\_n}$) and a first plate of the second bit capacitor (bottom plate of $C_{m\_bit\_n}$) to distribute charge to the one or more bit capacitors during a conversion phase. A second plate of the first bit capacitor (top plate of $C_{p\_bit\_n}$) and a second plate of the second bit capacitor (top plate of $C_{m\_bit\_n}$), as topp and topn nodes, are connected to inputs of the comparator (positive and negative terminals) for triggering the decision output cmp during the conversion phase. To share charge with the bit capacitors $C_{p\_bit\_n}$ and $C_{m\_bit\_n}$, the on-chip dedicated reference capacitor $C_{ref\_bit\_n}$, switches $SW_{p\_bit\_n}$ and $SW_{m\_bit\_n}$ are selectively closed to connect plates of the reference capacitor $C_{ref\_bit\_n}$ to first plates of the bit capacitors (bottom plates of $C_{p\_bit\_n}$ and $C_{m\_bit\_n}$) to insert the reference capacitor $C_{ref\_bit\_n}$ in an orientation based on a feedback signal of the SAR ADC.

Understanding Bit Weight Signal Independency of the SAR ADC Circuit Design

When the bit weights are signal-independent, the SAR ADC can more easily measure bit weight errors and compensate for the bit weight errors. One advantage is the reduction in the number of error coefficients that is needed for calibrating the SAR ADC. For instance, the SAR ADC can include a memory element for storing error coefficients for calibrating bit weights of the plurality of capacitive DAC units, wherein the error coefficients are independent from the analog input and/or digital output. Without signal independency, different error coefficients are determined and stored for different analog inputs and/or digital outputs. Generally speaking, when there is signal independency, these error coefficients do not change depending on the digital output code, or there are no error coefficients indexed by the digital output code. As a result, the number of coefficients are significantly reduced, when compared to error coefficients which are signal dependent. The following passages explains how the unique SAR ADC design can achieve bit weight signal independency.

Figure 33:
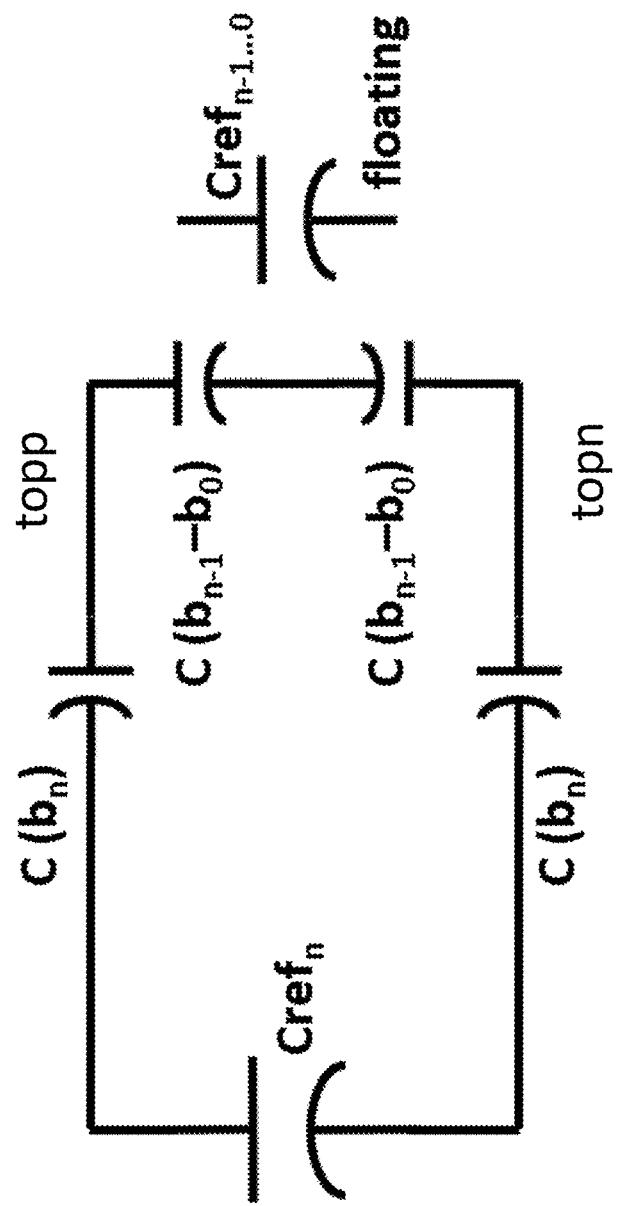
FIG. 33 shows the state of the capacitive DAC unit circuit during MSB trial, according to some embodiments of the disclosure.

FIG. 33 shows the state of the capacitive DAC unit circuit during MSB trial, according to some embodiments of the disclosure. In this example, bit capacitors in the capacitive DAC units are binary weighted (the capacitive DAC units have corresponding binary bit weights). In some embodiments, the capacitive DAC units may not be binary weighted, where the capacitive DAC units are weighted according to a different set of weights. The bit weight effectively corresponds to the DAC output step (topp-topn) when the reference capacitor $C_{refn}$ is connected to the bit capacitors. Regardless whether the reference capacitor $C_{refn}$ is direct or cross connected to the bit capacitor(s) (based on first comparator decision), the reference capacitor $C_{refn}$ always sees the same capacitor loading comprised of MSB bit capacitor $C(b_n)$ in series with aggregated LSB bit capacitors $C(b_{n-1}\text{-}b_0)$. The bottom plates of MSB bit capacitors always start from a common mode voltage of the sampled input on the bit capacitors (or "input common mode voltage"), as they were differentially shorted at the beginning of the conversion phase. As a result, the voltage on the reference capacitor $C_{refn}$ right after charge sharing with the load is decision or signal-independent. This leads to the observation that the absolute DAC output step size is decision or signal-independent, as it is just voltage division between the MSB bit capacitor $C(b_n)$ and the aggregate of the LSB bit capacitors $C(b_{n-1}\text{-}b_0)$, in response to the fixed voltage step (from the input common mode voltage to fixed reference capacitor voltage after charge sharing) applied to the MSB capacitor's bottom plate by the reference capacitor $C_{refn}$.

Figure 34:
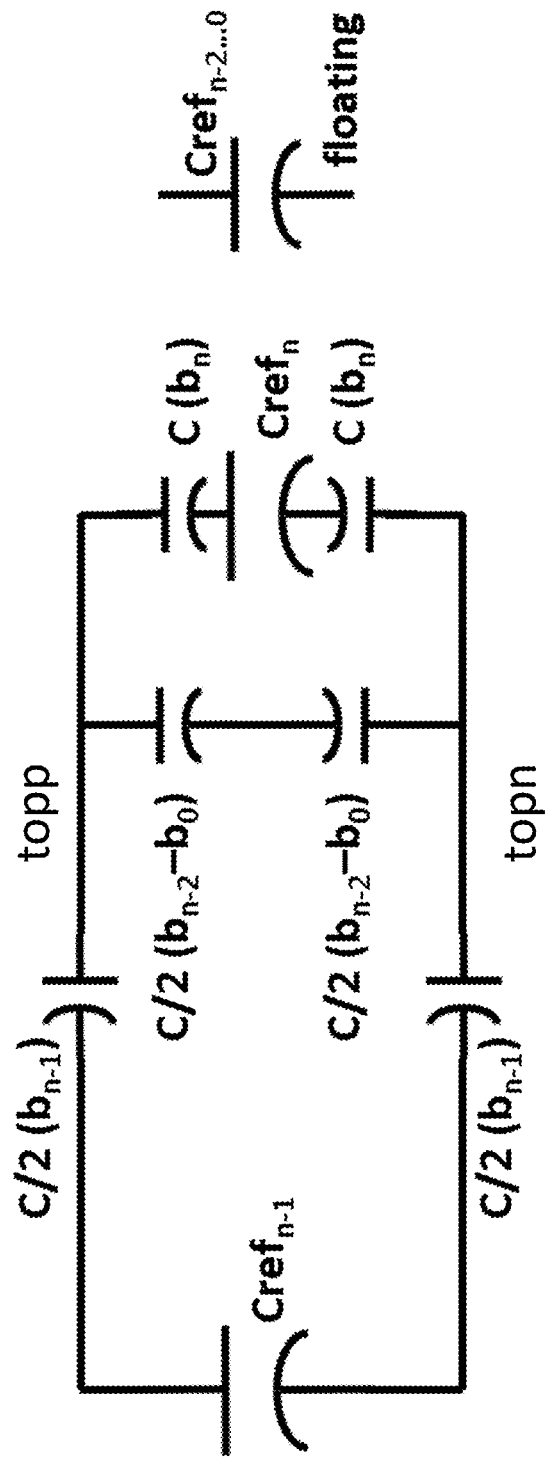
FIG. 34 shows the state of the capacitive DAC unit circuit during MSB-1 trial, according to some embodiments of the disclosure.

FIG. 34 shows the state of the capacitive DAC unit circuit during MSB-1 trial, according to some embodiments of the disclosure. Note that the aforementioned observation applies here as well. Whether MSB trial decided a 1 or 0 only affects the $C_{refn}$ being upright or upside-down, which would not affect the loading capacitance to the reference capacitor $C_{refn-1}$. Thus, the bit weight for MSB-1 trial is decision or signal-independent as well. And this holds true for all the rest of the trials during the conversion.

Notably, though a bit counter intuitive, while all the bit weights are signal-independent, the charge drawn from the reference capacitors are signal dependent. Referring to the example described above, while charge loss on $C_{refn}$ is fixed during MSB trial, its stored charge would change in the MSB-1 trial, during the charge redistribution when $C_{refn-1}$ is connected to its load capacitors. The charge change on $C_{refn}$ depends on the decisions of both MSB and MSB-1 trials. All the later trials would affect the charge stored on the reference capacitors in the earlier trials. While the reference capacitor charges keep updating during trials, the bit weight for each trial is locked in (in the form of DAC output step size) right after the charge sharing in that trial.

It could also be mathematically proven that the proposed dedicated reference capacitor approach is also immune to asymmetric parasitic capacitors at the top and bottom plates of $C_{refn}$, and/or asymmetric parasitic capacitors at topp and topn. This immunity makes the technique robust in achieving signal-independent bit weights, thus making potential bit weight calibration much easier, e.g., making the calibration the same as calibrating out bit capacitor mismatches.

Using dedicated reference capacitor instead of sharing a reference capacitor for multiple bit capacitors and multiple bit trials ensures the bit weights are signal-independent. If the same reference capacitor (shared reservoir capacitor) for more than one trial, then the later trial or trials will see the early trial(s) decision dependent reference voltage on the reference capacitor, making the bit weight decision or signal dependent.

In some scenarios, the bit capacitors may not be sampling the input voltage, e.g., there is a separate sample-and-hold circuitry to sample the input voltage. During the ADC sampling phase, the bit capacitors ($C_{p\_bit\_n}$ and $C_{m\_bit\_n}$ of FIG. 32) could be reset to a common mode (CM) voltage on both top (right side) and bottom (left side) plates (reset to CM voltage on the bottom plates are not explicitly shown in FIG. 32). The bottom plates of the bit capacitors can be connected to a common mode voltage (e.g., common mode voltage of the comparator). This common mode voltage (sometimes referred to as CompCM herein) can be a fixed common mode voltage of the circuitry of the SAR ADC. Then during the conversion phase, it's effectively the same as the first case described above, where bottom plates of bit capacitors are also reset to a common mode voltage at the beginning of the conversion phase.

In some scenarios, the bit capacitors (e.g., $C_{p\_bit\_n}$ and $C_{m\_bit\_n}$ of FIG. 32) are sampling the input voltage, but the bottom plates of one or more most significant bits are not differentially shorted at the beginning of or prior to the conversion phase. Phrased differently, the first/bottom plates of the bit capacitors are not differentially shorted to settle to a common mode voltage prior to the on-chip reference capacitor sharing charge with the bit capacitors. This can potentially eliminate a step in the SAR ADC procedure. In this case, the one or more most significant bits (MSBs) could be resolved using an auxiliary ADC and the decision(s) are applied to one or more capacitive DAC units in the main SAR DAC accordingly. The auxiliary ADC can convert the analog input to a number of most significant bits, wherein the most significant bits controls switches in the same number of capacitive DAC units for inserting the reference capacitor in a proper orientation during a conversion phase. The auxiliary ADC can be a mini SAR ADC, a flash ADC, or any suitable fast, cheap ADC which does not add a lot of area or power. Though counter intuitive, it can be shown mathematically that the bit weights in this configuration are also signal-independent.

Figure 36:
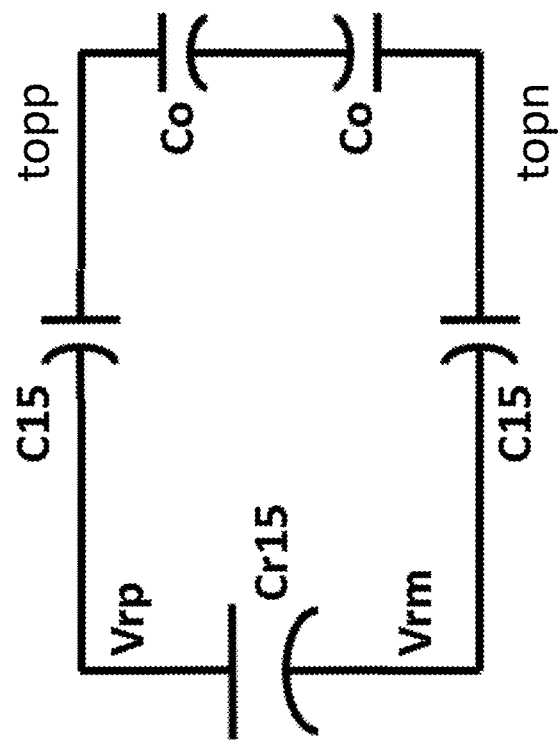
FIG. 35-36 show the states of the capacitive DAC unit circuit during the sampling phase and the conversion phase for Bit 15 trial, respectively, according to some embodiments of the disclosure.
Figure 35:
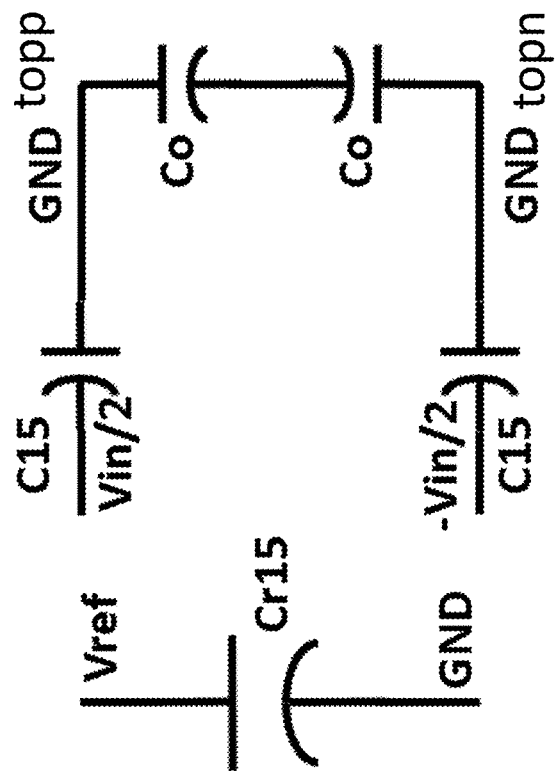

To simplify the reasoning, the following is an example assuming an ideal 16-bit SAR ADC, other than Bit 15 (i.e., the most significant bit of the SAR ADC) which uses a finite reference capacitor Cr15 instead of an ideal reference source. FIG. 35-36 show the states of the capacitive DAC unit circuit during the sampling phase and the conversion phase for Bit 15 trial, respectively, according to some embodiments of the disclosure. With charge conservation law on the left sides of Cr15, it is possible to arrive at the following at the end of conversion, when topp and topp converges to a fixed common mode voltage of the SAR ADC (e.g., ground or GND)

$$Vr15=(2Cr15*Vref+b15*C15*Vin)/(2Cr15+C15)$$

Vref is reference voltage, b15 is bit decision (+/−1) which determines whether the bit capacitors will connect straight to the reference capacitor or cross-connect, and Vin is ADC input voltage. Note that Vr15 is linearly proportional to Vin. If the ADC is converting properly (DAC output converges, ignoring quantization error), it is possible to arrive at the following:

$$Vin=b15*W15'*(1+k15*b15*Vin/VFS)+\mathrm{sum}((b14{:}b0).*(W14{:}W0))$$

VFS is full scale input, W15' is b15's (half) bit weight when Vin=0 (in the mid-input). W15' is proportional to 2Cr15/(2Cr15+C15)Vref), and k15 is proportional to C15/(2Cr15+C15). The b15 in between k15 and Vin is to take into account that the reference capacitor voltage drop is decision/sign dependent. The first term on the right of the equation shows that b15 weight is dependent on Vin. Reorganizing the equation above arrives at the following:

$$Vin=(b15*W15'+\mathrm{sum}((b14{:}b0).*(W14{:}W0)))/(1-k15*W15'/VFS)$$

As seen above, replacing Vin with Dout (i.e., representing nodes topp and topn) and ignoring quantization error, Dout is effectively not signal dependent. Similarly, using individual reference capacitor for b15 and b14, it is possible to arrive at the following (and so on for other capacitive DAC units):

$$Vin=(b15*W15'+b14*W14'+\mathrm{sum}((b13{:}b0).*(W13{:}W0)))/(1-k15*W15'/VFS-k14*W14'/VFS)$$

The voltage drop for each individual reference capacitor is perfectly linear with Vin, but the rest of the bit decisions will account for that error, in a linear fashion as well. Accordingly, when an individual reference capacitor is dedicated for each bit capacitor, the equations above hold.

Intuitively, after bit 15 trial, the DAC output voltage is linearly proportional with ADC input voltage, and assume all other trials have signal-independent bit weights. It is possible to arrive at the following:

$$Vin=k*Vin+(b15{:}b0).*(W15{:}W0)$$

$$Vin=(b15{:}b0).*(W15{:}W0)/(1-k)$$

k*Vin represent the ADC input referred difference between b15 DAC output at Vin input and 0V input, and k is a positive constant much smaller than 1. From one perspective, b15 bit weight is signal dependent, but in a linear fashion. Effectively, it is possible to represent Vin or Dout as shown in the equation Vin=(b15:b0).*(W15:W0)/(1−k), where all bit weights are scaled up a bit, and all of them are signal-independent. If more bits have corresponding dedicated/individual reference capacitor, the same reasoning applies and the SAR ADC still achieves signal-independent bit weights.

Variations to the SAR ADC

In some embodiments, dedicated reference capacitors are provided for only some of the capacitive DAC units. For instance, dedicated reference capacitors are provided for capacitive DAC units which correspond to bit trials for resolving most significant bits of the digital output. The SAR ADC can include one or more further capacitive DAC units corresponding to one or more other bit trials. Rather than having dedicated reference capacitors, the one or more further capacitive DAC units can share one or more of: a single reservoir capacitor, a reference source from an on-chip reference buffer, and an off-chip reference (hence the one or more further capacitive DAC units do not have dedicated reference capacitors). As outlined above, some bit weight signal independency can still be achieved for each capacitive DAC units having said dedicated reference capacitor. Note that while the one or more further capacitive DAC units do not have dedicated reference capacitors, some bit weight signal independency can be achieved if, for instance, the reservoir capacitor is large enough to minimize error, or in another instance, the reference source is accurate enough.

Depending on the SAR ADC implementation, only bit capacitor(s) of a subset of capacitive DAC units directly samples the analog input during a sampling phase while bit capacitor(s) of the rest of capacitive DAC unit(s) does not sample the analog input during the same sampling phase. Such an implementation can simplify input routing/layout to the capacitive DAC units, by allowing some capacitive DAC units to not sample the analog input when other capacitive DAC units are sampling the analog input.

Depending on the SAR ADC implementation, different sources can be used to charge the on-chip dedicated reference capacitors. For example, an on-chip reference source can provide the reference voltage. In another example, the reference voltage is provided by an off-chip reference source through chip bondwire. Either can be used while the SAR ADC can still benefit from the speed gained from using on-chip reference capacitors.

Exemplary Method for Measuring Bit Weight Errors

In an SAR ADC with on-chip reservoir caps, it is almost guaranteed to have an error even if the bit caps are perfectly weighted because the charge is drawn from a limited charge available from the reservoir caps for each bit. Broadly speaking, the switches for the circuitry are controlled to measure the error of the different bits by exposing the effective weight of the bits, one by one. In some embodiments, the error measurement technique (as implemented by the calibration sequencer 612 of FIG. 6) can begin with the MSB, and measure the MSB with respect to all the bits under it (all the lower bits, e.g., MSB-1, MSB-2, . . . . LSB). Then, the technique can proceed to measure the MSB-1 with respect to all the bits under it (e.g., MSB-2, MSB-3, . . . LSB). The error measurement technique can continue down to the LSB, or until the bits are so small the error is not worth correcting.

Figure 8:
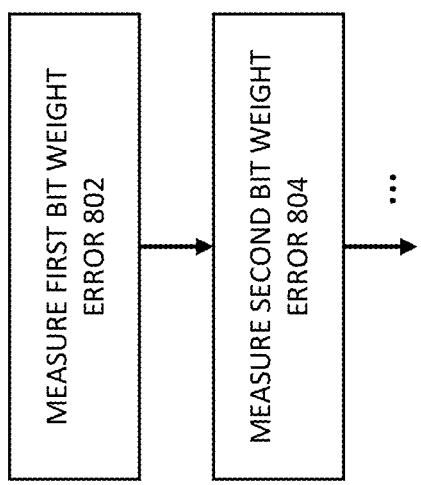
FIG. 8 shows a flow diagram illustrating a method for measuring bit weight errors of a SAR ADC, according to some embodiments of the disclosure.

FIG. 8 shows a flow diagram illustrating a method for measuring bit weight errors of a SAR ADC, according to some embodiments of the disclosure. The method for measuring bit weight errors of a successive-approximation register analog-to-digital converter (SAR ADC) is outlined in the figure. As mentioned above, the SAR ADC uses decide-and-set switching and has on-chip reservoir capacitors being used in individual bit decisions. The method begins by measuring a first bit weight error associated with first bit capacitors and a first on-chip reservoir capacitor of first circuitry for generating a first bit of the SAR ADC (box 802). Once the first bit weight error is measured, the method proceeds by measuring a second bit weight error associated with second bit capacitors and a second on-chip reservoir capacitor of second circuitry used for generating a second bit of the SAR ADC (box 804). The second bit can be the next lower bit of the first bit. For instance, the method can begin with the MSB as the first bit, then MSB-1 as the second bit. The method can proceed to measure the bit weight errors of the lower bits, e.g., MSB-2, MSB-3, . . . LSB. Following an appropriate switching sequence, the technique can (independently) expose a first effective weight of the first bit of the SAR ADC and expose a second effective weight of the second bit of the SAR ADC (and so on). Using the techniques described herein, the bit weight errors measured are independent of each other (e.g., the second bit weight error is independent from the first bit weight error). Thus, the technique advantageously orthogonalizes the error contribution of the bits, meaning only one calibration word per bit of the SAR ADC is to be generated and stored.

A First Exemplary Technique Using a Plurality of Predetermined Inputs

To measure the magnitude of the errors associated with each bit independently, the system is setup to properly expose all of the contributing error sources during the time the error is measured. At a high level, the first exemplary technique exposes the effective weights of the bits by forcing the SAR ADC to sample a series of predetermined inputs. For a bit under test, the technique can apply a specific differential input voltage to be sampled by the SAR ADC. Then the lower bits can be used as weights to weigh the bit under test or to balance the effective weight of the bit under test.

The SAR ADC involves a charge balancing process. Thus, to expose the effective weight of a bit under test, a specific input voltage (e.g., in the form of a differential signal to differential inputs IN+ and IN−, herein also referred to as "predetermined input" or "predetermined input voltage") is provided to produce a charge that would be cancelled by the charge delivered by zero or more bits that are more significant than the bit under test (or bits which are no longer being tested, or bits that are not of interest when measuring the effective weight of the bit under test). The specific differential input voltage effectively forces the inputs to the comparator to be at zero differential for the bits that are more significant than the bit under test during the conversion process so that the more significant to the bit under test do not contribute or make a contribution to the effective weight of the bit under test being measured. Phrased differently, the specific input voltage exposes the effective weight of the bit under test by making the bits that are more significant than the bit under test cancel out the charge delivered by the specific input voltage and isolates the effective weight of the bit under test.

For a differential SAR ADC, the first predetermined input comprises a first differential input signal and/or the second predetermined input comprises a second differential input signal. The following outlines an example where the SAR ADC samples a differential input signal having a differential pair of input voltages. For exposing the weight of the MSB, because there are no more significant bits above the MSB, the specific input voltage can be differential zero or be a differentially zero input (i.e., the two voltages of the differential pair is the same). For exposing the weight of the MSB-1, MSB is more significant than MSB-1, and thus, the specific input voltage can have a differential voltage that corresponds to the weight of the MSB (i.e., the difference between the two voltages of the differential pair matches up with the weight of the MSB). For exposing the weight of the MSB-1, MSB and MSB-1 are more significant than MSB-2, and thus, the specific input voltage can have a differential voltage that corresponds to the sum of the bit weights of the MSB and MSB-1. To generalize, the difference between the differential signal pair for the specific input voltage corresponds to weight(s) of the bit(s) which are more significant to the bit under test so that the charge delivered by the differential signal pair can be cancelled out by the weight(s) of the bit(s) which are more significant to the bit under test.

In one example, the series of predetermined inputs being provided at IN+ and IN− (as differential inputs) for measuring the error of each bit can start at midscale (half fullscale (FS)), e.g., a pair of signals [½ FS, ½ FS], then [¼ FS, ¾ FS], [⅛ FS, ⅞ FS], [¹⁄₁₆ FS, ¹⁵⁄₁₆ FS] . . . Here the common mode voltage is at half FS, but it is not necessary for the common mode voltage of any of these pairs of signals to be at half FS. Other suitable common mode voltages are possible. The inputs would generally expose the weight of the bit under test to effectively isolate the bit under test. The predetermined input signals can be generated using a precise signal generator that can provide the plurality of voltages.

Accordingly, measuring a first bit weight error associated with the first bit capacitors and the first on-chip reservoir comprises sampling a first predetermined input using first circuitry for generating a first bit, and measuring a second bit weight error associated with the second bit capacitors and the second on-chip reservoir comprises sampling a second predetermined input using a second circuitry for generating a second bit, wherein the second predetermined input is different from the first predetermined input. This can repeat using further different predetermined inputs for the other bits.

Figure 9:
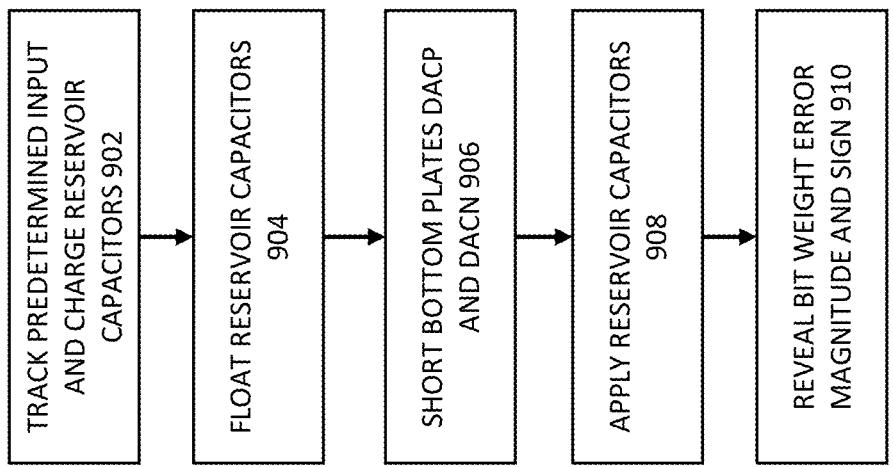
FIG. 9 shows a flow diagram illustrating a detailed method for measuring bit weight errors of a SAR ADC, according to some embodiments of the disclosure.

Furthermore, the technique enforces a switching sequence that emulates the switching sequence during a normal conversion process. FIG. 9 shows a flow diagram illustrating a detailed method for measuring bit weight errors of a SAR ADC, according to some embodiments of the disclosure. This means that when measuring the error associated with a particular bit under test, the technique applies a predetermined input voltage to the bottom plates of the bit caps which tracks the input, and at the same time, charges reservoir capacitors (box 902). The technique then floats the reservoir capacitors (box 904), and shorts the bottom plates of BitCapp's and BitCapn's (box 906).

The reservoir caps are applied into the system with the bit under test reservoir capacitor inserted right-side-up and all remaining reservoir caps applied upside-down (box 908). A measure of the difference between the top plate voltages topp and topn reveals the sign and magnitude that the bit under tests contribution to that error (box 910). After that measurement is taken the process is repeated again but this time with all of the reservoir capacitors reversed (box 908). A measure of the difference between the top plate voltages reveals the sign and magnitude of all the other bits that contribute to the error (box 910). Superposition applies in this SAR ADC therefore the difference of the two measurements reflects the total error and sign of that error for the bit under test. All bits-to-be-calibrated can be measured in this manner. In some embodiments, it is possible to utilize the conversion process in a closed loop manner to expose the effective weight of the bit under test by appropriately setting all the lower bits to complement the more significant bit. In such embodiments, the lower bits can "weight" the more significant bit.

To show further detail on the first exemplary technique and switching sequence thereof, FIGS. 10-23 illustrate a series of switching steps for measuring bit weight errors of an SAR ADC, according to some embodiments of the disclosure. For illustration, the figures show the state of switches for the MSB and the next lower bit MSB-1. It is envisioned that there can be more circuitry for other lower MSBs. Similar to FIG. 7, these figures show comparator 602 and sample switches 610a-b. The figures further shows bit caps, MSB BitCapp 1040, MSB BitCapn 1050, MSB-1 BitCapp 1060, and MSB-1 BitCapn 1070, and respective circuitries for generating a bit using those bit caps. The MSB circuitry has MSB reservoir cap 1080, and the MSB-1 circuitry has MSB-1 reservoir cap 1090. The circuitry for the MSB include precharge switches 1002a-b, input switches 1006a-b, right-side-up switches 1010a-b, upside-down switches 1012a-b, and shorting switch 1020. The circuitry for the MSB-1 include precharge switches 1004a-b, input switches 1008a-b, right-side-up switches 1014a-b, upside-down switches 1016a-b, and shorting switch 1030.

The switching sequence for measuring the bit weight error of one bit can have two phases, where a first phase inserts the reservoir cap of the bit under test one way, and second phase after the first phase inserts the reservoir cap of the bit under test the other way. FIGS. 10-16 illustrate the first phase, and FIGS. 17-23 illustrate the second phase.

Figure 10:
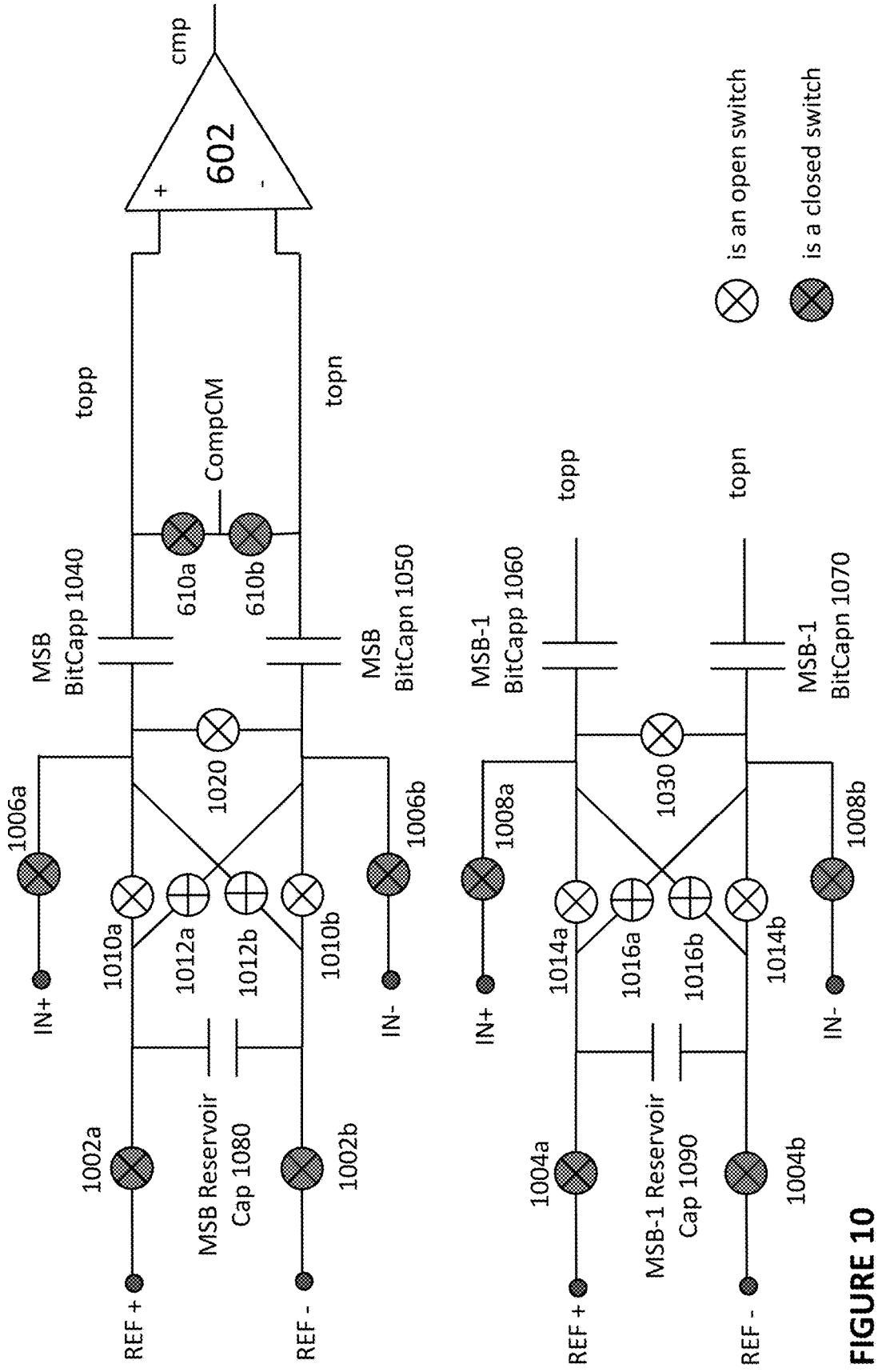

Referring to FIG. 10, the SAR ADC goes into an "acquisition and reservoir capacitor refresh" stage. In this stage, the reservoir capacitors (i.e., MSB reservoir cap 1080, MSB-1 reservoir cap 1090, etc.) are charged by means of closing precharge switches 1002a-b and 1004a-b (and other corresponding switches in the lower bits). At the same time period, the bit caps are tracking the input by means of closing sample switches 610a-b and input switches 1006a-b and 1008a-b. The state of these switches are the same for other lower bits.

Figure 11:
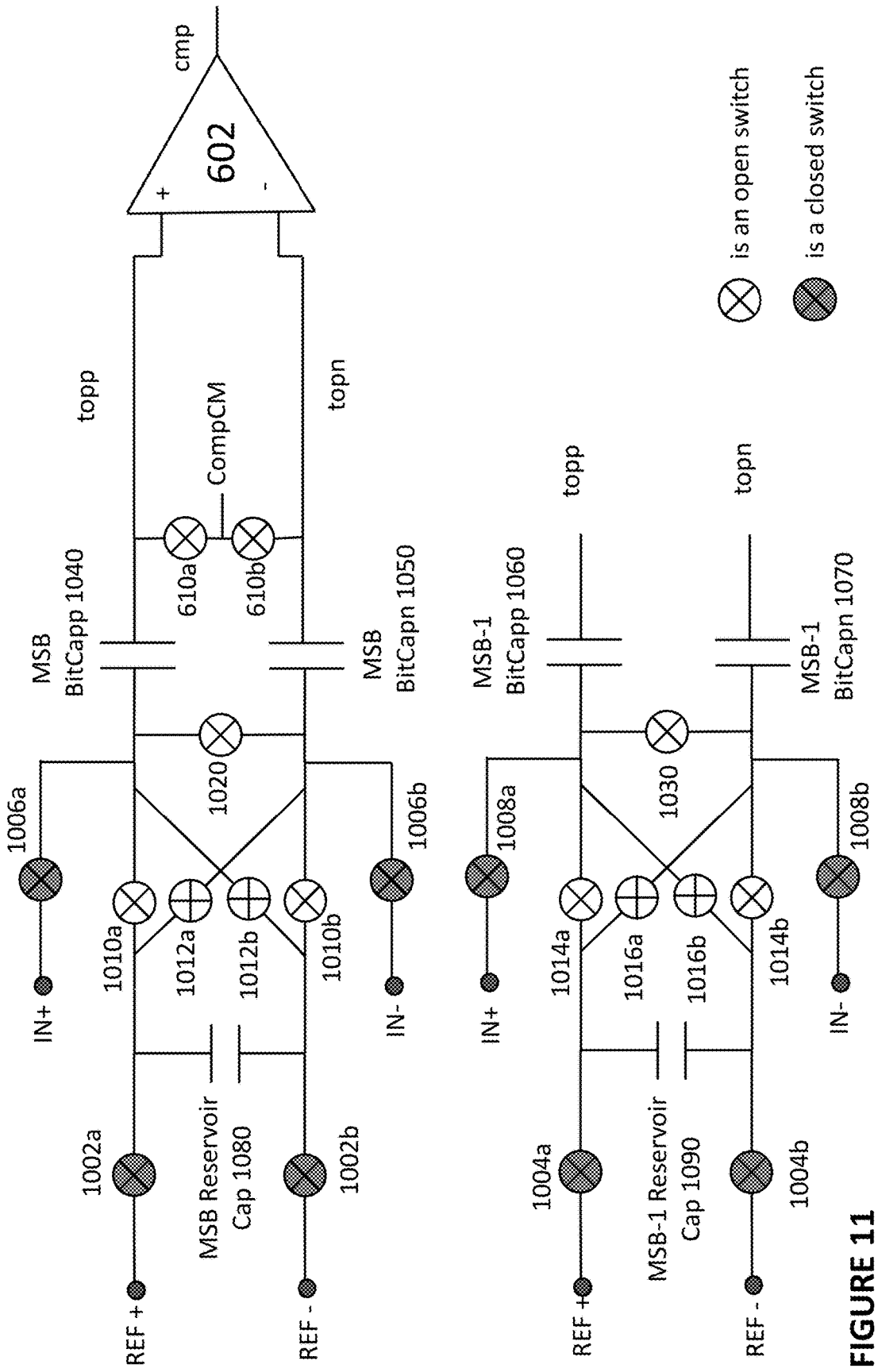

Referring to FIG. 11, the SAR ADC goes into "take the sample" stage. In this stage, the input voltage is sampled onto the bit caps, MSB BitCapp 1040, MSB BitCapn 1050, MSB-1 BitCapp 1060, MSB-1 BitCapn 1070, and so forth, by means of opening sample switches 610a-b.

Figure 12:
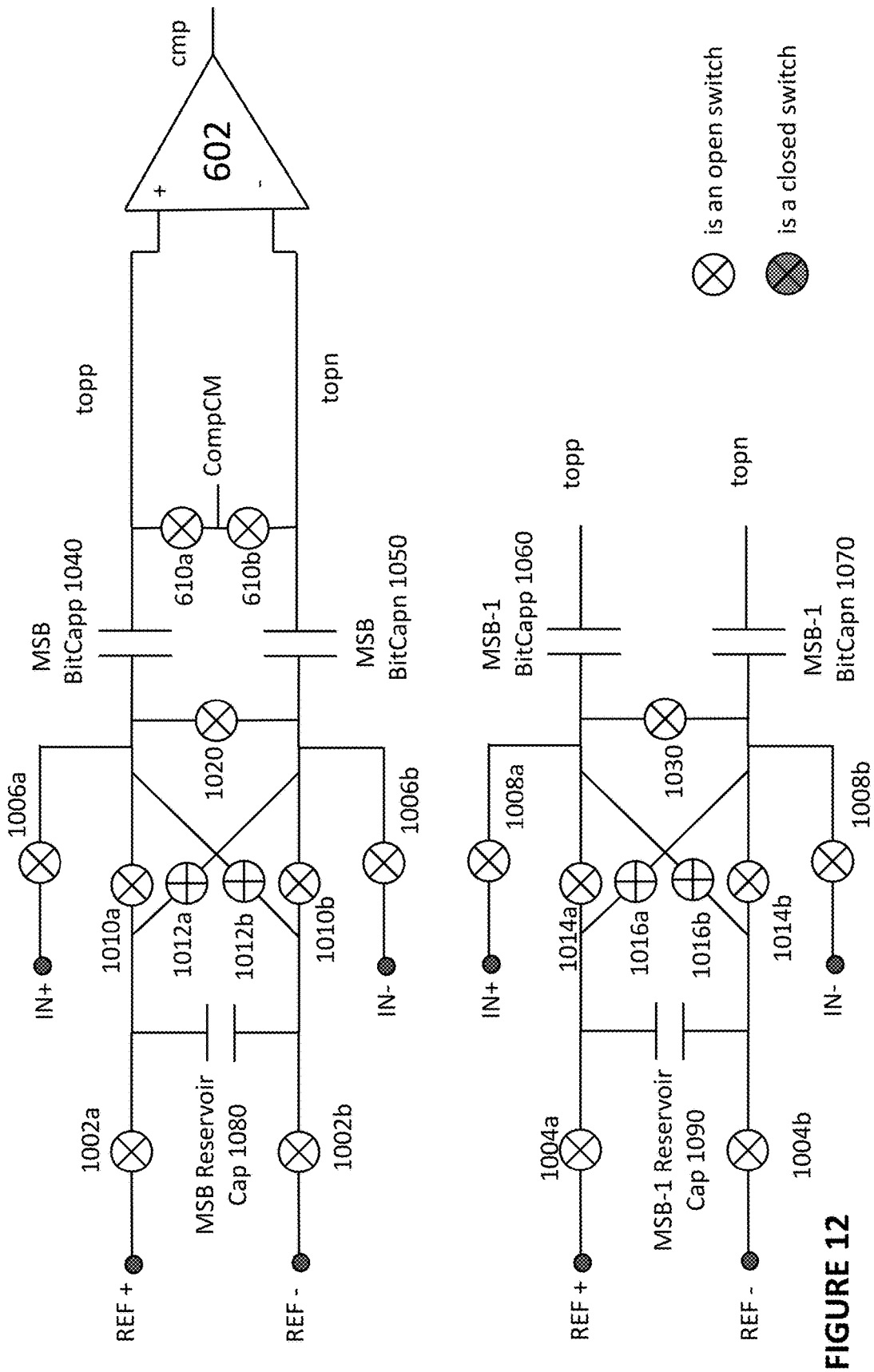

Referring to FIG. 12, the SAR ADC goes into "disconnect from the outside world" stage. In this stage, the reservoir caps, MSB BitCapp 1040, MSB BitCapn 1050, MSB-1 BitCapp 1060, MSB-1 BitCapn 1070, and so forth, are no longer connected to the (outside) reference REF+ and REF−, by means of opening the precharge switches 1002a-b and 1004a-b (and so on). The charge is trapped in the on-chip reservoir capacitors, and are said to be "floating", or the step is construed as "floating the reservoir capacitors".

Figure 13:
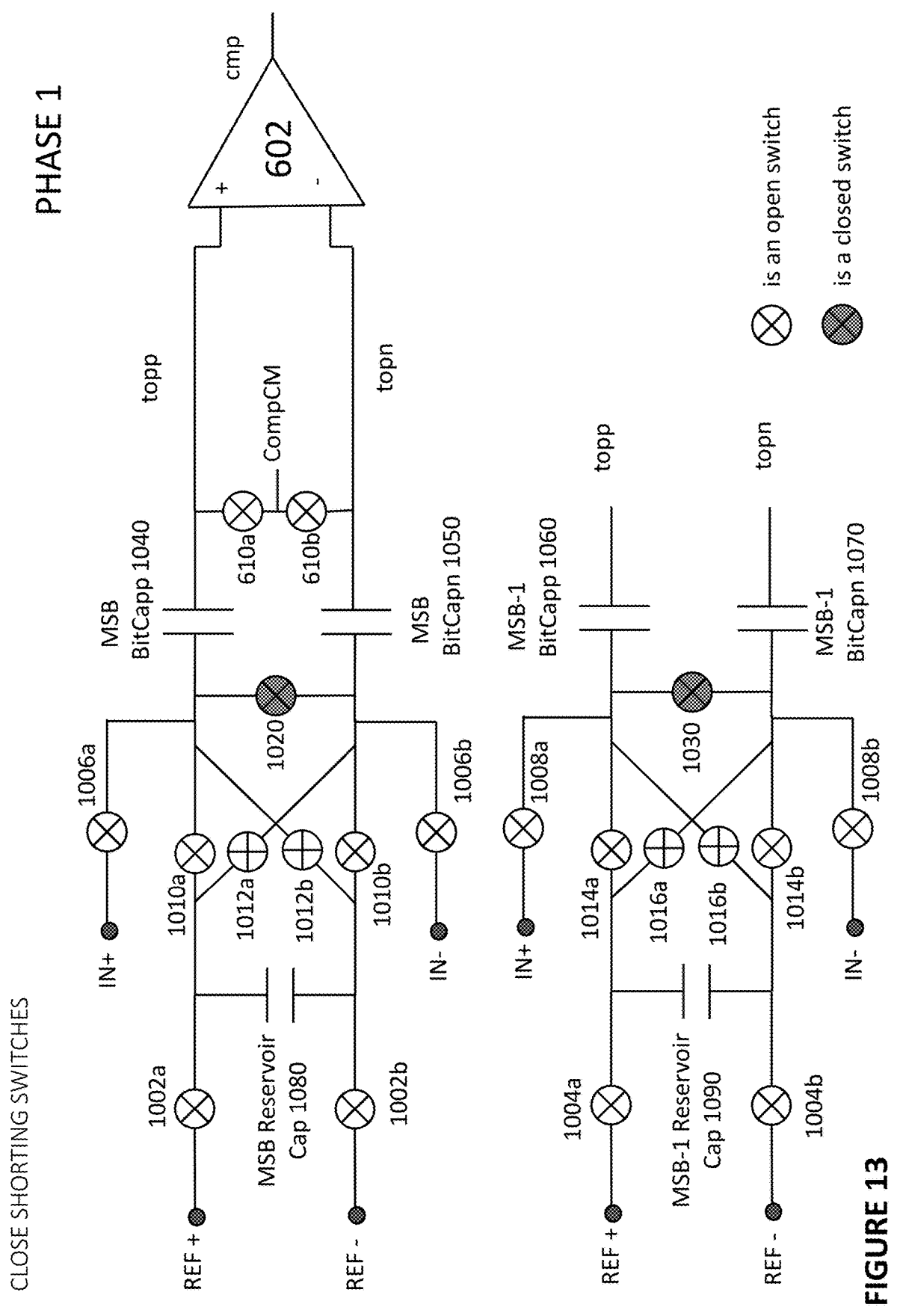

Referring to FIG. 13, the SAR ADC goes into "close shorting switches" stage. In this stage, the shorting switches 1020, 1030 (and so forth for the other shorting switches for the lower bits) are closed to transfer the sampled input voltage from the bottom plates of the bit caps to the top plate nodes (top and topn). After the shorting switches are closed, voltages of topp and topn move up and down.

Figure 14:
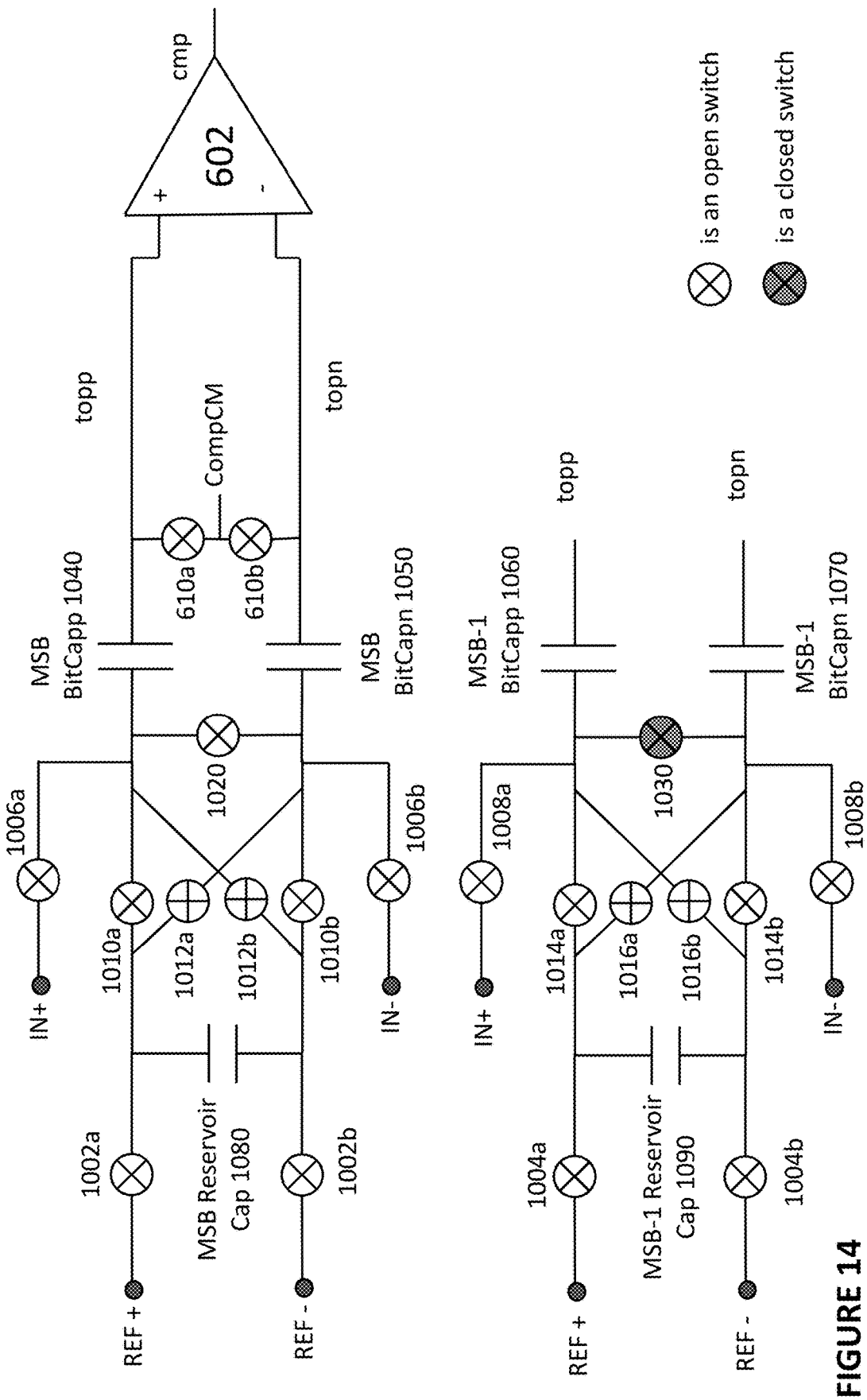

Referring to FIG. 14, the SAR ADC goes into "open the MSB shorting switch" stage. In this stage, the shorting switch of the bit under test is opened. Note that in a normal conversion process, when voltages of topp and topn moved when shorting switches closed, the output cmp of comparator 602 is used by a calibration sequencer to decide whether to insert the MSB reservoir cap 1080 right-side-up or upside-down. Before the MSB reservoir cap 1080 can be inserted, the shorting switch has to be opened first (otherwise the right-side-up switches or the upside-down switches being closed when the shorting switch is closed discharges the reservoir cap).

Figure 15:
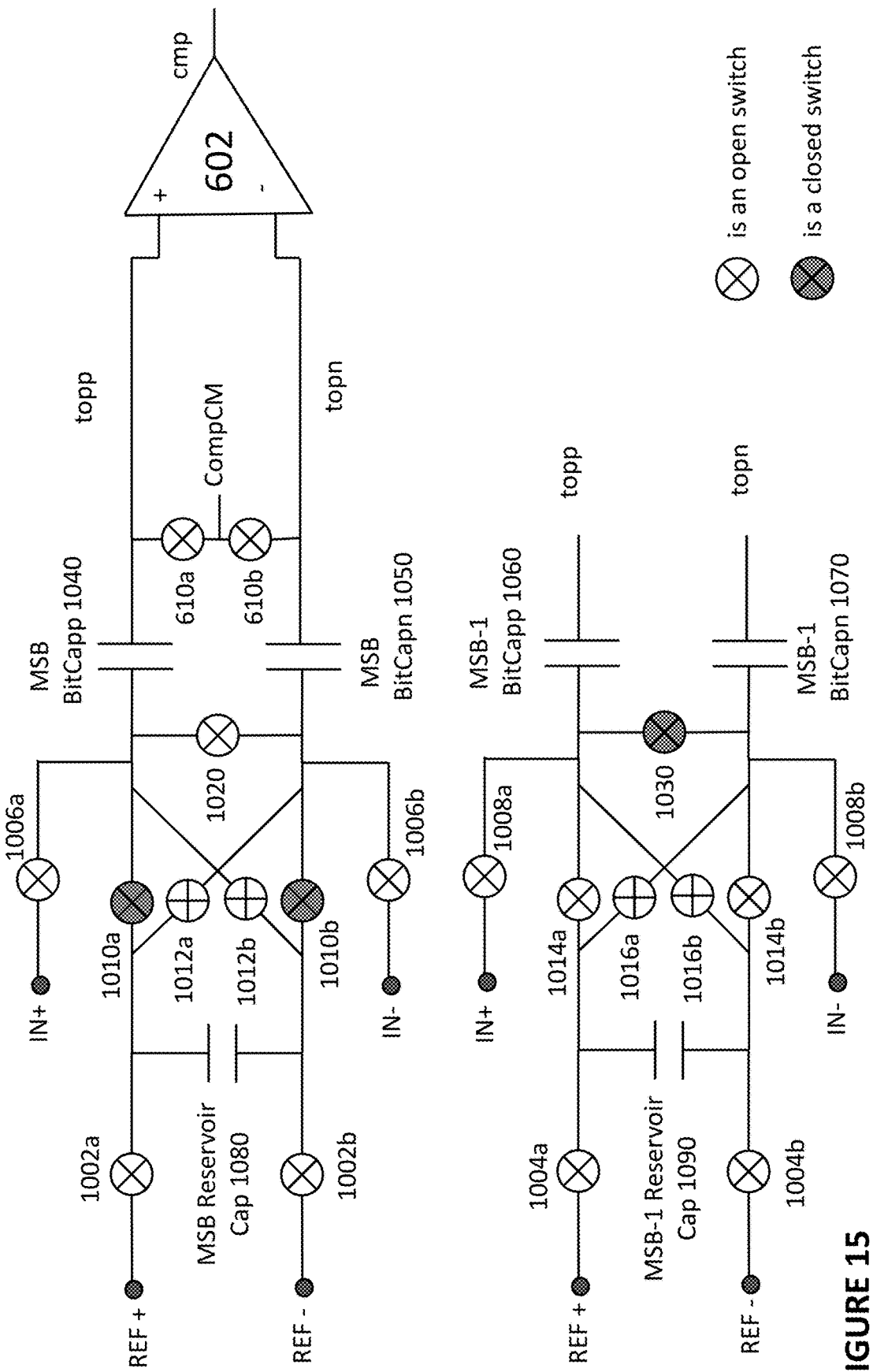

Referring to FIG. 15, the SAR ADC goes into "insert in the reservoir cap for bit under test" stage. For calibration, the output of the comparator and the conversion sequencer are ignored. The calibration sequencer inserts the MSB reservoir cap (or reservoir cap of the bit under test) one way, in this example, right-side-up (although it can be inserted upside-down instead).

Note that when a sample is taken, the top plate nodes top and topn move proportional to the input signal. During the conversion process, the sequencer tries to step by step to drive the top plate nodes back to CompCM. The resulting bit pattern (e.g., the output digital word) is a record of each bit trial driving the top plate nodes top and topn to converge. Depending on the comparator output cmp, the orientation of reservoir cap changes to move the top plates towards CompCM in response to the decision at the comparator output cmp.

Figure 16:
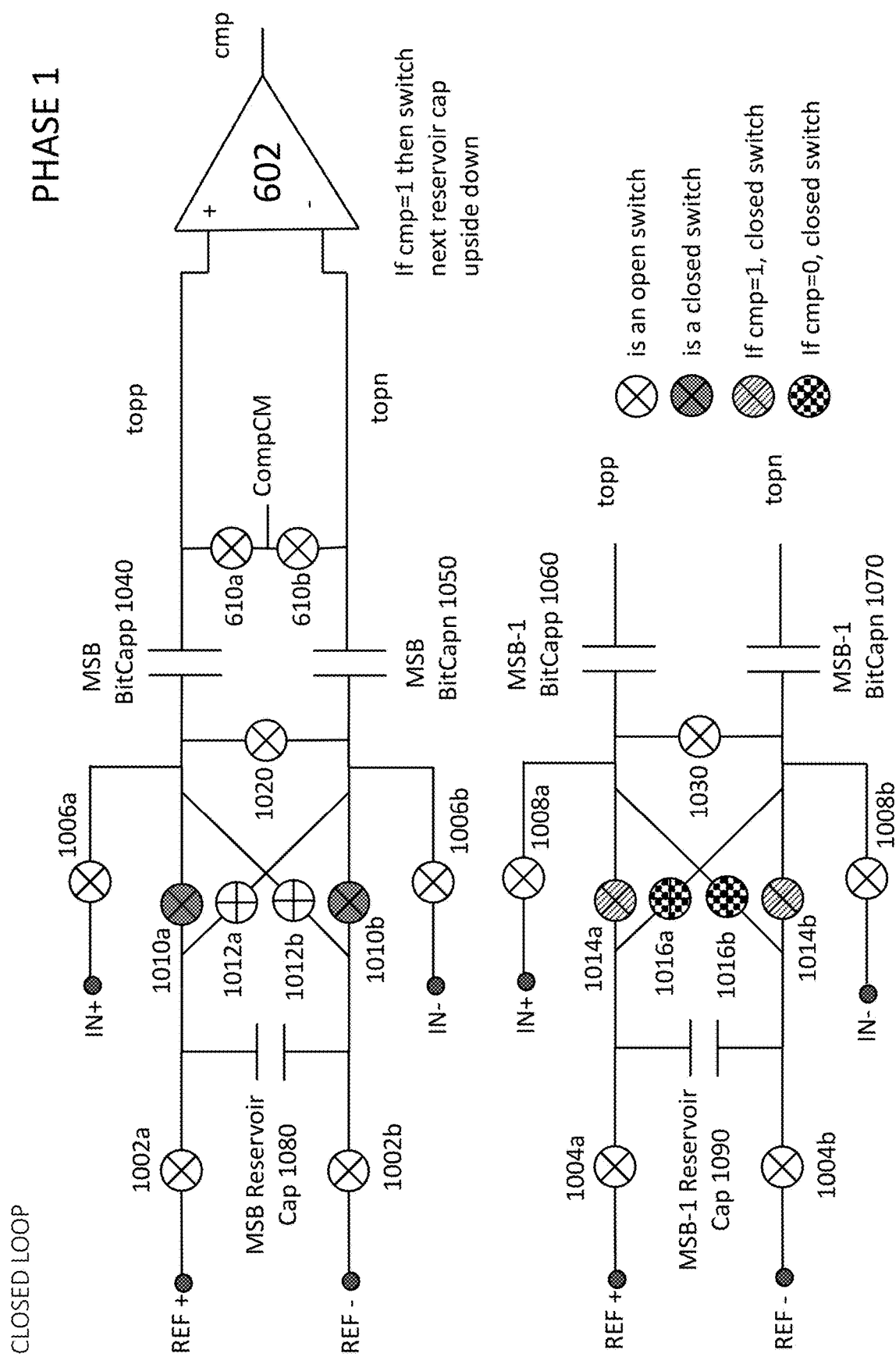

Referring back to FIG. 15, the calibration process inserts the reservoir cap right-side-up irrespective of the comparator decision (or upside-down if desired). Referring now to FIG. 16, when moving onto the "closed loop" stage, the bit switches of the MSB (or the bit under test) remains closed, and bit switches for the lower bits are selectively closed based on the output of the comparator, one bit at a time. For instance, if cmp=1, the next reservoir cap (e.g., MSB-1 reservoir cap 1090) is inserted right-side-up (by means of right-side-up switches 1014a-b), and if cmp=0, the next reservoir cap (e.g., MSB-1 reservoir cap 1090) is inserted upside-down (by means of upside-down switches 1016a-b).

Effectively, the comparator 602 and the calibration sequencer is attempting to balance out the weights of the lower bits with the weight of the MSB, where one at a time, the comparator 602 and the calibration sequencer opens up the shorting switch of the next bit and closes the bit switches to insert the reservoir cap of the next bit according to the comparator decision.

Figure 17:
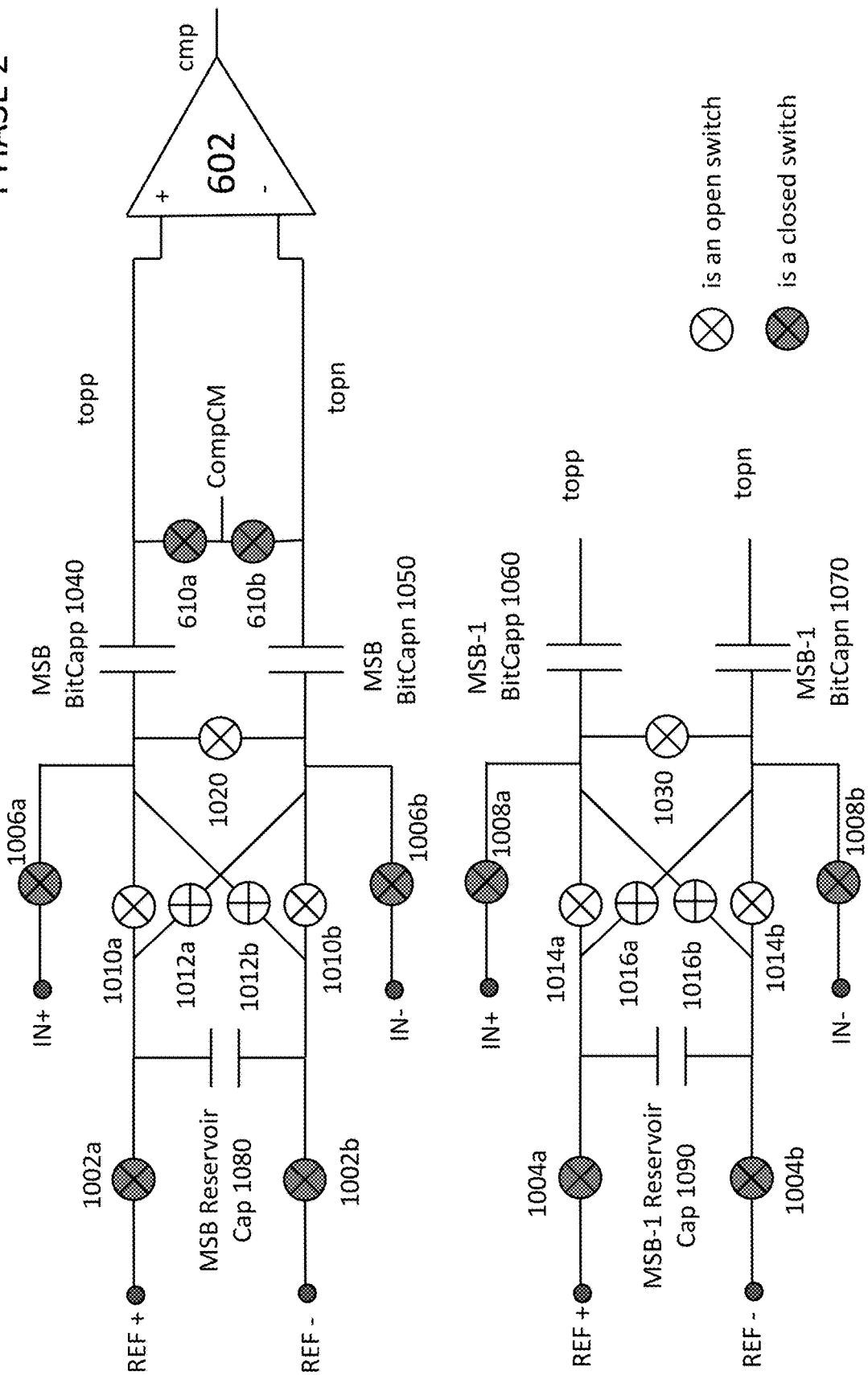
Figure 18:
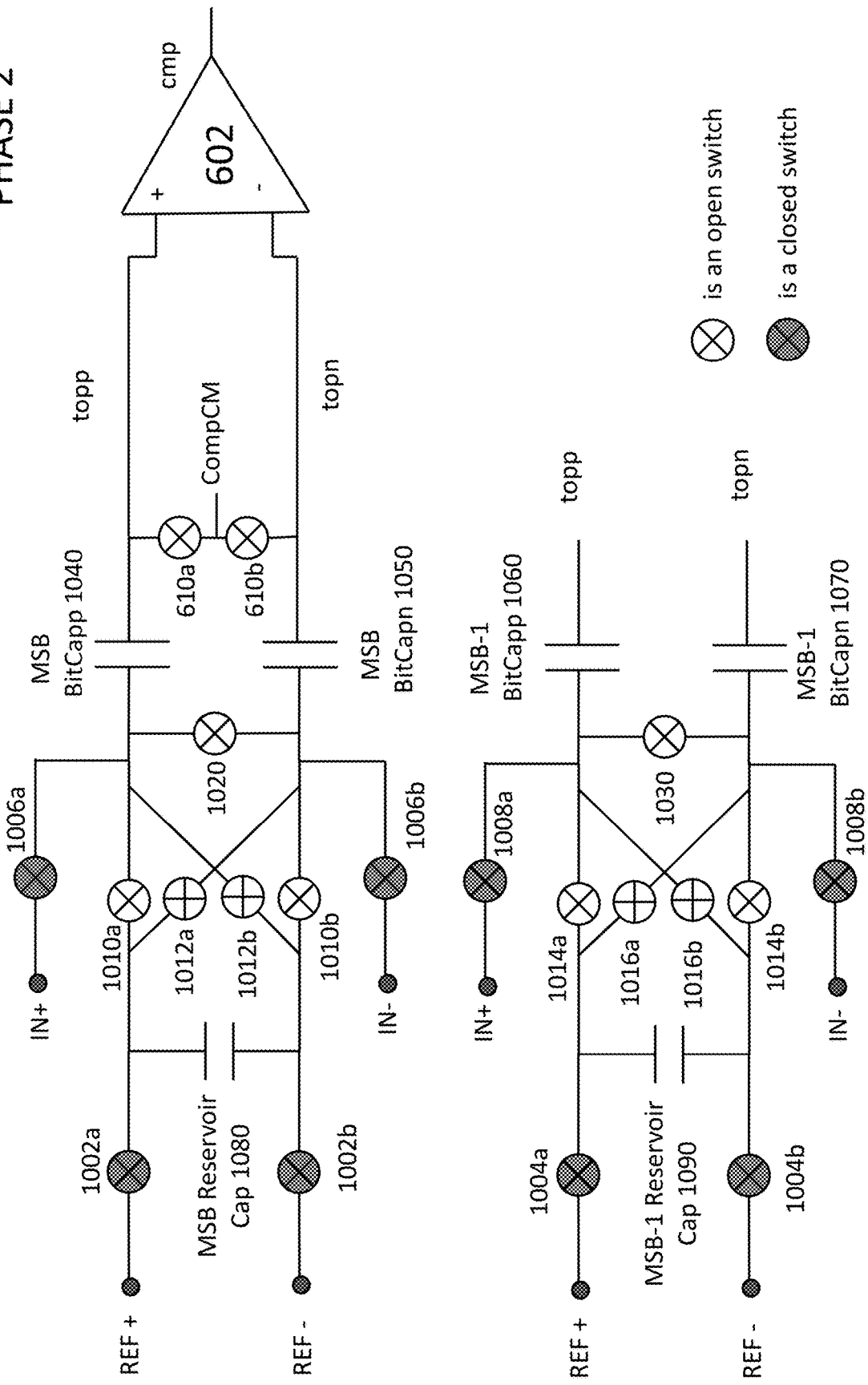
Figure 19:
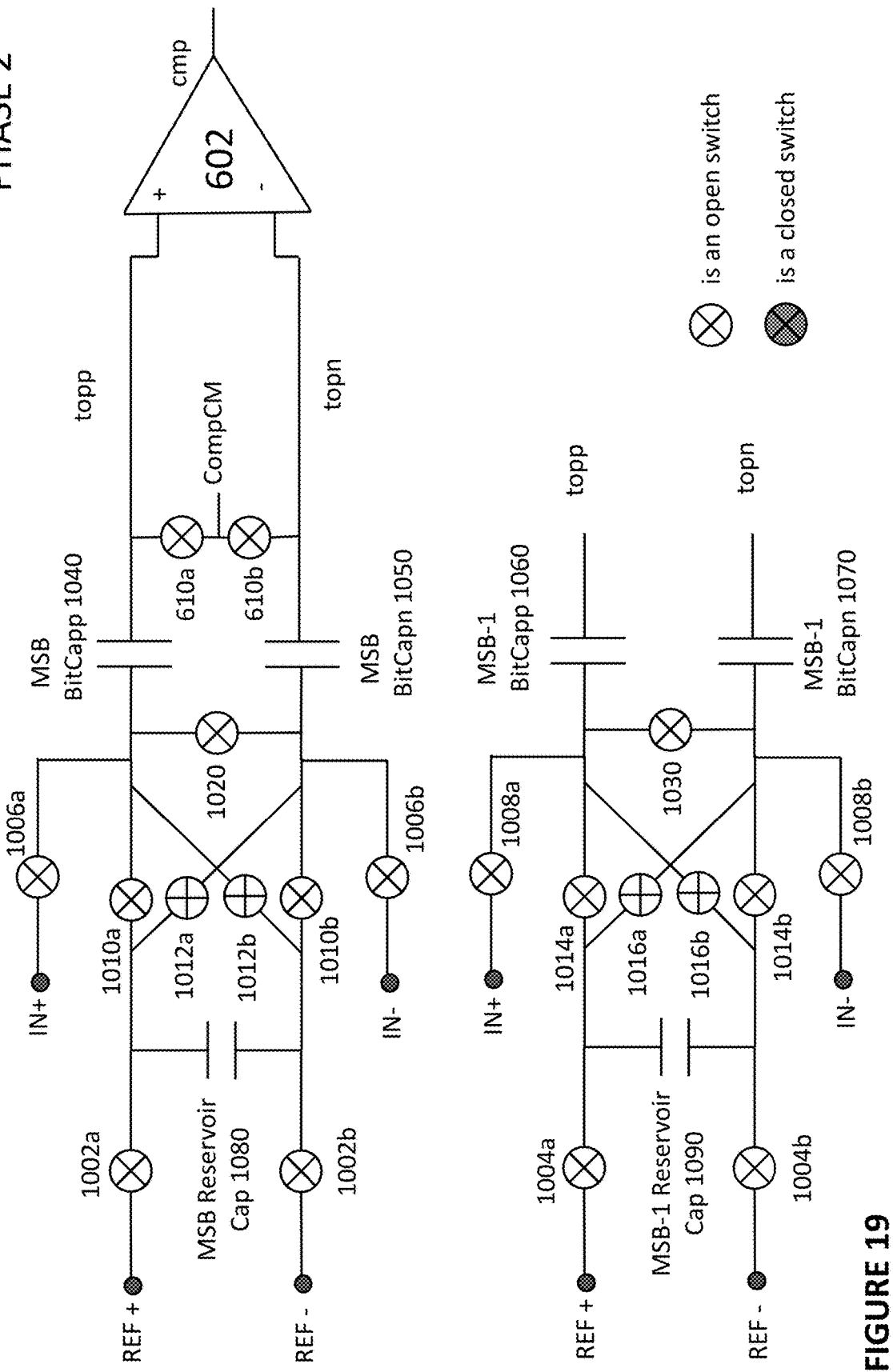
Figure 20:
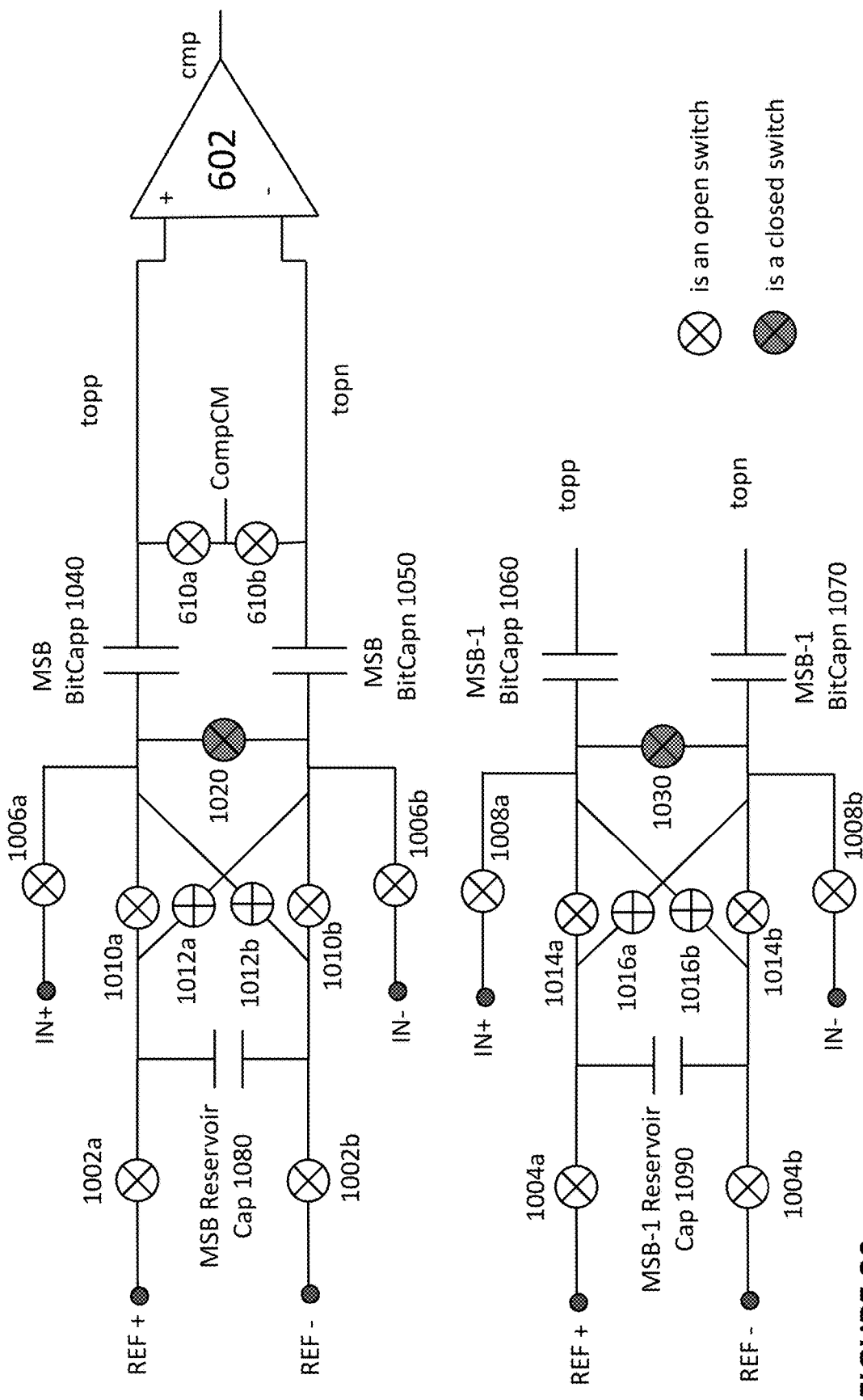
Figure 21:
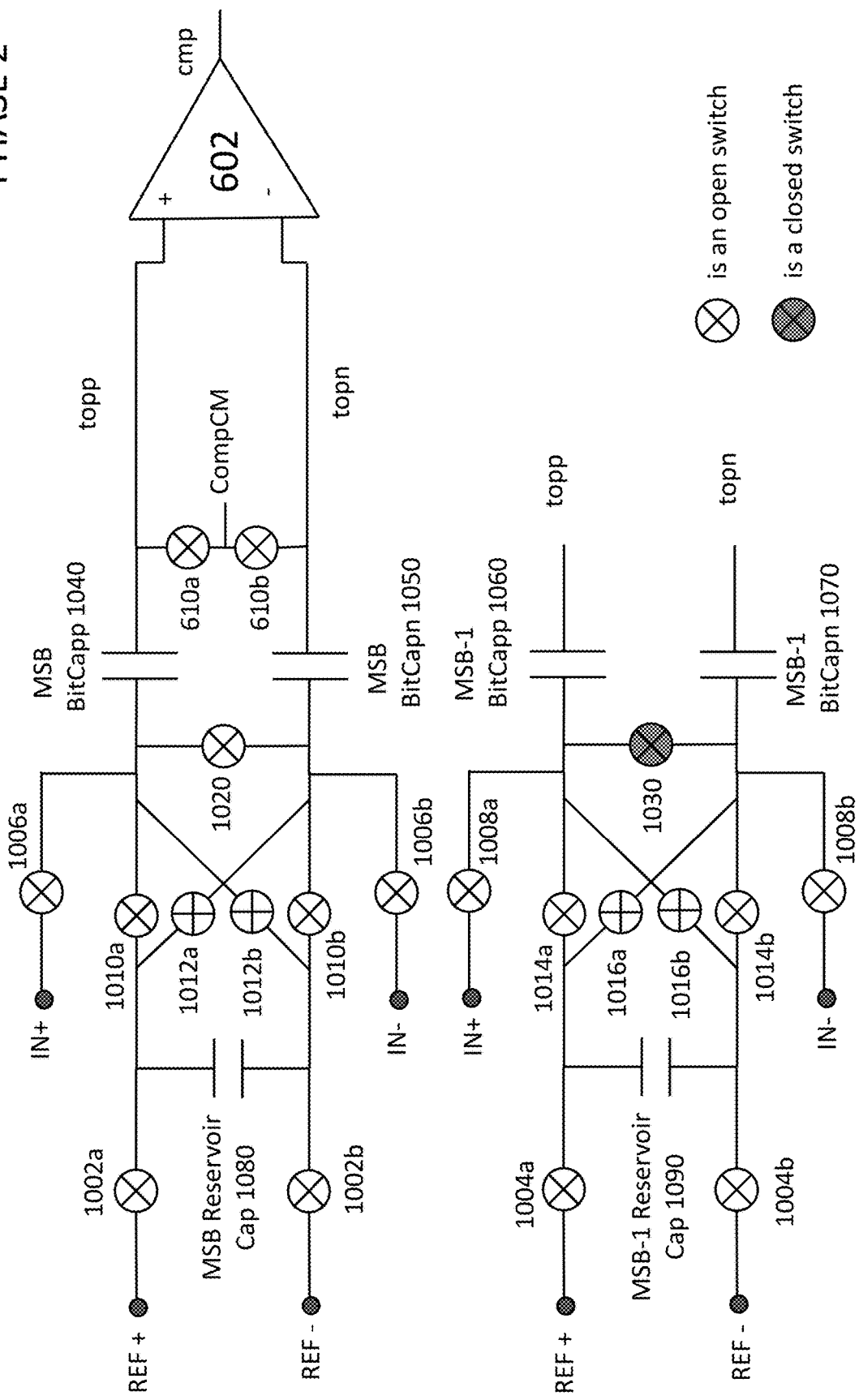

After the first phase is complete, the second phase takes the switching sequence back to the "acquisition and reservoir capacitor refresh" stage, as seen in FIG. 17. The switching in FIG. 17 is the same as FIG. 10. Then the switching sequence proceeds to the "take the sample" stage, as seen in FIG. 18. The switching in FIG. 18 is the same as FIG. 11. Then the switching sequence proceeds to the "disconnect from the outside world" stage, as seen in FIG. 19. The switching in FIG. 19 is the same as FIG. 12. Then the switching sequence proceeds to the "close shorting switches" stage, as seen in FIG. 20. The switching in FIG. 20 is the same as FIG. 13. Then the switching sequence proceeds to the "open the MSB shorting switch" stage (but leave low bits shorted), as seen in FIG. 21. The switching in FIG. 21 is the same as FIG. 14.

Figure 22:
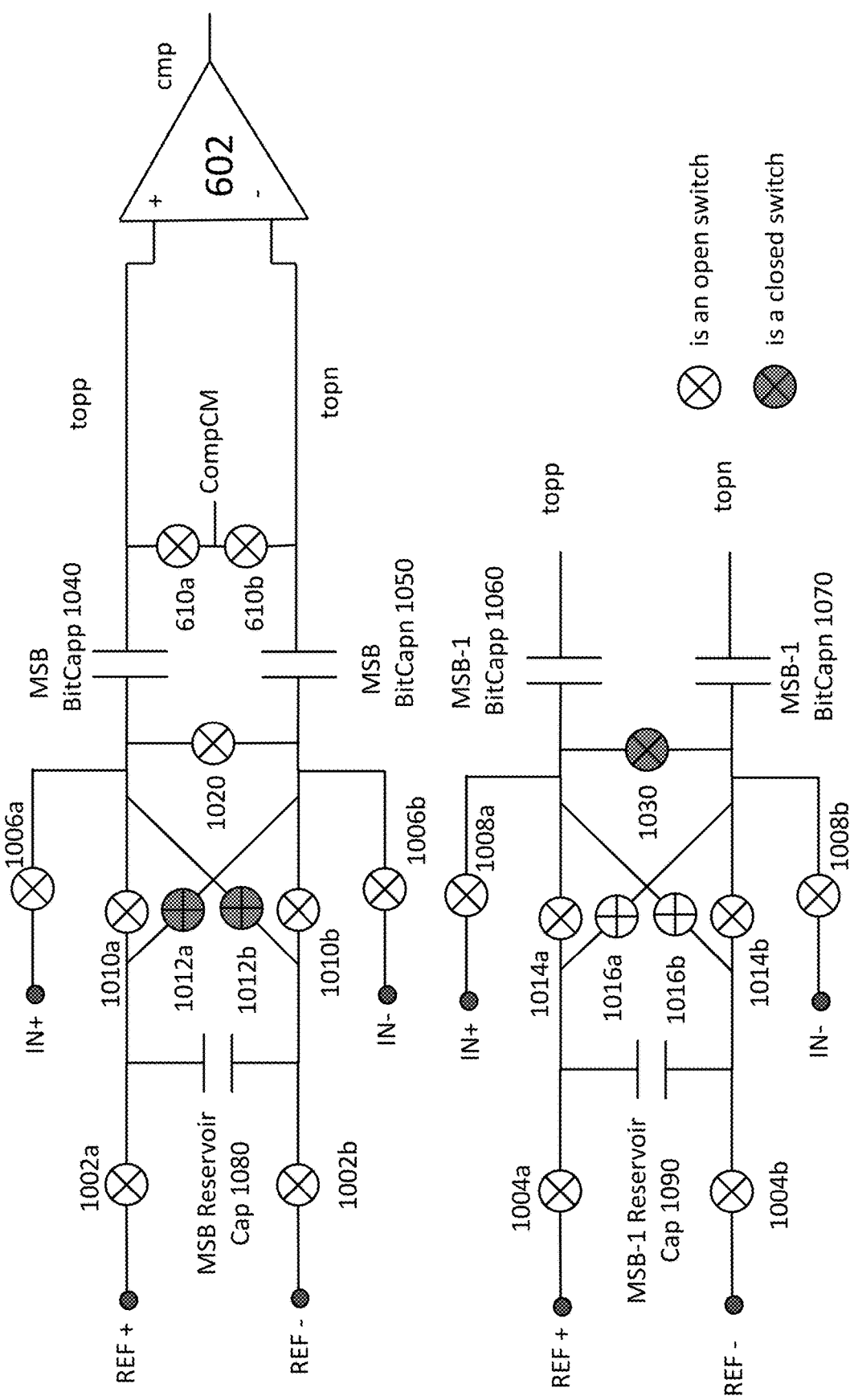

The second phase now performs switching at the "insert in the reservoir cap for bit under test" stage differently from the first phase, as seen in FIG. 22. In this stage, the reservoir cap of the MSB (or the bit under test) is inserted a different way (e.g., in this case upside-down), again ignoring the comparator output cmp.

Figure 23:
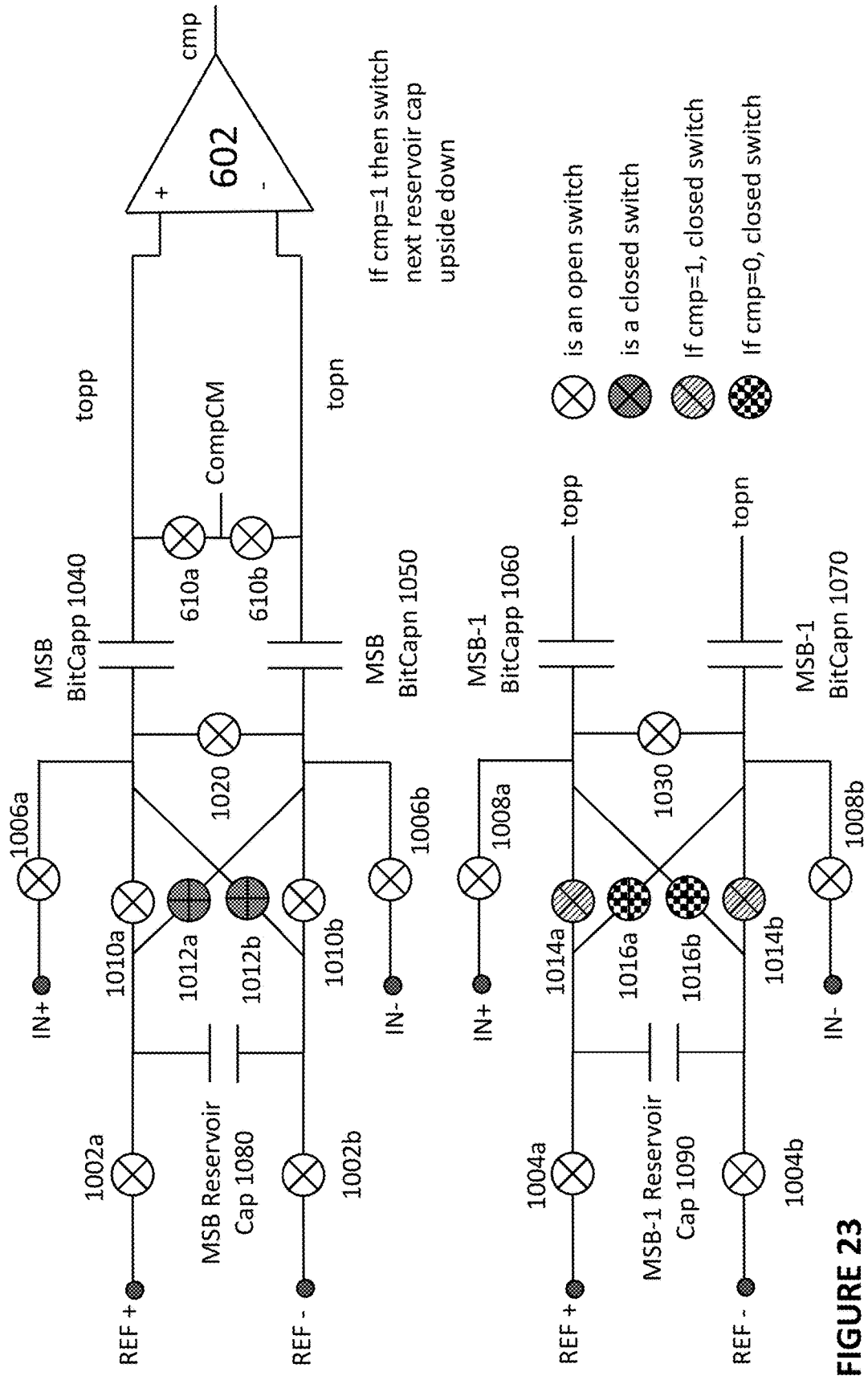

Referring now to FIG. 23, when moving onto the "closed loop" stage, the bit switches of the MSB (or the bit under test) remains closed, and bit switches for the lower bits are selectively closed based on the output of the comparator, one bit at a time. The switching sequence then proceeds with a closed loop series of bit trials where the reservoir caps of the lower bits underneath the bit under test are, one by one, each inserted according to the comparator decision (closed loop).

After performing the first phase and the second phase, the calibration sequencer can record two patterns of ones and zeros of how the reservoir caps are inserted (e.g., right-side-up or upside-down). The difference of the two patterns represents the actual or effective weight of the bit under test. Based on the effective weight, it is possible to generate a word that represents the error of the bit under test, or an error coefficient which can be used to compensate or correct for the error of the bit under test. This switching sequence can be performed for each bit for which the effective weight of the bit is to be measured.

A Second Exemplary Technique: Without Using a Plurality of Predetermined Inputs

One characteristic associated with the first technique for measuring the individual bit weight errors is the application of a plurality of specific input voltages to force the SAR ADC to expose all error sources associated each of the bits under test. This characteristic does not easily lend itself to a self-calibration of the errors in the SAR ADC. Of the plurality of voltages required by the first technique, the input voltage of $V_{REF}/2$ or half full scale used for testing the MSB was one that can be easy to generate. A second exemplary technique for measuring the bit weight errors is based on the premise that if somehow the system could be setup such that the bit under test appears as if it is the MSB of the array, then that bit under test be calibrated with $V_{REF}/2$ applied to the two inputs, or any suitable differentially zero inputs. One way to make a bit appear to be the MSB of the array is to ensure that all reservoir capacitors of the more significant bits are discharged (or made to deliver substantially no charge) and placed in the array just prior to exercising the bit under test for its error. A differentially zero input pair can be used because the charge of the bit(s) that are more significant than the bit under test is no longer making a contribution to the SAR ADC, and thus does not need to be cancelled out using a specific input voltage that matches up with the bit weight(s) of those more significant bits. Effectively, the varying impedance and topology of the system is the same as if the SAR ADC was performing a normal conversion, but the weight of the more significant bits are removed so that the predetermined input does not need to balance the weight of the more significant bits to expose the bit weight of the bit under test.

Figure 24:
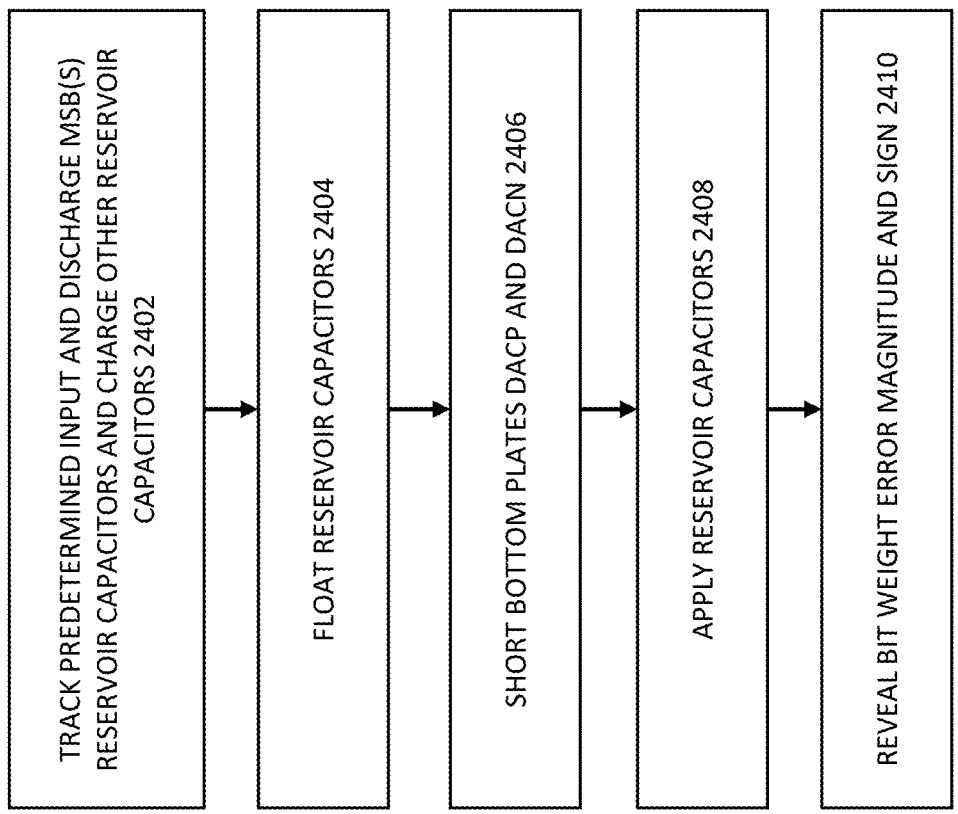
FIG. 24 shows a flow diagram illustrating another detailed method for measuring bit weight errors of a SAR ADC, according to some embodiments of the disclosure.

FIG. 24 shows a flow diagram illustrating another detailed method for measuring bit weight errors of a SAR ADC, according to some embodiments of the disclosure. At a high level, the second exemplary technique exposes the effective weights of the bits by forcing the SAR ADC to discharge the more significant reservoir caps but inserted in the same way during a normal conversion sequence. When measuring the error associated with any bit under test, the technique applies a predetermined input voltage to the bottom plates of the bit caps to track the input, and at the same time, charges reservoir capacitors of the lower bits but discharges all the more significant bits (box 2402). The technique then floats the reservoir capacitors (box 2404), and shorts the bottom plates of BitCapp's and BitCapn's (box 2406).

The reservoir caps are applied into the system with the bit under test reservoir capacitor inserted right-side-up and all remaining reservoir caps applied upside-down (box 2408). A measure of the difference between the top plate voltages topp and topn reveals the sign and magnitude that the bit under tests contribution to that error (box 2410). After that measurement is taken the process is repeated again but this time with all of the reservoir capacitors reversed (box 2408). A measure of the difference between the top plate voltages reveals the sign and magnitude of all the other bits that contribute to the error (box 2410). Superposition applies in this SAR ADC therefore the difference of the two measurements reflects the total error and sign of that error for the bit under test. All bits-to-be-calibrated can be measured in this manner. In some embodiments, it is possible to utilize the conversion process in a closed loop manner to expose the effective weight of the bit under test by appropriately setting all the lower bits to complement the more significant bit. In such embodiments, the lower bits can "weight" the more significant bit.

Considering a simplified method for measuring a first bit weight error of a first bit and a second bit weight error of a second bit, measuring the first bit weight error associated with the first bit capacitors and the first on-chip reservoir comprises sampling a first predetermined input using the first circuitry. Furthermore, measuring the second bit weight error associated with the second bit capacitors and the second on-chip reservoir comprises sampling a second predetermined input using the second circuitry, wherein the second predetermined input is the same of the first predetermined input. In some cases, the first predetermined input comprises a differential input signal and/or the second predetermined input comprises the same differential input signal. For instance, the first predetermined input is differentially zero, and the second predetermined input is differentially zero. One convenient differentially zero input usable for the first predetermined input and the second predetermined input is a pair of midscale voltages (e.g., ½ FS and ½ FS), but other suitable differentially zero input voltages can be used (e.g., any two voltages which are the same, or differentially zero).

Advantageously the calibration technique does not require a plurality of precisely generated voltages for the predetermined input. In some cases, the predetermined input can be generated on-chip, which makes the SAR ADC self-calibrating without requiring a series of predetermined inputs to get provided externally. To expose the effective bit weight of the second bit without using different input voltages, the technique involves discharging the first reservoir capacitor of the first circuitry (or configured to deliver no charge to the SAR ADC) before measuring the second bit weight error associated with the second bit capacitors and the second on-chip reservoir capacitor. To emulate the conversion process, the discharged reservoir capacitor continues to be inserted during the calibration process. Specifically, the first discharged reservoir capacitor is connected to the bottom plates of the first bit capacitors before and/or when measuring the second bit weight error associated with the second bit capacitors and the second on-chip reservoir capacitor.

FIGS. 25-30 illustrate a series of switching steps for measuring bit weight errors of a successive-approximation register analog-to-digital converter (SAR ADC), according to some embodiments of the disclosure. For illustration, the figures show the state of switches for the MSB and the next lower bit MSB-1. It is envisioned that there can be more circuitry for other lower MSBs. Furthermore, the figures show how MSB-1 can be measured without using an input voltage that is different from the one used for measuring the bit weight error of MSB. It is understood by one skilled in the art that the switching steps can be applied to measure the bit weight error of the lower bits as well. Similar to FIG. 7, these figures show comparator 602 and sample switches 610a-b. The figures further shows bit caps, MSB BitCapp 1040, MSB BitCapn 1050, MSB-1 BitCapp 1060, and MSB-1 BitCapn 1070, and respective circuitries for generating a bit using those bit caps. The MSB circuitry has MSB reservoir cap 1080, and the MSB-1 circuitry has MSB-1 reservoir cap 1090. The circuitry for the MSB include precharge switches 1002a-b, input switches 1006a-b, right-side-up switches 1010a-b, upside-down switches 1012a-b, and shorting switch 1020. The circuitry for the MSB-1 include precharge switches 1004a-b, input switches 1008a-b, right-side-up switches 1014a-b, upside-down switches 1016a-b, and shorting switch 1030.

The switching sequence for measuring the bit weight error of one bit can have two phases, where a first phase inserts the reservoir cap of the bit under test one way, and second phase after the first phase inserts the reservoir cap of the bit under test the other way. FIGS. 25-30 illustrate some switching of the first phase.

Figure 25:
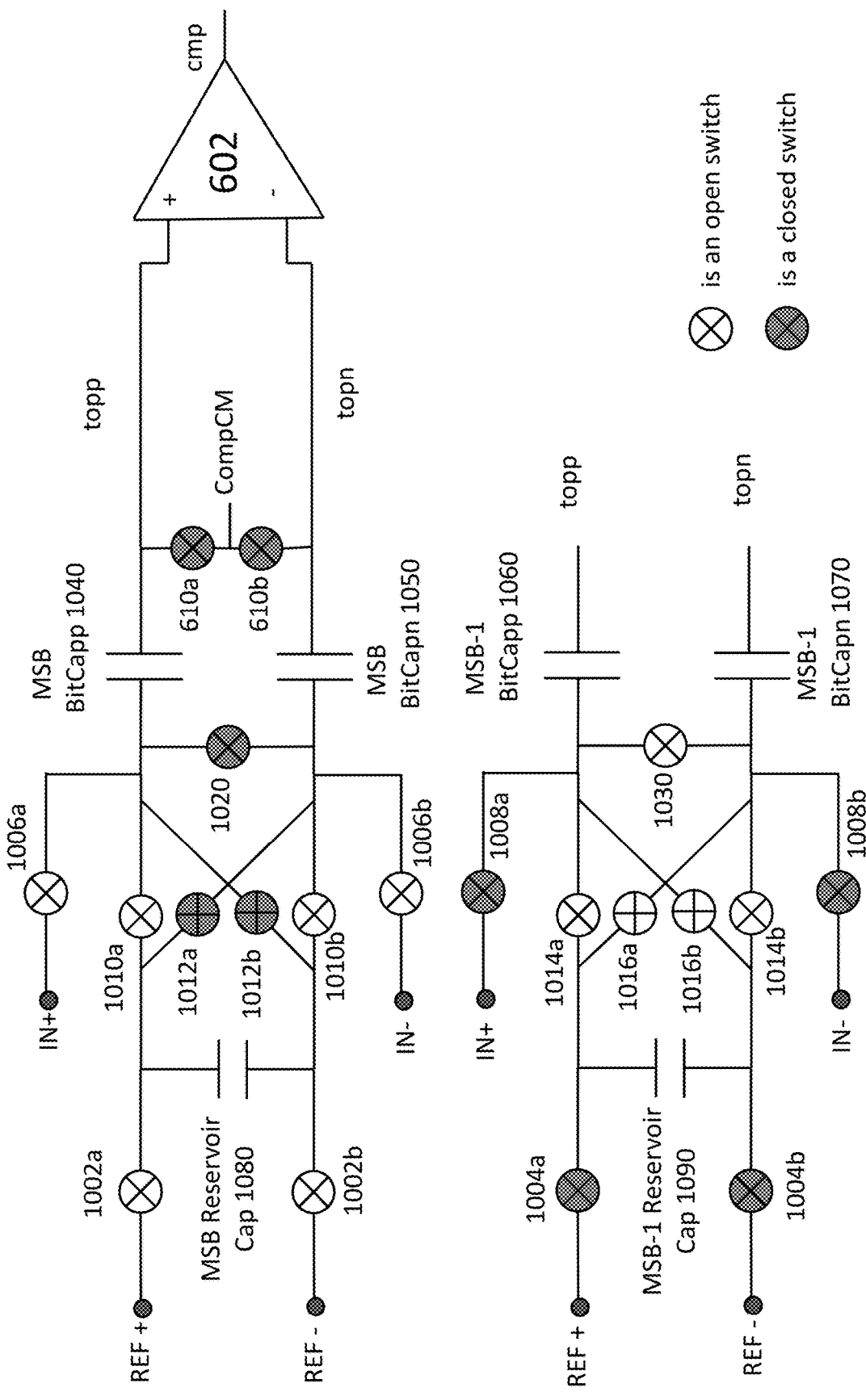
FIGS. 25-30 illustrate a series of switching steps for measuring bit weight errors of a successive-approximation register analog-to-digital converter (SAR ADC), according to some embodiments of the disclosure.

Referring to FIG. 25, the SAR ADC goes into an "acquisition and reservoir capacitor refresh but discharge MSB reservoir cap" stage. In this stage, instead of the charging the acquisition and reservoir refresh of the first technique, this second technique discharges all of the reservoir cap(s) of the more significant bit(s) (e.g., bits which were previously under test, bits that are higher than the bit under test). Specifically, in this example, because MSB-1 is the bit under test, the MSB reservoir capacitor 1080 is discharged by keeping the upside-down switches 1012a closed and closing the shorting switch 1020. Note that the upside-down switches 1012a-b were closed at the end of measuring the bit weight error of the MSB. While it is possible to discharge the MSB reservoir capacitor 1080 by closing the right-side-up switches 1010a-b, by simply keeping the upside-down switches 1012a closed reduces the amount of switching (and thereby reduces power consumption and complexity). If the right-side-up switches 1010a-b were the bit switches that were closed at the end of measuring the bit weight error of the MSB, then this stage can alternatively keep the right-side-up switches 1010a-b closed and close the shorting switch to discharge the MSB reservoir cap 1080. The reservoir capacitors (i.e., MSB-1 reservoir cap 1090, and any reservoir cap below MSB-1) are charged by means of closing precharge switches 1002a-b and 1004a-b and other corresponding switches in the lower bits. At the same time period, the bit caps are tracking the input by means of closing sample switches 610a-b and input switches 1008a-b (and corresponding switches in the lower bits).

In an alternative embodiment, rather than discharging the reservoir cap(s) of the more significant bit(s), the reservoir capacitor(s) of the more significant bit(s) can be configured such that the reservoir capacitor(s) of the more significant bit(s) delivers no charge to the bit capacitors of those more significant bit(s). For instance, each of the reservoir capacitor(s) of the more significant bit(s) can be "split into two halves", and insert the two halves in opposition, so they effectively cancel. Switches can be configured to connect one half right-side-up, the other half upside-down. Note that a reservoir capacitor are usually made up of many smaller capacitors, and for this reason, the reservoir capacitor can be split into two sets of smaller capacitors. When the two sets of smaller capacitors are inserted in with opposite orientations, substantially no charge is delivered from the reservoir capacitor to the bit caps, thereby effectively removing the weight of the more significant bits to make the bit under test appear as the most significant bit.

Figure 26:
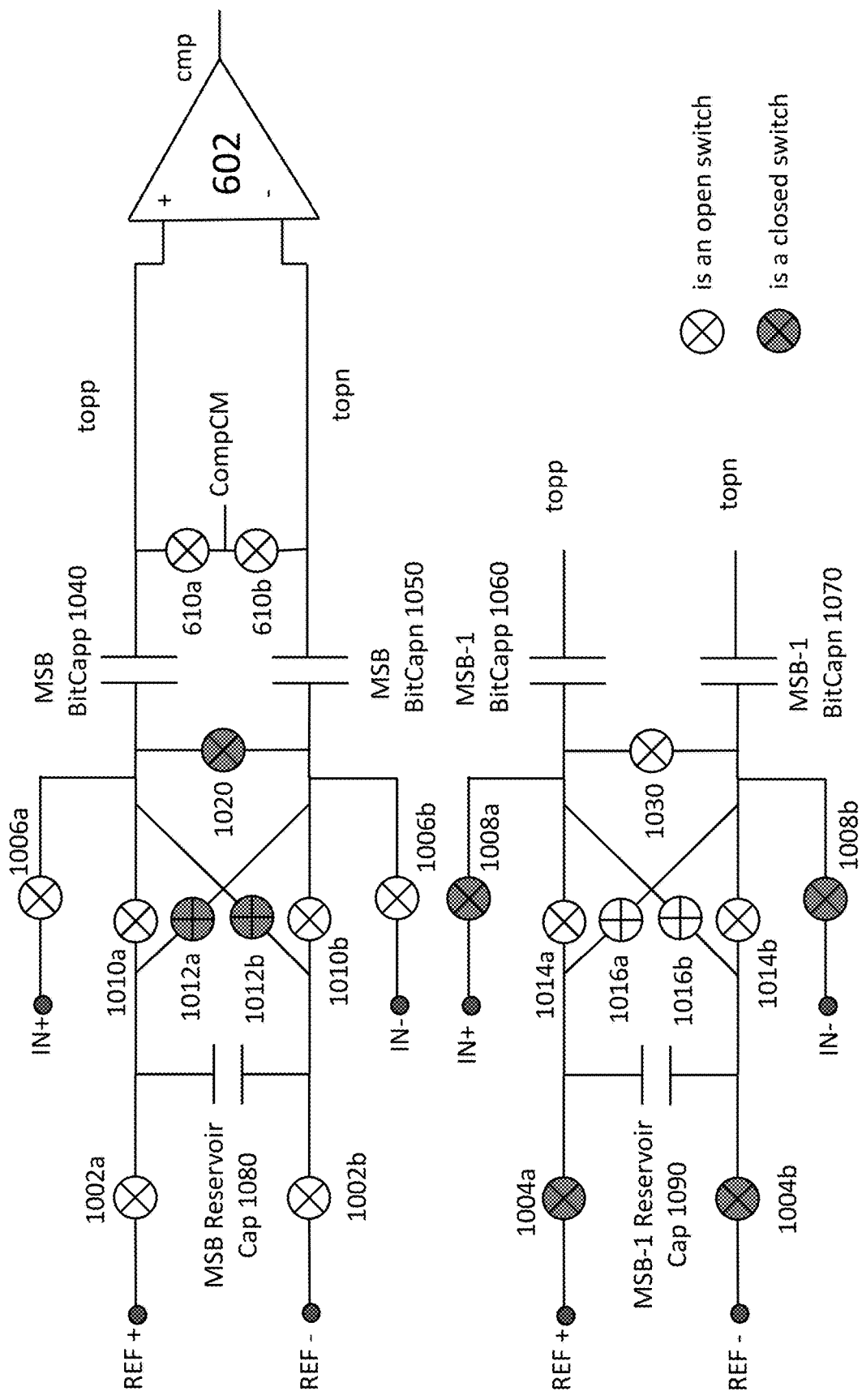

Referring to FIG. 26, the SAR ADC goes into "take the sample" stage. In this stage, the input voltage is sampled onto the bit caps, MSB BitCapp 1040, MSB BitCapn 1050, MSB-1 BitCapp 1060, MSB-1 BitCapn 1070, and so forth, by means of opening sample switches 610a-b.

Figure 27:
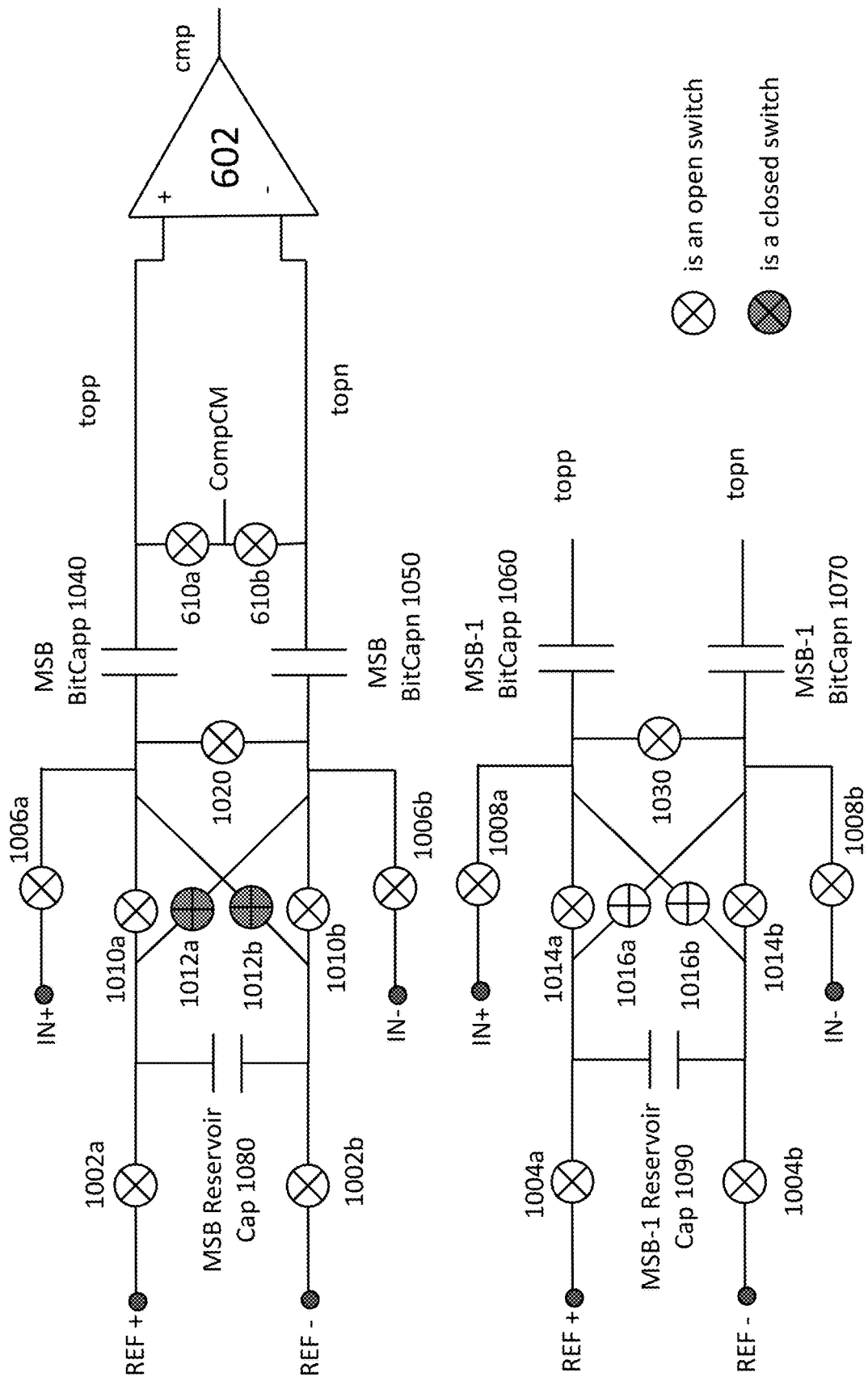

Referring to FIG. 27, the SAR ADC goes into "disconnect from the outside world" stage. In this stage, the reservoir caps ((discharged) MSB reservoir cap 1080, MSB-1 reservoir cap 1090), MSB BitCapp 1040, MSB BitCapp 1060, MSB-1 BitCapp 1060, MSB-1 BitCapn 1070, and so forth, are no longer connected to the (outside) reference REF+ and REF−, by means of opening the precharge switches 1002a-b and 1004a-b (and so on). The charge is trapped in the on-chip reservoir capacitors (in this example, the MSB-1 reservoir cap 1090), and are said to be "floating", or the step is construed as "floating the reservoir capacitors". During this stage, the discharged reservoir cap remains inserted, and the shorting switch 1020 is opened. Effectively, the discharged MSB reservoir cap 1080 is connected to the bottom plates of MSB BitCapp 1040 and MSB BitCapn 1050. There is no charge available on the bottom plates to denote whether to keep the bit or throw away the bit. But the discharge reservoir capacitor sits between the two bit caps, the impedance looking back towards the bottom plate looks proper to get the right error word. When a discharged reservoir cap remains inserted when measuring the bit weight error of MSB-1, MSB-1 behaves as if it is the MSB of the array and present all the right errors to the array without having to use specially generated voltages.

Figure 28:
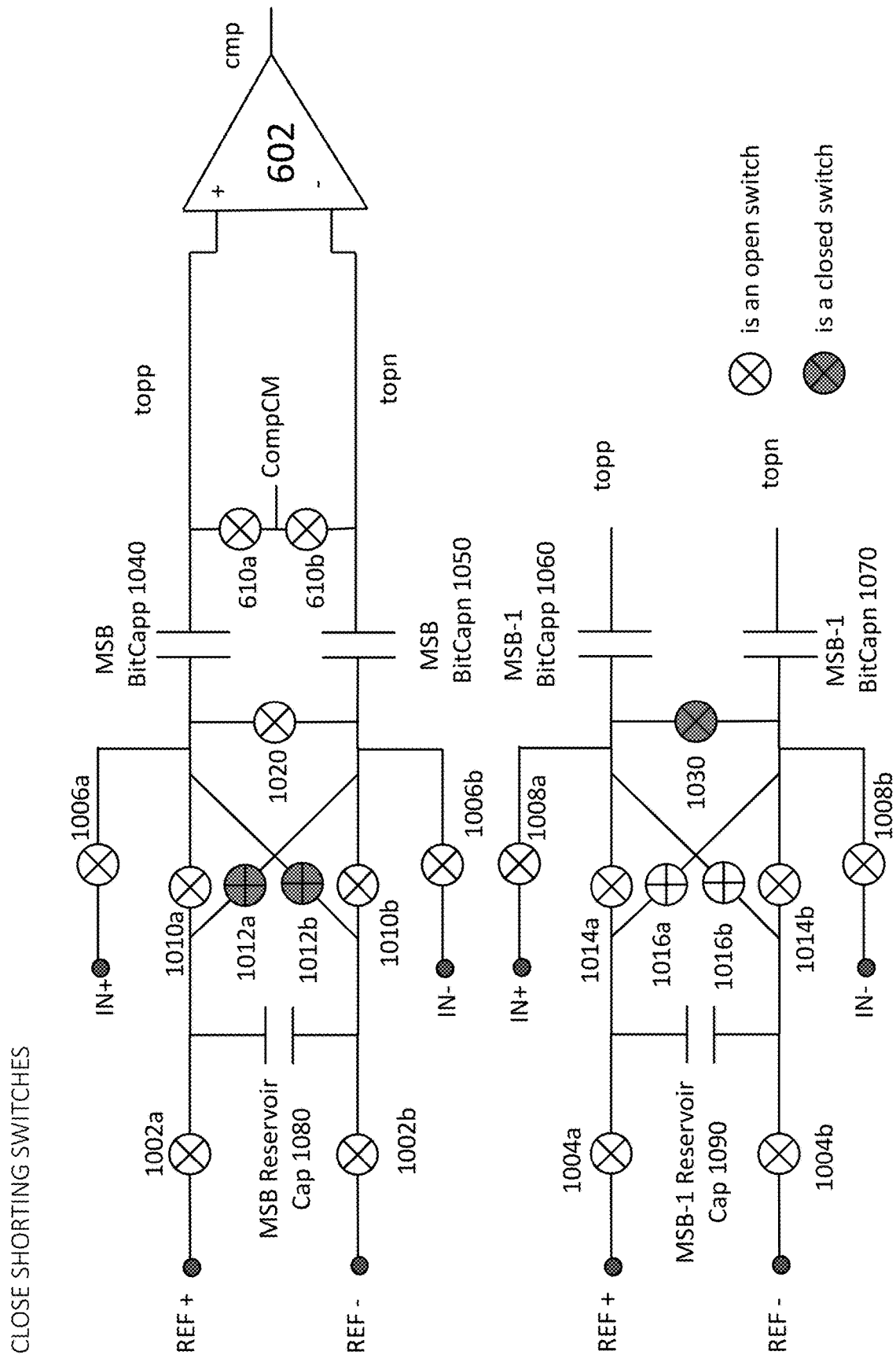

Referring to FIG. 28, the SAR ADC goes into "close shorting switches" stage. In this stage, the shorting switch 1030 (and so forth for the other shorting switches for the lower bits) are closed to transfer the sampled input voltage from the bottom plates of the bit caps to the top plate nodes (top and topn). After the shorting switch(es) are closed, voltages of topp and topn move up and down.

Figure 29:
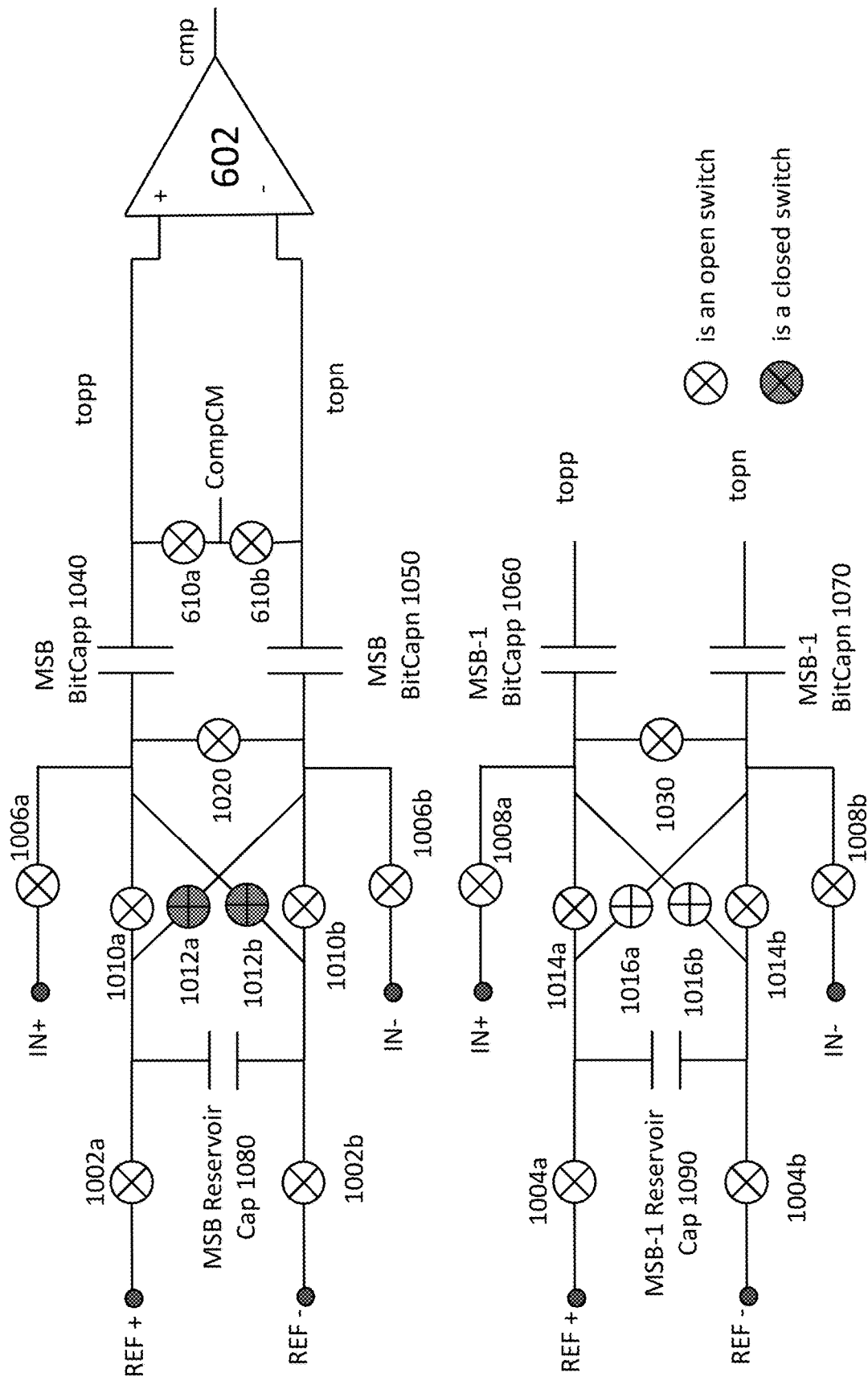

Referring to FIG. 29, the SAR ADC goes into "open the MSB-1 shorting switch" stage. In this stage, the shorting switch of the bit under test is opened. Note that in a normal conversion process, when voltages of topp and topn moved when shorting switches closed, the output cmp of comparator 602 is used by a calibration sequencer to decide whether to insert the MSB-1 reservoir cap 1090 right-side-up or upside-down. Before the MSB-1 reservoir cap 1090 can be inserted, the shorting switch has to be opened first (otherwise the right-side-up switches or the upside-down switches being closed when the shorting switch is closed discharges the reservoir cap). Note the MSB reservoir cap 1080 remains inserted and connected to the bottom plates of MSB BitCapp 1040 and MSB BitCapn 1050.

Figure 30:
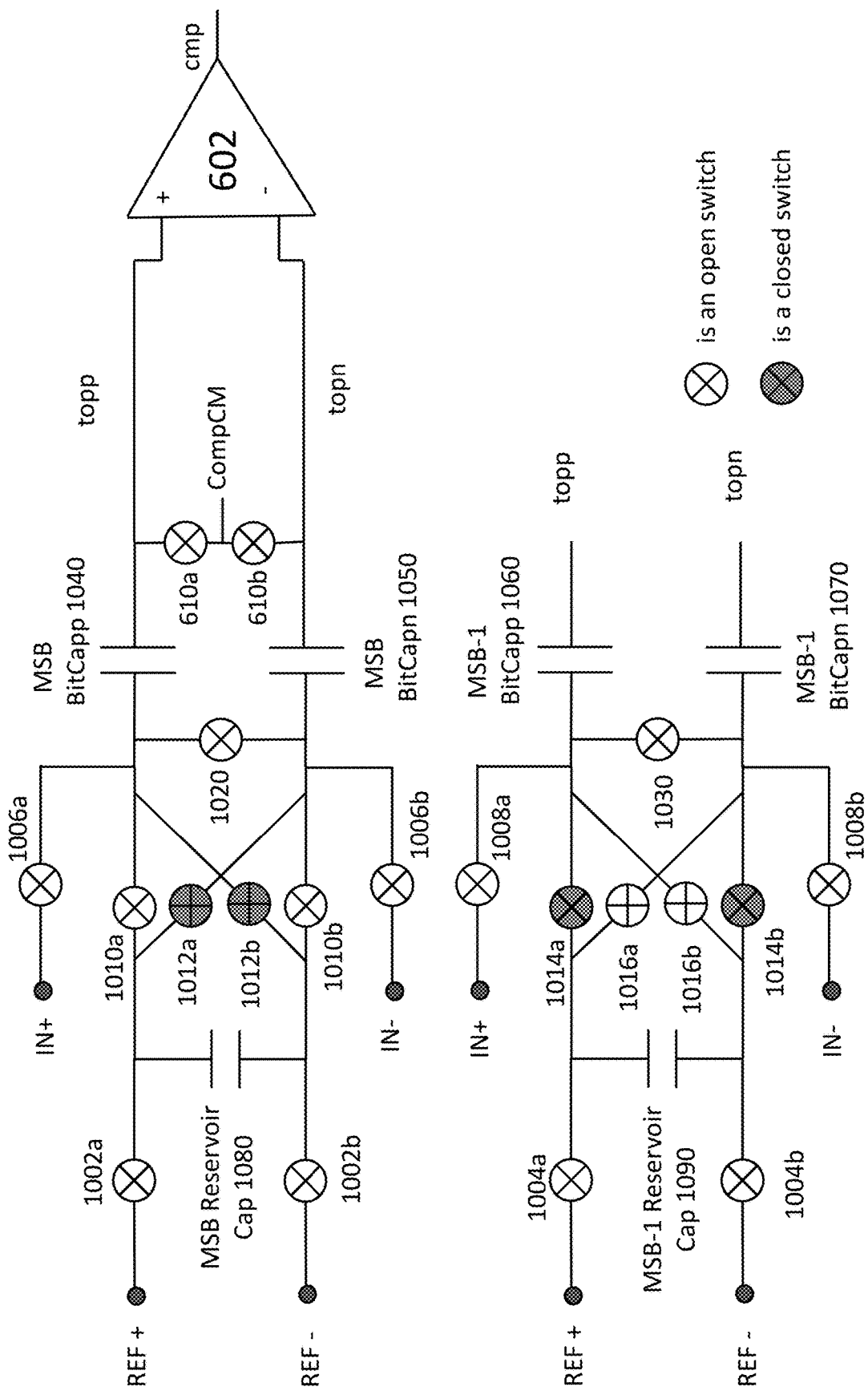

Referring to FIG. 30, the SAR ADC goes into "insert in the reservoir cap for bit under test" stage. For calibration, the output of the comparator and the conversion sequencer are ignored. The calibration sequencer inserts the MSB-1 reservoir cap 1090 (or reservoir cap of the bit under test) one way, in this example, right-side-up (although it can be inserted upside-down instead).

The calibration technique continues on by inserting the reservoir caps of the lower bits according to the output of the comparator for close loop operation, and then returns to perform the second phase while keeping the MSB reservoir cap 1080 discharged and inserted to measure the bit weight error and the MSB-1 reservoir cap 1090 inserted upside-down.

After performing the first phase and the second phase, the calibration sequencer can record two patterns of ones and zeros of how the reservoir caps are inserted (e.g., right-side-up or upside-down). The difference of the two patterns represents the actual or effective weight of the bit under test. Based on the effective weight, it is possible to generate a word that represents the error of the bit under test, or an error coefficient which can be used to compensate or correct for the error of the bit under test. This switching sequence can be performed for each bit for which the effective weight is to be measured.

Process of Making Measurements and Processing of the Resulting Measurements to Generate Error Coefficients As explained above, the two techniques both involve making two measurements for each bit under test. In the first measurement, the reservoir capacitor for the bit under test is "right-side-up". If all capacitors were perfect binarily weighted capacitors, no residue charge is expected. However, because the SAR ADC itself is not perfect, it is possible the first measurement may include an "offset", e.g., due to switch charge injection or other artifacts. To reject that "offset", a second measurement is made by repeating the process in the "opposite", via the concept of correlated double-sampling (CDS). In the second measurement, the reservoir capacitor for the bit under test is "upside-down". By taking the difference between the measurements, any fixed "offset" can be rejected while exposing the effective "weight" of the bit under test (which is the difference between applying it "right-side-up" versus "upside-down").

Since the lesser bits themselves likely have imperfect weights, the estimate for any bit can include errors from the lesser bits. If desired, the measurements for all the tested bits can be used as inputs to a mathematical analysis to derive the actual weight of a particular bit. For instance, the actual weights can be derived by analysis of the ensemble of measurements (e.g., Gaussian elimination, matrix inversion, or other mathematical procedure). Phrased differently, the 'un-calibrated' lesser bits are used to measure the "effective weights" of more significant bits, the calibration process may include some digital processing to derive error coefficients.

Once the effective weights of the various bits under test, which reflects the error of the bit, are measured, the effective weights can be used to generate error coefficients usable for compensating or correcting the error.

In some cases, a multiplicity of measurements (e.g., making further measurements beyond CDS) are made to filter out any measurement noise.

Variations and Implementations

While the description of the techniques generally start from the MSB, and proceeds to MSB-1, MSB-2, and so on, it is noted that the effective weight of the bits-to-be-calibrated can be measured in any order. The result is an equivalent process for calibrating an SAR ADC with reservoir capacitors and using the decide-and-set switching procedure.

The present disclosure describes "on-chip reservoir capacitors" and "on-chip reference capacitors" as capacitors that are provided for each bit on the same semiconductor substrate as the SAR ADC, which can greatly improve the speed of conversion. It is understood by one skilled in the art that other equivalent embodiments may exist where the distance of the reservoir capacitor is brought closer to the SAR ADC but yet not necessarily on the same semiconductor substrate as the SAR ADC. For instance, it is envisioned by the disclosure that the reservoir capacitors (as decoupling capacitors) can be provided in the same package or circuit packaging as the SAR ADC.

In certain contexts, the SAR ADC discussed herein can be applicable to medical systems, scientific instrumentation, wireless and wired communications, radar, industrial process control, audio and video equipment, instrumentation (which can be highly precise), and other systems that can use an SAR ADC. Areas of technology where SAR ADCs can be used include communications, energy, healthcare, instrumentation and measurement, motor and power control, industrial automation and aerospace/defense. In some cases, the SAR ADC can be used in data-acquisition applications, especially when multiple channels require input multiplexing.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for implementing a calibration sequence or a conversion sequence can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an IC that integrates components of a computer or other electronic system into a single chip. It may contain digital, analog, mixed signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to calibrating an SAR ADC and conversion using an SAR ADC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples. Note that all optional features of the apparatus described above may also be implemented with respect to the method or process described herein and specifics in the examples may be used anywhere in one or more embodiments.

EXAMPLES

Example 1

A method for measuring bit weight errors of a successive-approximation register analog-to-digital converter (SAR ADC), the SAR ADC using decide-and-set switching and having on-chip reservoir capacitors being used in individual bit decisions, the method comprising: measuring a first bit weight error associated with first bit capacitors and a first on-chip reservoir capacitor of first circuitry for generating a first bit of the SAR ADC; and measuring a second bit weight error associated with second bit capacitors and a second on-chip reservoir capacitor of second circuitry used for generating a second bit of the SAR ADC; wherein the second bit weight error is independent from the first bit weight error.

Example 2

The method of Example 1, further comprising: generating and storing only one calibration word per bit of the SAR ADC.

Example 3

The method of any one of the above Examples, wherein: measuring the first bit weight error comprises exposing a first effective weight of the first bit of the SAR ADC; and/or measuring the second bit weight error comprises exposing a second effective weight of the second bit of the SAR ADC.

Example 4

The method of any one of the above Examples, wherein: measuring a first bit weight error associated with the first bit capacitors and the first on-chip reservoir comprises sampling a first predetermined input using the first circuitry; and measuring a second bit weight error associated with the second bit capacitors and the second on-chip reservoir comprises sampling a second predetermined input using the second circuitry, wherein the second predetermined input is different from the first predetermined input.

Example 5

The method of any one of the above Examples, wherein the first predetermined input comprises a first differential input signal and/or the second predetermined input comprises a second differential input signal.

Example 6

The method of any one of the above Examples, wherein: the first predetermined input corresponds to the to zero or more bit weights of bits of the SAR ADC which are more significant than the first bit; and the second predetermined input corresponds to the to zero or more bit weights of bits of the SAR ADC which are more significant than the second bit.

Example 7

The method of any one of the above Examples, wherein: measuring the first bit weight error associated with the first bit capacitors and the first on-chip reservoir comprises sampling a first predetermined input using the first circuitry; and measuring the second bit weight error associated with the second bit capacitors and the second on-chip reservoir comprises sampling a second predetermined input using the second circuitry, wherein the second predetermined input is the same of the first predetermined input.

Example 8

The method of any one of the above Examples, wherein: the first predetermined input is differentially zero; and the second predetermined input is differentially zero.

Example 9

The method of any one of the above Examples, further comprising: discharging the first reservoir capacitor of the first circuitry before measuring the second bit weight error associated with the second bit capacitors and the second on-chip reservoir capacitor.

Example 10

The method of any one of the above Examples, further comprising: connecting the first discharged reservoir capacitor to the bottom plates of the first bit capacitors before and/or when measuring the second bit weight error associated with the second bit capacitors and the second on-chip reservoir capacitor.

Example 11

The method of any one of the above Examples, further comprising: configuring the first reservoir capacitor and connecting the first reservoir capacitor such that the first reservoir capacitor delivers no charge to the first bit capacitors before and/or when measuring the second bit weight error associated with the second bit capacitors and the second on-chip reservoir capacitor.

Example 12

An apparatus for measuring bit weight errors of a successive-approximation register analog-to-digital converter (SAR ADC), the SAR ADC using decide-and-set switching and having on-chip reservoir capacitors being used in individual bit decisions, the apparatus comprising: means for measuring a first bit weight error associated with first bit capacitors and a first on-chip reservoir capacitor of first circuitry for generating a first bit of the SAR ADC; and means for measuring a second bit weight error associated with second bit capacitors and a second on-chip reservoir capacitor of second circuitry used for generating a second bit of the SAR ADC; wherein the second bit weight error is independent from the first bit weight error.

Example 13

The apparatus of Example 12, wherein: the means for measuring the first bit weight error comprises means for exposing a first effective weight of the first bit of the SAR ADC; and/or the means for measuring the second bit weight error comprises means for exposing a second effective weight of the second bit of the SAR ADC.

Example 14

The apparatus of Example 12 or 13, wherein: the means for measuring a first bit weight error associated with the first bit capacitors and the first on-chip reservoir comprises means for sampling a first predetermined input using the first circuitry; and the means for measuring a second bit weight error associated with the second bit capacitors and the second on-chip reservoir comprises means for sampling a second predetermined input using the second circuitry, wherein the second predetermined input is different from the first predetermined input.

Example 15

The apparatus of any one of Examples 12-14, further comprising: means for generating the first predetermined input and the second predetermined input.

Example 16

The apparatus of any one of Examples 12-15, wherein: the first predetermined input corresponds to the to zero or more bit weights of bits of the SAR ADC which are more significant than the first bit; and the second predetermined input corresponds to the to zero or more bit weights of bits of the SAR ADC which are more significant than the second bit.

Example 17

The apparatus of any one of Examples 12-16, wherein: the means for measuring the first bit weight error associated with the first bit capacitors and the first on-chip reservoir comprises means for sampling a first predetermined input using the first circuitry; and the means for measuring the second bit weight error associated with the second bit capacitors and the second on-chip reservoir comprises means for sampling a second predetermined input using the second circuitry, wherein the second predetermined input is the same of the first predetermined input.

Example 18

The apparatus of any one of Examples 12-17, wherein: the first predetermined input is differentially zero; and the second predetermined input is differentially zero.

Example 19

The apparatus of any one of Examples 12-18, further comprising: means for discharging the first reservoir capacitor of the first circuitry before measuring the second bit weight error associated with the second bit capacitors and the second on-chip reservoir capacitor.

Example 20

The apparatus of any one of Examples 12-19, further comprising: means for connecting the first discharged reservoir capacitor to the bottom plates of the first bit capacitors before and/or when measuring the second bit weight error associated with the second bit capacitors and the second on-chip reservoir capacitor.

Example 21

The apparatus of any one of Examples 12-20, further comprising: means for configuring the first reservoir capacitor and connecting the first reservoir capacitor such that the first reservoir capacitor delivers no charge to the first bit capacitors before and/or when measuring the second bit weight error associated with the second bit capacitors and the second on-chip reservoir capacitor.

Example 22

The apparatus of any one of Examples 12-21, further comprising: means provided on-chip with the SAR ADC for generating the first predetermined input and the second predetermined input.

Example A

An apparatus comprising means for carrying out one or more of the functions described herein.

Example 101 is a successive-approximation-register analog-to-digital converter (SAR ADC) for converting an analog input to a digital output with signal-independent bit weights. The SAR ADC comprises a plurality of capacitive digital-to-analog converter (DAC) units corresponding to a plurality of bit trials. Each capacitive DAC unit comprises: one or more bit capacitors corresponding to a particular bit weight, for directly sampling the analog input and generating outputs of the capacitive DAC unit, and an on-chip reference capacitor dedicated to the one or more bit capacitors corresponding to the particular bit weight, for pulling charge from a reference voltage and sharing charge with the one or more one bit capacitors. The SAR ADC further comprises a comparator coupled to the outputs of the capacitive DAC units for generating a decision output for each bit trial, and a successive-approximation-register (SAR) logic unit coupled to the output of the comparator for controlling switches in the capacitive DAC units based on the decision output and generating the digital output representative of the analog input.

In Example 102, the SAR ADC of Example 101, can further include a memory element for storing error coefficients for calibrating bit weights of the plurality of capacitive DAC units, wherein the error coefficients are independent from the analog input and/or digital output.

In Example 103, the SAR ADC of any one of Examples 101-102 can further include the plurality of bit trials corresponding to bit trials for resolving most significant bits of the digital output.

In Example 104, the SAR ADC of any one of Examples 101-103, can further include one or more further capacitive DAC units corresponding to one or more other bit trials, wherein the one or more further capacitive DAC units share one or more of: a single reservoir capacitor, a reference source from an on-chip reference buffer, and an off-chip reference.

In Example 105, the SAR ADC of any one of Examples 101-104 can further include the reference capacitor dedicated to the one or more bit capacitors being charged up to the reference voltage during a sampling phase.

In Example 106, the SAR ADC of any one of Examples 101-105 can further include the one or more bit capacitors directly sampling the analog input during a sampling phase.

In Example 107, the SAR ADC of any one of Examples 101-106 can further include: each one of the one or more bit capacitors having a first plate and a second plate, and first plates of the one or more bit capacitors being differentially shorted to settle at a common mode voltage to transfer a sampled input signal in the one or more bit capacitors to the second plates of the one or more bit capacitors, after a sampling phase of and prior to a conversion phase.

In Example 108, the SAR ADC of any one of Examples 101-107 can further include: the one or more bit capacitors comprising a first bit capacitor and a second bit capacitor, each bit capacitor having a first plate and a second plate, plates of the dedicated reference capacitor being either directly connected or cross connected to a first plate of the first bit capacitor and a first plate of the second bit capacitor to distribute charge to the one or more bit capacitors during a conversion phase, and a second plate of the first bit capacitor and a second plate of the second bit capacitor being connected to inputs of the comparator for triggering the decision output during the conversion phase of the particular bit trial.

In Example 109, the SAR ADC of any one of Examples 101-108 can further include: only bit capacitor(s) of a subset of capacitive DAC units directly sampling the analog input during a sampling phase while bit capacitor(s) of the rest of capacitive DAC unit(s) not sampling the analog input during the same sampling phase.

In Example 110, the SAR ADC of any one of Examples 101-109, can further include an auxiliary analog-to-digital converter for converting the analog input to a number of most significant bits, wherein the most significant bits controls switches in the same number of capacitive DAC units for inserting the reference capacitor in a proper orientation during a conversion phase.

In Example 111, the SAR ADC of any one of Examples 101-110 can further include first plates of the bit capacitors not being shorted to settle to a common mode voltage prior to the on-chip reference capacitor sharing charge with the bit capacitors.

In Example 112, the SAR ADC of any one of Examples 101-111 can further include an on-chip reference source for providing the reference voltage.

In Example 113, the SAR ADC of any one of Examples 101-112, wherein the reference voltage is provided by an off-chip reference source through chip bondwire.

Example 114 is a speedy method for converting an analog input to a digital output using an area efficient successive-approximation-register analog-to-digital converter (SAR ADC) with signal-independent bit weights. The method includes: tracking and sampling the analog input directly by bit capacitors of a first capacitive digital-to-analog converter (DAC) unit among a plurality of capacitive digital-to-analog converter (DAC) units in the SAR ADC, wherein each capacitive DAC unit corresponds a particular bit trial, charging an on-chip reference capacitor to a reference voltage, wherein the on-chip reference capacitor is among a plurality of on-chip reference capacitors, and each on-chip reference capacitor is dedicated to bit capacitors of a corresponding capacitive DAC unit, and sharing charge during a bit trial by the on-chip reference capacitor with the bit capacitors to which the on-chip reference capacitor is dedicated.

In Example 115, the method of Example 114 can further include differentially shorting first plates of the bit capacitors to settle to a common mode voltage prior to the on-chip reference capacitor sharing charge with the bit capacitors.

In Example 116, the method of Example 114 or 115 can further include tracking and sampling the analog input comprising: closing first switches to connect the analog input to first plates of bit capacitors to directly track the analog input, opening the first switches to sample the analog input onto the bit capacitors, and closing a second switch to transfer the sampled analog input to second plates of the bit capacitors.

In Example 117, the method of any one of Examples 114-116 can further include charging the on-chip reference capacitor comprising: closing third switches to connect a first plate of the on-chip reference capacitor to a reference voltage and to connect a second plate of the on-chip reference capacitor to a complementary reference voltage, and opening the third switches to disconnect the on-chip reference capacitor from the reference voltage and the complementary reference voltage.

In Example 118, the method of any one of Examples 114-117 can further include sharing charge by the reference capacitor comprising selectively closing fourth switches to connect plates of the reference capacitor to first plates of the bit capacitors to insert the reference capacitor in an orientation based on a feedback signal of the SAR ADC.

Example AAA is a method for carrying out any method described herein for converting an analog input to a digital output using the dedicated on-chip reference capacitors described herein.

Example BBB is an apparatus comprising means for performing any method described herein for converting an analog input to a digital output using the dedicated on-chip reference capacitors described herein.

Example 119 is a plurality of capacitive digital-to-analog converter (DAC) units for a successive-approximation-register analog-to-digital converter (SAR ADC) whose bit weights are signal-independent. Each capacitive DAC unit comprises a pair of bit capacitors, wherein the pair of bit capacitors are connectable to track an analog input signal to the SAR ADC during a sampling phase, and the pair of bit capacitors generates inputs to a comparator during the conversion phase, and an on-chip dedicated reference capacitor dedicated to the pair of bit capacitors, wherein the on-chip dedicated reference capacitor is connectable to a reference voltage during the sampling phase and the dedicated reference capacitor is connectable to the pair of bit capacitors for sharing charge with the pair of bit capacitors during the conversion phase.

In Example 120, the plurality of capacitive DAC units of Example 119 can further include two plates of a pair of bit capacitors are differentially shorted to a common mode voltage of the analog input signal sampled onto the bit capacitors prior to the reference capacitor sharing charge with the pair of bit capacitors.

In Example 121, the plurality of capacitive DAC units of Example 119 can further include one or more features described in the above Examples 101-113.

What is claimed is:

1. A successive-approximation-register analog-to-digital converter (SAR ADC) for converting an analog input to a digital output with signal-independent bit weights, the SAR ADC comprising:
   first bit capacitors having a first bit weight for performing a first bit trial, wherein the first bit capacitors directly sample the analog input;
   a first on-chip reference capacitor to share charge with the first bit capacitors during conversion phase of a first bit trial;
   first switches controllable to directly connect or cross-connect plates of the first on-chip reference capacitor to bottom plates of the first bit capacitors;
   second bit capacitors having a second bit weight different from the first bit weight for performing a second bit trial, wherein the second bit capacitors directly sample the analog input;
   a second on-chip reference capacitor, separate from the first on-chip reference capacitor, to share charge with the second bit capacitors during conversion phase of a second bit trial; and
   second switches controllable to directly connect or cross-connect plates of the second on-chip reference capacitor to bottom plates of the second bit capacitors.

2. The SAR ADC of claim 1, further comprising:
   first sample switches to connect bottom plates of the first bit capacitors to the analog input; and
   second sample switches to connect bottom plates of the first bit capacitors to the analog input.

3. The SAR ADC of claim 1, further comprising:
   first switches to connect top and bottom plates of the first on-chip reference capacitor to a reference voltage and a complementary reference voltage to pull the charge to be shared with the first bit capacitors; and second switches to connect top and bottom plates of the second on-chip reference capacitor to the reference voltage and the complementary reference voltage to pull the charge to be shared with the second bit capacitors.

4. The SAR ADC of claim 1, further comprising:
a first shorting switch to short bottom plates of the first bit capacitors; and
a second shorting switch to short bottom plates of the second bit capacitors.

5. The SAR ADC of claim 4, wherein:
the first shorting switch is closed to allow the first bit capacitors to settle at an input common mode voltage before the first on-chip reference capacitor is inserted to share charge with the first bit capacitors; and
the second shorting switch is closed to allow the second bit capacitors to settle at an input common mode voltage before the second on-chip reference capacitor is inserted to share charge with the second bit capacitors.

6. The SAR ADC of claim 1, wherein:
the first switches are controllable based on a first decision output from a comparator generated from shorting bottom plates of the first bit capacitors; and
the second switches are controllable based on a second decision output from the comparator generated from connecting plates first reference capacitor to bottom plates of the first bit capacitors.

7. The SAR ADC of claim 1, further comprising:
a comparator coupled to top plates of the first bit capacitors and top plates of the second bit capacitors for generating a decision output for each bit trial.

8. The SAR ADC of claim 7, further comprising:
a successive-approximation-register (SAR) logic unit coupled to an output of the comparator to control switches that, either directly connects or cross connects the first on-chip reference capacitor and the second on-chip reference capacitor to the first bit capacitors and the second bit capacitors respectively, based on decision outputs from the comparator.

9. The SAR ADC of claim 8, wherein the SAR logic unit generates the digital output representative of the analog input.

10. The SAR ADC of claim 1, further comprising:
a memory element to store error coefficients which are independent from the analog input and/or digital output.

11. The SAR ADC of claim 1, further comprising:
an auxiliary ADC to resolve one or more decisions; and
one or more capacitive digital-to-analog converter (DAC) units controllable by the one or more decisions generated by the auxiliary ADC.

12. The SAR ADC of claim 11, wherein bit capacitors in the one or more capacitive DAC units are not differentially shorted to settle to an input common mode voltage prior to conversion.

13. The SAR ADC of claim 1, further comprising:
a plurality of capacitive digital-to-analog converter (DAC) units which share one or more of: a single reservoir capacitor, a reference source from an on-chip reference buffer, and an off-chip reference.

14. The SAR ADC of claim 1, further comprising:
a plurality of capacitive digital-to-analog converter (DAC) units which do not directly sample the analog input.

15. A method for converting an analog input to a digital output using an area efficient successive-approximation-register analog-to-digital converter (SAR ADC) with signal-independent bit weights, and the method comprises:
sampling the analog input onto first bit capacitors corresponding to a first bit trial, and sampling the analog input onto second bit capacitors corresponding to a second bit trial, wherein the first bit capacitors and the second bit capacitors are weighted differently;
during a time that the analog input is being sampled, charging a first on-chip reference capacitor corresponding to the first bit trial to a reference voltage, and charging a second on-chip reference capacitor corresponding to the second bit trial to the reference voltage; and
making a plurality of decisions by a comparator in response to directly connecting or cross-connecting plates the first on-chip reference capacitor to bottom plates of the first bit capacitors, and in response to directly connecting or cross-connecting plates the second on-chip reference capacitor to bottom plates of the second bit capacitors.

16. The method of claim 15, wherein making the plurality of decisions comprises:
making, by the comparator, a first decision based on the first bit capacitors; and
connecting the plates of the first on-chip reference capacitor to the bottom plates of the first bit capacitors based on the first decision.

17. The method of claim 15, wherein making the plurality of decisions comprises:
making, by the comparator, a second decision based on the first bit capacitors and the first on-chip reference capacitor connected to the first bit capacitors; and
connecting the plates of the second on-chip reference capacitor to the bottom plates of the second bit capacitors based on the second decision.

18. The method of claim 15, further comprising:
shorting bottom plates of the first bit capacitors to allow the first bit capacitors to settle to an input common mode voltage, prior to connecting the first on-chip reference capacitor to the first bit capacitors.

19. A successive-approximation-register analog-to-digital converter (SAR ADC), comprising:
a first capacitive digital-to-analog converter (DAC) having a first bit weight to directly track and sample an analog input signal to the SAR ADC;
a first on-chip reference capacitor to, during sample phase, pull charge from a reference, and during conversion phase, share charge with the first capacitive DAC;
first switches controllable to directly connect or cross-connect plates of the first on-chip reference capacitor to capacitors of the first capacitive DAC;
a second capacitive DAC having a second bit weight different from the first bit weight to directly track and sample the analog input signal;
a second on-chip reference capacitor to, during the sample phase, pull charge from the reference, and during the conversion phase, share charge with the second capacitive DAC; and
second switches controllable to directly connect or cross-connect plates of the second on-chip reference capacitor to capacitors of the second capacitive DAC; and
wherein the first bit weight and the second bit weight are signal-independent and correspond to a first bit trial and a second bit trial respectively.

20. The SAR ADC of claim 19, wherein:
the first switches are controllable based on a first decision output from a comparator generated from shorting bottom plates of first bit capacitors of the first capacitive DAC; and
the second switches are controllable based on a second decision output from the comparator generated from connecting plates first reference capacitor to bottom plates of the first bit capacitors.

* * * * *